United States Patent
Hosotani et al.

(10) Patent No.: US 7,164,599 B2
(45) Date of Patent: Jan. 16, 2007

(54) DATA READ METHOD OF MAGNETIC RANDOM ACCESS MEMORY

(75) Inventors: Keiji Hosotani, Tokyo (JP); Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/244,052

(22) Filed: Oct. 6, 2005

(65) Prior Publication Data

US 2006/0233017 A1    Oct. 19, 2006

(30) Foreign Application Priority Data

Apr. 14, 2005   (JP)   ............... 2005-117086

(51) Int. Cl.
*G11C 7/00* (2006.01)
(52) U.S. Cl. .......................... 365/158; 365/63
(58) Field of Classification Search ................ 365/158, 365/148, 63, 66, 171; 257/295, 536; 438/257
See application file for complete search history.

(56) References Cited

U.S. PATENT DOCUMENTS

| | | | |
|---|---|---|---|
| 6,438,025 B1 * | 8/2002 | Skarupo | 365/158 |
| 6,670,660 B1 | 12/2003 | Hosotani | |
| 6,822,896 B1 * | 11/2004 | Kajiyama | 365/158 |
| 6,861,314 B1 * | 3/2005 | Hosotani | 438/257 |
| 7,068,530 B1 * | 6/2006 | Hayashi | 365/158 |

FOREIGN PATENT DOCUMENTS

JP    2002-110933    4/2002

OTHER PUBLICATIONS

J. L. Brown, et al., "1-Mb Memory Chip Using Giant Magnetoresistive Memory Cells", IEEE Transactions on Components, Packaging, And Manufacturing Technology—Part A. vol 17, No. 3, Sep. 1994, Pages 373-378.
Roy Scheuerlein, et al., "A 10ns Read and Write Non-Volatile Memory Array Using a Magnetic Tunnel Junction and FET Switch in each Cell", ISSCC 2000 Digest of Technical Papers, vol. 43, ISSN 0193-6530, Feb. 7, 8, and 9, 2000; pp. 128-129.

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A data read method of a magnetic random access memory including a first wiring which runs in a first direction, a plurality of second wirings which run in a second direction different from the first direction, and a plurality of magnetoresistive elements which are arranged at intersections of the first wiring and the second wirings between the first wiring and the second wirings and electrically connected to the first wiring, includes to read out data of a selected element selected from the plurality of magnetoresistive elements, reading a resistance value of the selected element by a second current supplied from the first wiring to the selected element while supplying a first current to a selected wiring selected from the second wirings in correspondence with the selected element.

20 Claims, 66 Drawing Sheets

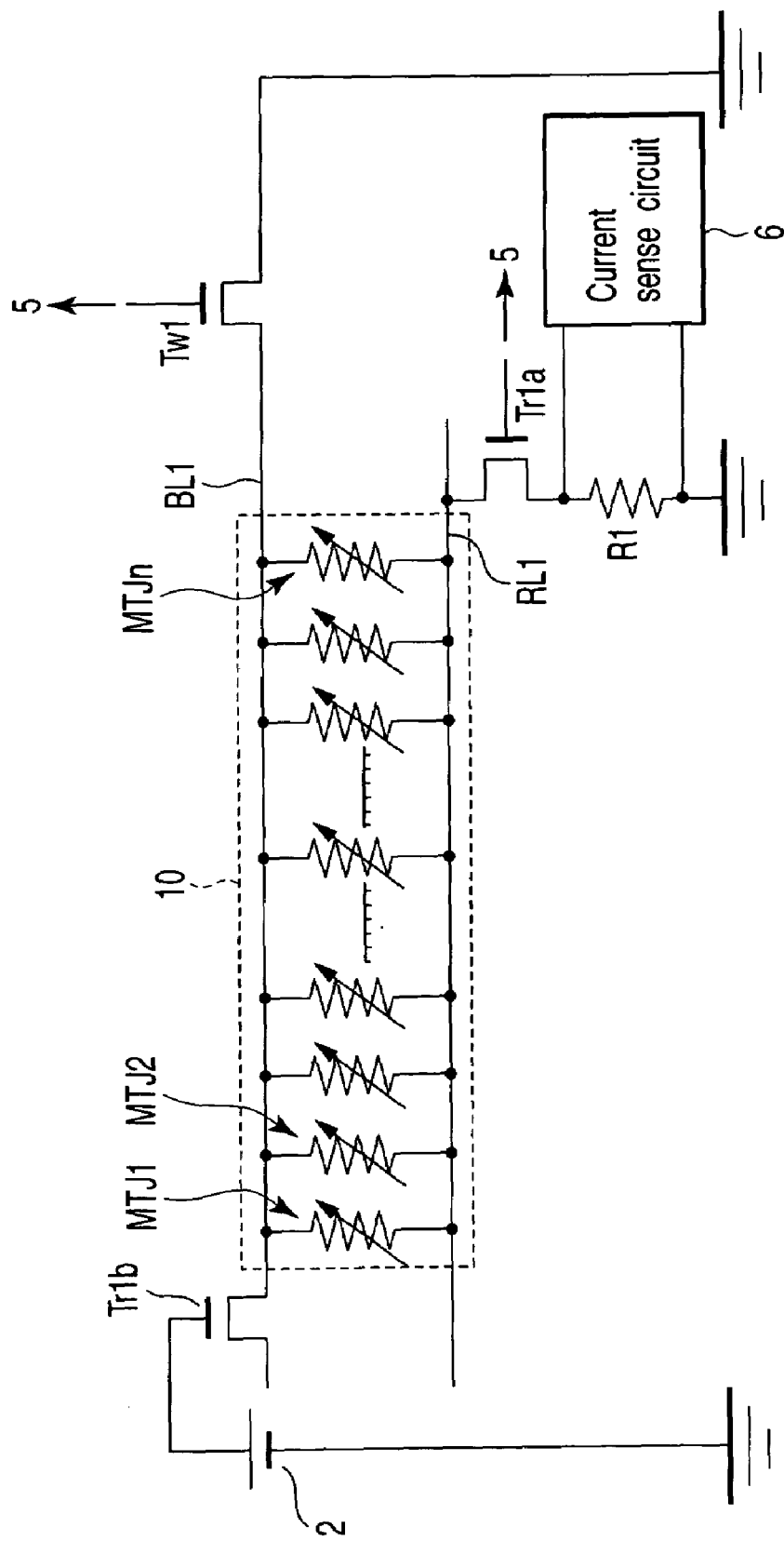
F I G. 2

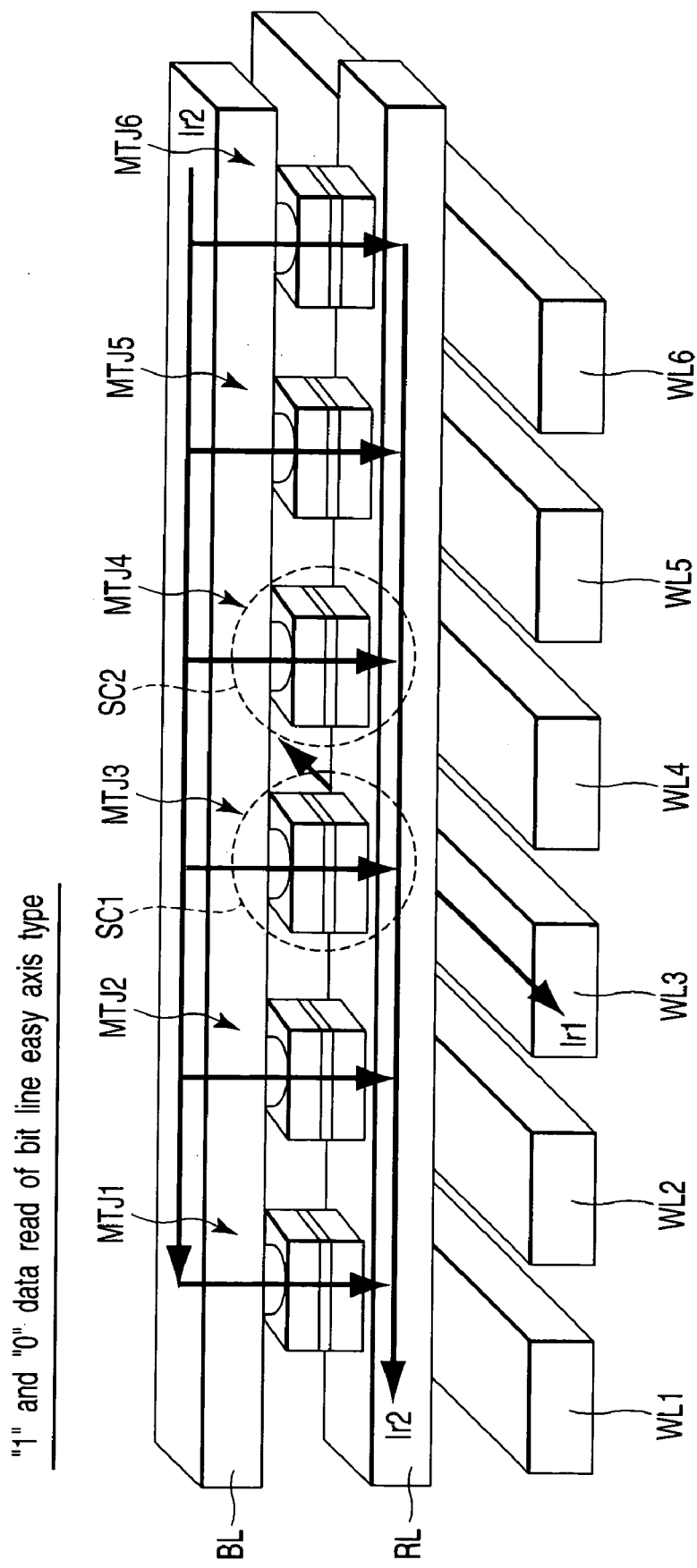
F I G. 15

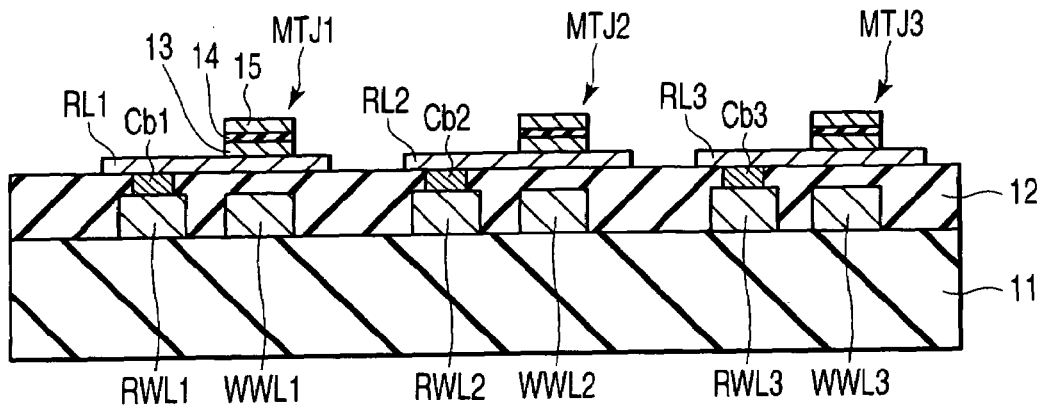
F I G. 4 7
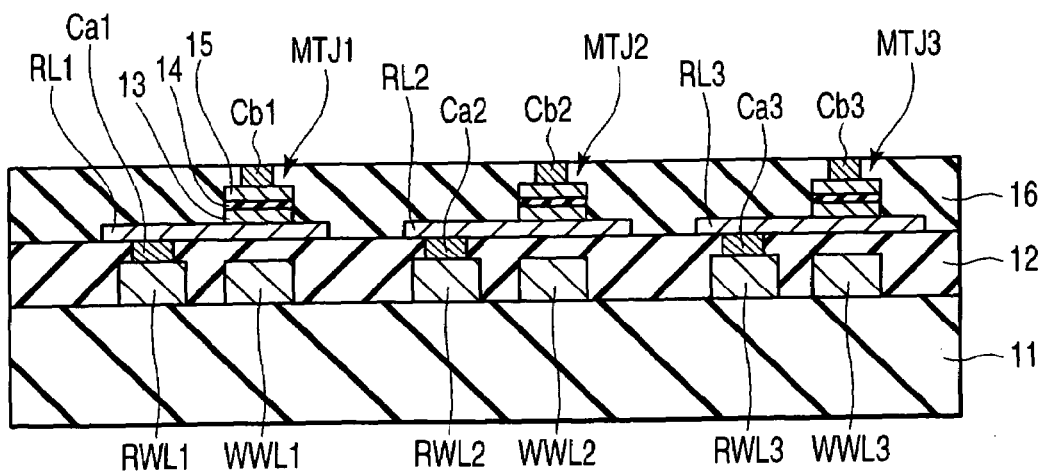
F I G. 4 8

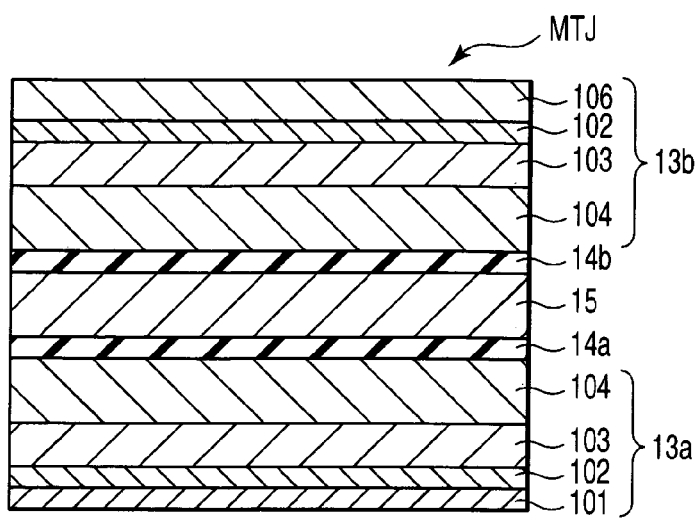
FIG. 96A
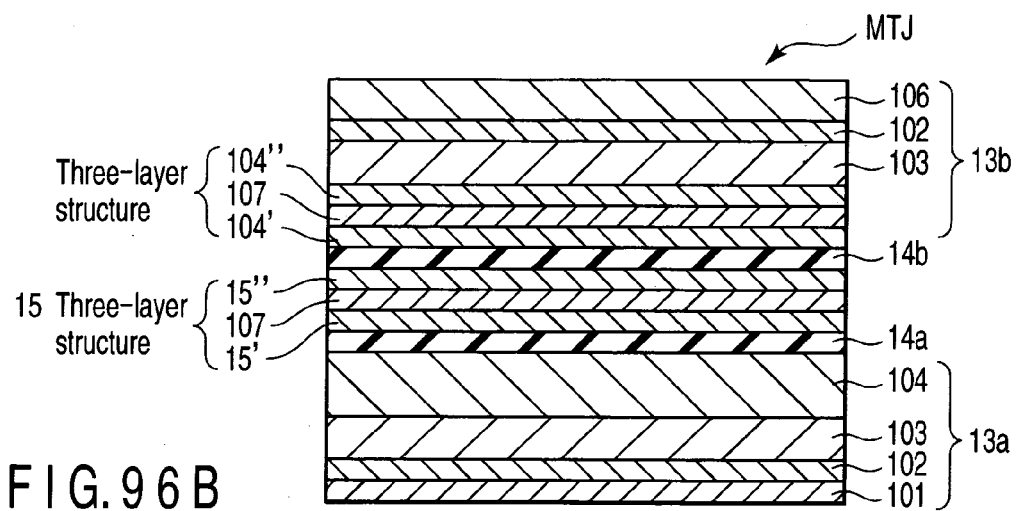
FIG. 96B
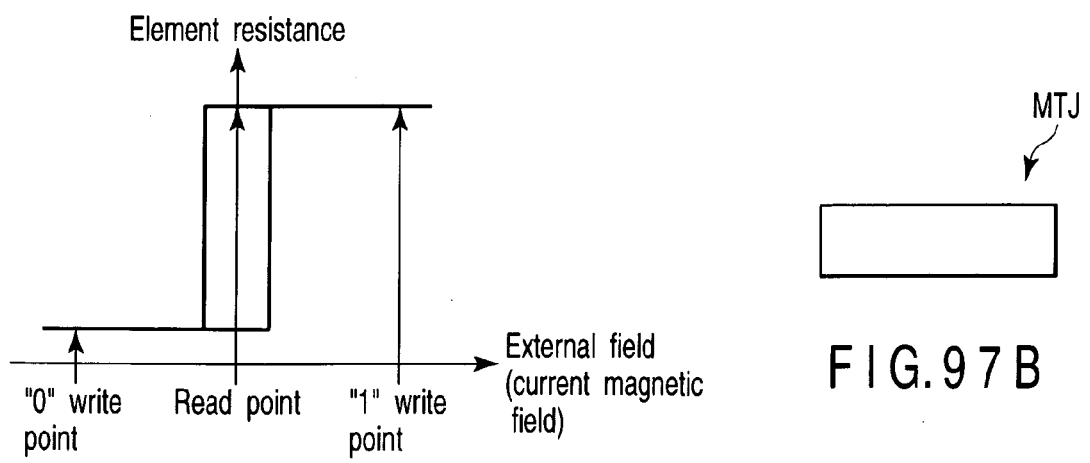
FIG. 97A
FIG. 97B

DATA READ METHOD OF MAGNETIC RANDOM ACCESS MEMORY

CROSS-REFERENCE TO RELATED APPLICATIONS

This application is based upon and claims the benefit of priority from prior Japanese Patent Application No. 2005-117086, filed Apr. 14, 2005, the entire contents of which are incorporated herein by reference.

BACKGROUND OF THE INVENTION

1. Field of the Invention

The present invention relates to a data read method of a magnetic random access memory (MRAM).

2. Description of the Related Art

Magnetic random access memories (MRAMs) having magnetic tunnel junction (MTJ) elements which use a tunneling magnetoresistive (TMR) effect have been proposed recently. Such a magnetic random access memory is disclosed in, e.g., Roy Scheuerlein et al., "A 10 ns Read and Write Non-Volatile Memory Array Using a Magnetic Tunnel Junction and FET Switch in each Cell", 2000 ISSCC 2000 Digest of Technical Papers, (USA), February 2000, pp. 128–129).

FIG. 103 is a schematic sectional view of a one-transistor, one-MTJ-element (1 Tr+1 MTJ) memory cell of a conventional magnetic random access memory. As shown in FIG. 103, a 1 Tr+1 MTJ memory cell includes an MTJ element MTJ arranged at the intersection of a bit line BL and a write word line WWL and a MOS transistor Tr serving as a read switching element electrically connected to the MTJ element MTJ.

The MTJ element MTJ includes a fixed layer 13, tunnel barrier layer 14, and free layer 15. A thin insulating film (tunnel barrier layer 14) is sandwiched between two magnetic thin films (fixed layer 13 and free layer 15).

The bit line BL is connected to the free layer 15 of the MTJ element. A read line RL is connected to the fixed layer 13 of the MTJ element. The write word line WWL is electrically disconnected from the MTJ element. One source/drain diffusion layer S/D of the MOS transistor Tr is connected to the fixed layer 13 of the MTJ element through a contact, wiring, and read line RL. The other source/drain diffusion layer S/D of the MOS transistor Tr is connected to a ground line GL through a contact.

In this magnetic random access memory, the MTJ element is used as an information storage element which stores "1" or "0" data on the basis of the following principle.

The MTJ element can create two states, i.e., a state in which the directions of magnetization in the fixed layer 13 and free layer 15 are parallel and a state in which the magnetization directions are anti-parallel. When the Magnetization directions are parallel, the tunnel resistance flowing through the tunnel barrier layer 14 is lowest. In this state, "0" data can be stored. When the magnetization directions are anti-parallel, the tunnel resistance flowing through the tunnel barrier layer 14 is highest. In this state, "1" data can be stored. The write and read operations of "1" and "0" data are executed in the following way.

To write "1" or "0" data in the MTJ element, a pair of write word line WWL and bit line BL is selected for an arbitrary selected cell. Write currents are supplied to both the selected write word line WWL and bit line BL. A current magnetic field generated by the write currents of the write word line WWL and bit line BL is applied to the MTJ element of the selected cell. Depending on whether the magnetization in the free layer 15 of the MTJ element reverses in excess of the reversal threshold value, "1" or "0" data is written. Since the write word line WWL is electrically isolated, no voltage is applied to the MTJ element in the write. Hence, breakdown of the element can be suppressed.

To read out "1" or "0" data written in the MTJ element, the bit line BL connected to one terminal of the MTJ element is selected. The gate electrode (read word line RWL) of the MOS transistor Tr connected to the other terminal of the MTJ element is turned on. A read current is supplied from the bit line BL to the ground line GL. The resistance state of the MTJ element is read out, thereby discriminating the state of the MTJ element. When the data of an arbitrary MTJ element is read out in this way, sneak read current to another MTJ element can be prevented. Hence a high read signal margin can be obtained.

In the 1 Tr+1 MTJ memory cell described above, the MTJ element and MOS transistor are connected in a one-to-one correspondence. Since the sizes of the read line RL and MOS transistor Tr affect the cell size, it is difficult to form a small cell. It is also difficult to actually reduce the cell area by forming a multilayered structure.

As a solution to this problem, a ladder-shaped cell structure has been proposed in which MTJ elements of two or more bits are connected in parallel (e.g., Jpn. Pat. Appln. KOKAI Publication No. 2002-110933). In this ladder-shaped cell structure, the read current is supplied at once to MTJ elements connected in parallel. Hence, only one MOS transistor is necessary for the MTJ elements connected in parallel. For this reason, the larger the number of MTJ elements connected in parallel becomes, the smaller the actual cell area can be made.

However, in the read operation of the ladder-shaped cell structure, the read current flows not only to the selected cell but also to the remaining cells connected in parallel to the same bit line as that of the selected cell. For this reason, to read out the state of the selected cell, an expected value is written in the selected cell. After the data is discriminated, the write operation is executed again to return to the initial state. That is, a complex read operation of four cycles is necessary. Hence, the time required for the write operation becomes long inevitably and impedes practical use.

BRIEF SUMMARY OF THE INVENTION

According to a first aspect of the present invention, there is provided a data read method of a magnetic random access memory including a first wiring which runs in a first direction, a plurality of second wirings which run in a second direction different from the first direction, and a plurality of magnetoresistive elements which are arranged at intersections of the first wiring and the second wirings between the first wiring and the second wirings and electrically connected to the first wiring, comprising, to read out data of a selected element selected from the plurality of magnetoresistive elements, reading a resistance value of the selected element by a second current supplied from the first wiring to the selected element while supplying a first current to a selected wiring selected from the second wirings in correspondence with the selected element.

According to a second aspect of the present invention, there is provided a data read method of a magnetic random access memory including a first wiring which runs in a first direction, a second wiring which runs in a second direction different from the first direction, a magnetoresistive element which is arranged at an intersection of the first wiring and the second wiring between the first wiring and the second wiring and has one terminal and the other terminal, the one terminal being electrically connected to the first wiring, and a switching element which is electrically connected to the other terminal of the magnetoresistive element, comprising, to read out data of the magnetoresistive element, reading a resistance value of the magnetoresistive element by a second current supplied from the first wiring to the magnetoresistive element while supplying a first current to the second wiring.

BRIEF DESCRIPTION OF THE SEVERAL VIEWS OF THE DRAWING

FIG. 2 is a view showing one block of the memory cell array shown in FIG. 1;

FIG. 15 is a schematic perspective view of the magnetic random access memory in the "1" and "0" data read of the word line easy axis type according to the first embodiment of the present invention;

FIG. 21A is a schematic list of the write and read operations according to the first embodiment of the present invention;

FIG. 36A is a schematic list of the write and read operations according to the second embodiment of the present invention;

FIG. 43 is a schematic list of the write and read operations according to the third embodiment of the present invention;

FIGS. 45 to 48 are sectional views showing steps in manufacturing the magnetic random access memory according to the fourth embodiment of the present invention;

FIG. 75 is a schematic list of the write and read operations according to the fifth embodiment of the present invention;

FIG. 82 is a schematic list of the write and read operations according to the sixth embodiment of the present invention;

FIG. 94 is a schematic list of the write and read operations according to the seventh embodiment of the present invention;

FIGS. 96A and 96B are sectional views of MTJ elements having double tunnel junction structures according to the eighth embodiment of the present invention;

FIG. 97A is a graph showing the hysteresis curve of the MTJ element according to the eighth embodiment of the present invention;

FIG. 97B is a plan view of the MTJ element which exhibits the characteristic shown in FIG. 97A;

DETAILED DESCRIPTION OF THE INVENTION

Figure 1:
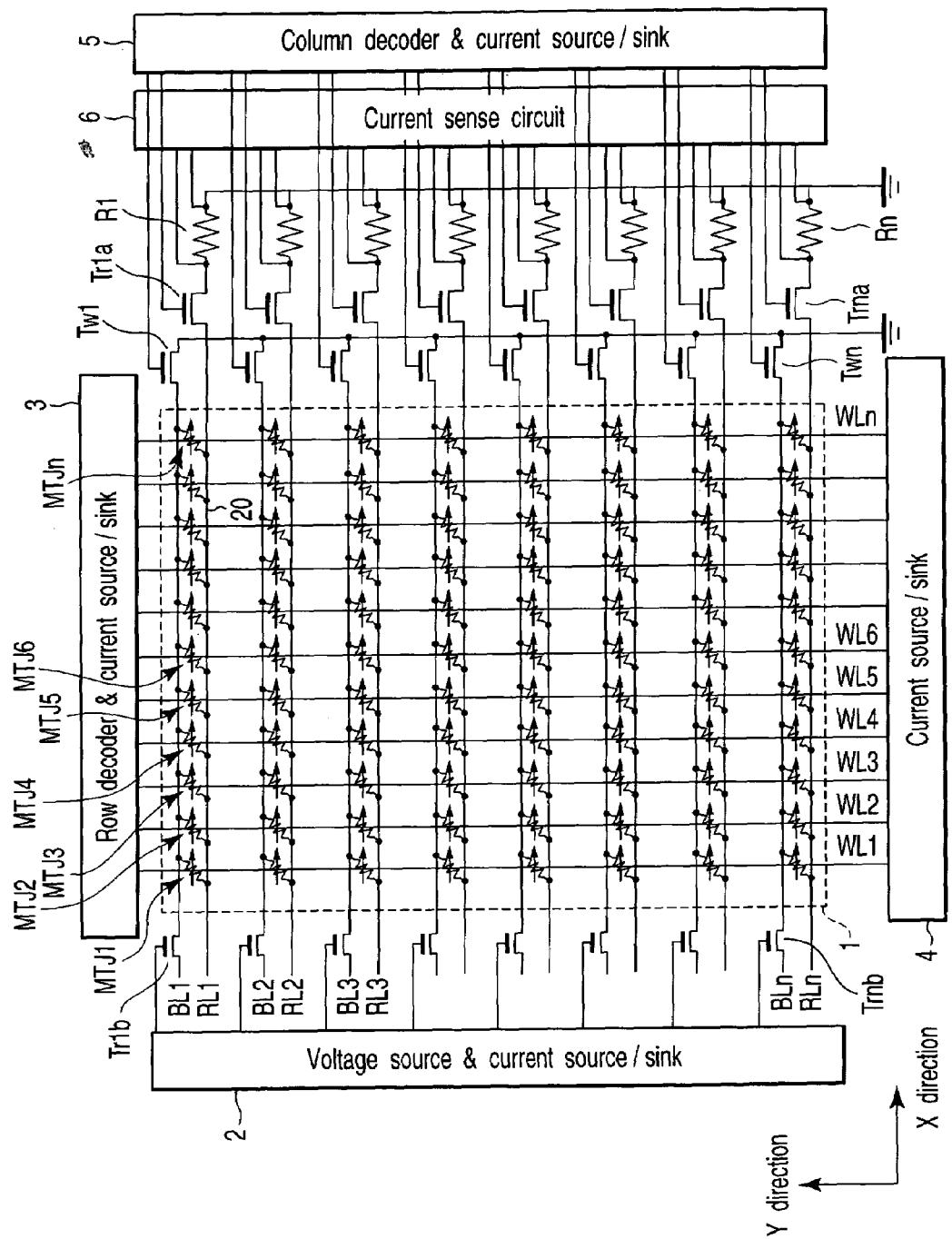
FIG. 1 is a block diagram showing the memory cell array of a magnetic random access memory according to the first embodiment of the present invention.

The embodiments of the present invention will be described below with reference to the accompanying drawing. The same reference numerals denote the same parts throughout the drawing.

[1] First Embodiment

In the first embodiment, a ladder-shaped magnetic random access memory (MRAM) using magnetic tunnel junction (MTJ) elements will be described.

[1-1] Structure

Figure 3:
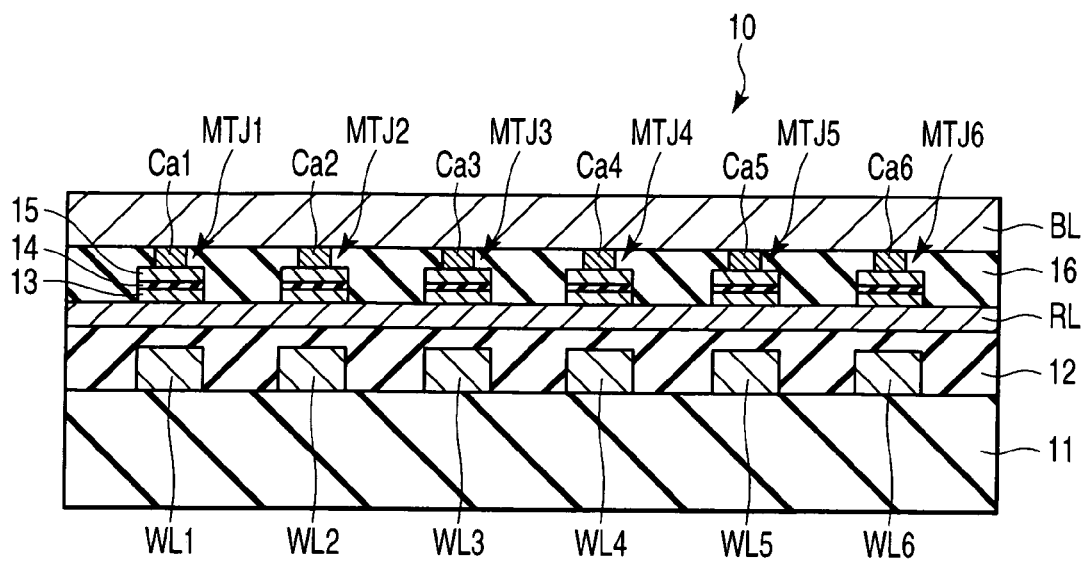
FIG. 3 is a sectional view showing the magnetic random access memory according to the first embodiment of the present invention.

FIG. 1 is a block diagram of the memory cell array of a magnetic random access memory according to the first embodiment of the present invention. FIG. 2 is a view showing one block of the memory cell array shown in FIG. 1. FIG. 3 is a sectional view of the magnetic random access memory according to the first embodiment of the present invention. The structure of the magnetic random access memory according to the first embodiment of the present invention will be described below.

As shown in FIG. 1, a plurality of bit lines BLn (n=1, 2, 3, . . . ) and a plurality of read lines RLn (n=1, 2, 3, . . . ) run in the X direction. A plurality of word lines WLn (n=1, 2, 3, . . . ) run in the Y direction (e.g., direction perpendicular to the X direction). MTJ elements MTJn (n=1, 2, 3, . . . ) are arranged at the intersections of the bit lines BLn and the word lines WLn. A matrix memory cell array 1 is thus formed.

A voltage source & current source/sink 2, row decoder & current source/sink 3, current source/sink 4, column decoder & current source/sink 5, current sense circuit 6, write transistors Twn (n=1, 2, 3, . . . ), read transistors Trna and Trnb (n=1, 2, 3, . . . ), and series resistances Rn (n=1, 2, 3, . . . ) are provided around the memory cell array 1.

One of the source and drain of the read transistor Trnb is connected to one end of the bit line BLn. The other of the source and drain of the read transistor Trnb is connected to, e.g., a constant voltage or constant current generation circuit or a ground circuit. The gate of the read transistor Trnb is connected to the voltage source & current source/sink 2 (address generation circuit, decoder circuit, and the like).

One of the source and drain of the write transistor Twn is connected to the other end of the bit line BLn. The other of the source and drain of the write transistor Twn is grounded. The gate of the write transistor Twn is connected to the column decoder & current source/sink 5.

The row decoder & current source/sink 3 is connected to one end of the word line WLn. The current source/sink 4 is connected to the other end of the word line WLn.

One of the source and drain of the read transistor Trna is connected to an end of the read line RLn on the opposite side of the voltage source & current source/sink 2. The column decoder & current source/sink 5 is connected to the gate of the read transistor Trna. One terminal of the series resistance Rn is connected to the other of the source and drain of the read transistor Trna. The other terminal of the series resistance Rn is grounded. The current sense circuit 6 is connected to the two terminals of the series resistance Rn.

As shown in FIG. 2, in one block 10 of the memory cell array, one terminal of each MTJ element MTJn is connected to the same bit line BL1. The other terminal of each MTJ element MTJn is connected to the same read line RL1. Hence, the MTJ elements MTJn of one block 10 are connected in parallel to each other so that a so-called ladder structure is formed.

More specifically, as shown in FIG. 3, in one block 10 of the memory cell array, the MTJ elements MTJn are arranged between the bit line BL and the read line RL. Each MTJ element MTJn includes a fixed layer (pinned layer) 13, tunnel barrier layer 14, and free layer 15. The fixed layer 13 of each MTJ element MTJn is connected directly to the read line RL. The free layer 15 of each MTJ element MTJn is connected to the bit line BL through a contact Can. The word lines WLn are arranged under the read line RL and electrically disconnected from the MTJ elements MTJn. The MTJ element MTJn will be described in detail in the eighth embodiment.

[1-2] Manufacturing Method

FIGS. 4 to 7 are schematic sectional views showing steps in manufacturing the magnetic random access memory according to the first embodiment of the present invention. The method of manufacturing the magnetic random access memory according to the first embodiment will be described below.

Figure 4:
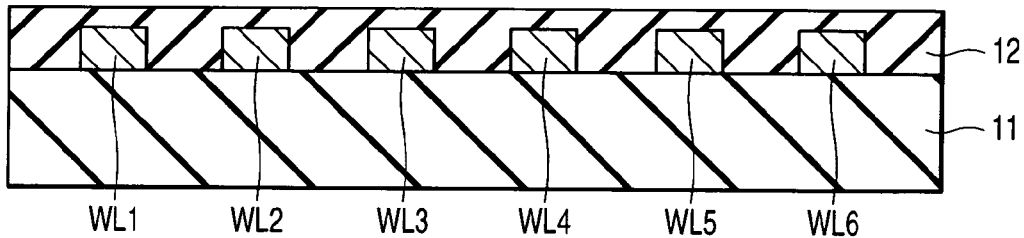
FIGS. 4 to 7 are sectional views showing steps in manufacturing the magnetic random access memory according to the first embodiment of the present invention.

As shown in FIG. 4, a CMOS circuit (not shown) is formed on a silicon substrate (not shown) by a normal semiconductor process. A multilayered wiring (not shown) is formed on the CMOS circuit. A first insulating film 11 is formed on the multilayered wiring. The upper surface of the first insulating film 11 is planarized by chemical mechanical polishing (CMP). The word lines WLn are formed on the first insulating film 11 by using a normal metal wiring process. The word lines WLn are covered with a second insulating film 12. The upper surface of the second insulating film 12 is planarized by CMP.

Figure 5:
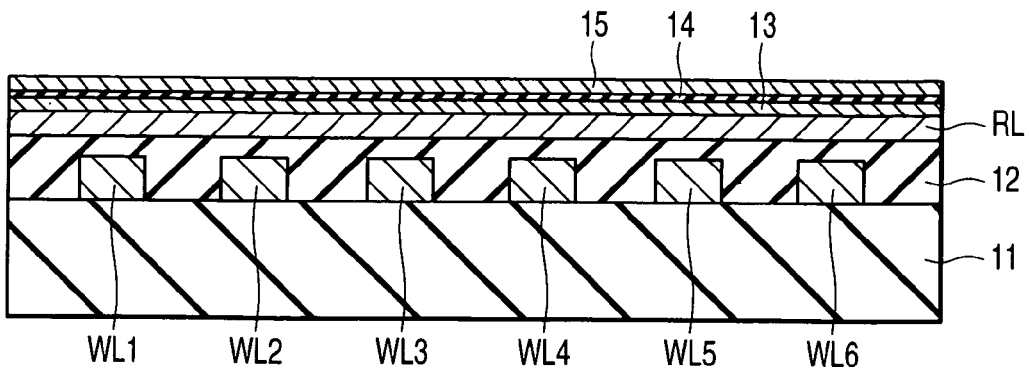

As shown in FIG. 5, the read line RL is formed on the second insulating film 12. The fixed layer 13, tunnel barrier layer 14, and free layer 15 as the prospective MTJ elements are sequentially deposited on the read line RL.

Figure 6:
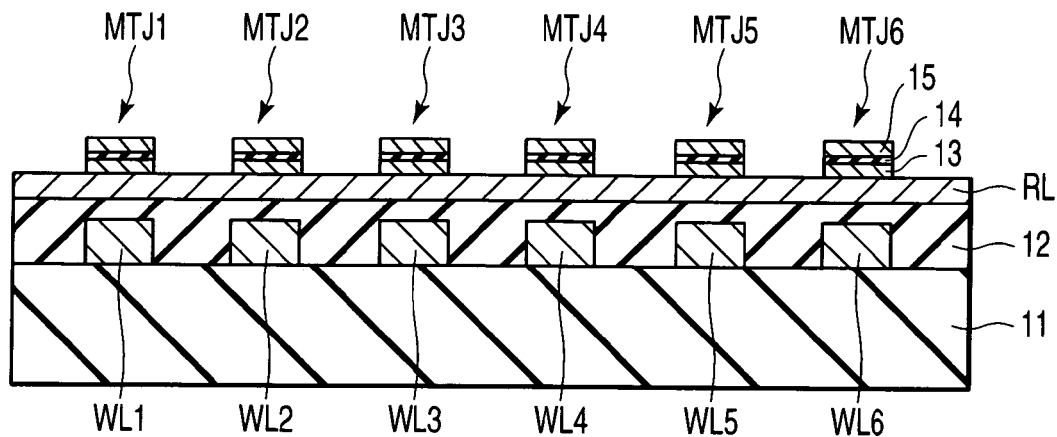

As shown in FIG. 6, the fixed layer 13, tunnel barrier layer 14, and free layer 15 are patterned by lithography using a normal resist to form the MTJ elements MTJn. At this time, etching to pattern the MTJ elements MTJn may be stopped on the upper surface of the fixed layer 13 or the upper surface of the read line RL.

Figure 7:
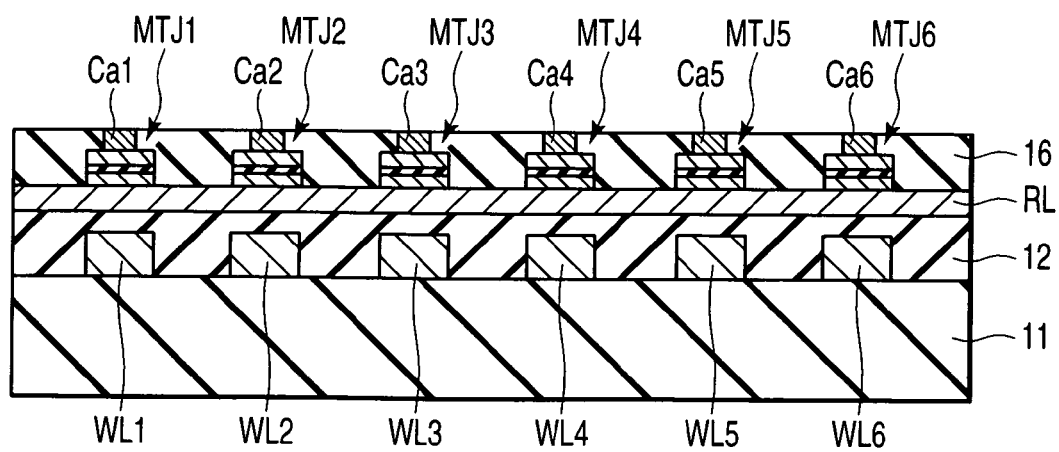

As shown in FIG. 7, a third insulating film 16 is deposited. The upper surface of the third insulating film 16 is planarized. Via holes are formed in the third insulating film 16 to expose part of the upper surface of each MTJ element MTJn. The via holes are filled with a metal material to form the contacts Can connected to the MTJ elements MTJn.

Instead of forming the via holes, the insulating film 16 on the MTJ elements MTJn may be removed by resist etch back or CMP to expose only the upper portions of the MTJ elements MTJn. In place of the contacts Can to connect the MTJ elements MTJn to the bit line BL, the mask in patterning the MTJ elements MTJn may be used. The mask in patterning the MTJ elements MTJn may be made of a conductive material and left even after patterning so that it functions as a contact.

Next, as shown in FIG. 3, the bit line BL is formed on the third insulating film 16 and contacts Can by using a normal metal wiring process. In this way, the ladder-shaped magnetic random access memory is completed.

[1-3] Write and Read Operations

The write and read operations of the magnetic random access memory according to the first embodiment will be described below for each of a bit line easy axis type and word line easy axis type.

[1-3a] Bit Line Easy Axis Type

In the bit line easy axis type, the direction of the magnetic field generated by the bit line current turns to the direction of axis of easy magnetization (longitudinal direction) of the MTJ element. More specifically, the direction of axis of easy magnetization of the MTJ element is almost parallel to the running direction of the word line WL. The direction of axis of hard magnetization (direction perpendicular to the longitudinal direction) of the MTJ element is almost parallel to the running direction of the bit line BL.

A) Write Operation

Figure 8:
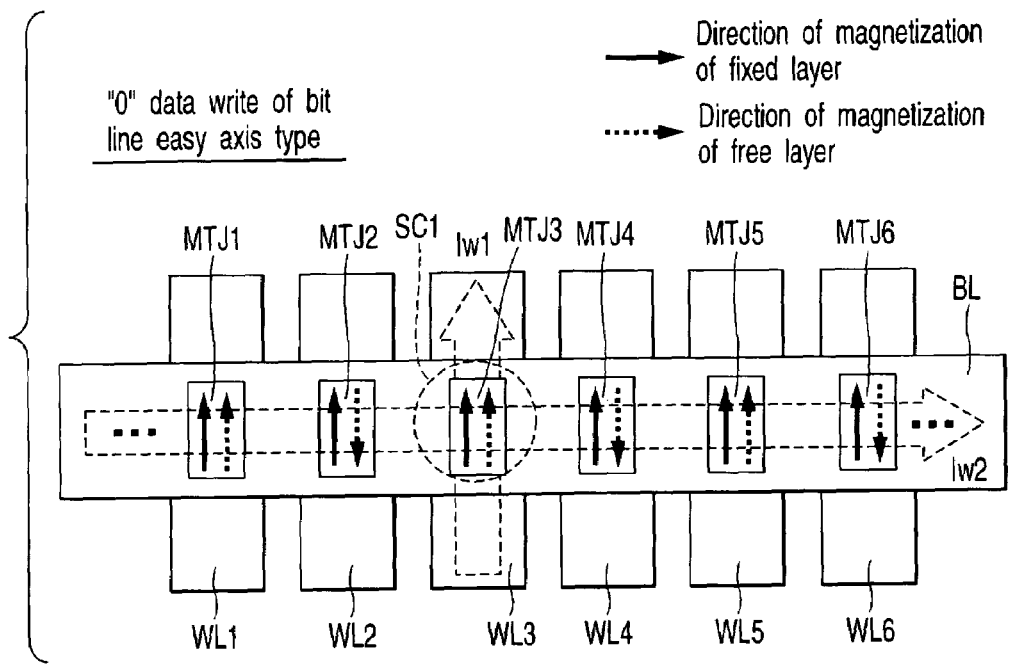
FIG. 8 is a schematic plan view of cells in the "0" data write of a bit line easy axis type according to the first embodiment of the present invention.

FIG. 8 is a schematic plan view of cells in the "0" data write of the bit line easy axis type according to the first embodiment of the present invention. The "0" data write operation of the bit line easy axis type will be described below.

A word line WL3 and bit line BL are selected. First and second write currents Iw1 and Iw2 are supplied to the word line WL3 and bit line BL, respectively. A synthetic field generated by the first and second write currents Iw1 and Iw2 is applied to an MTJ element MTJ3 located at the cross point between the word line WL3 and the bit line BL. As a result, the magnetization directions of the fixed layer 13 and free layer 15 of the MTJ element MTJ3 become parallel to each other, and data is written in the MTJ element MTJ3. The state in which the magnetization directions are parallel is defined as a state in which "$_0$" data is written.

Figure 9:
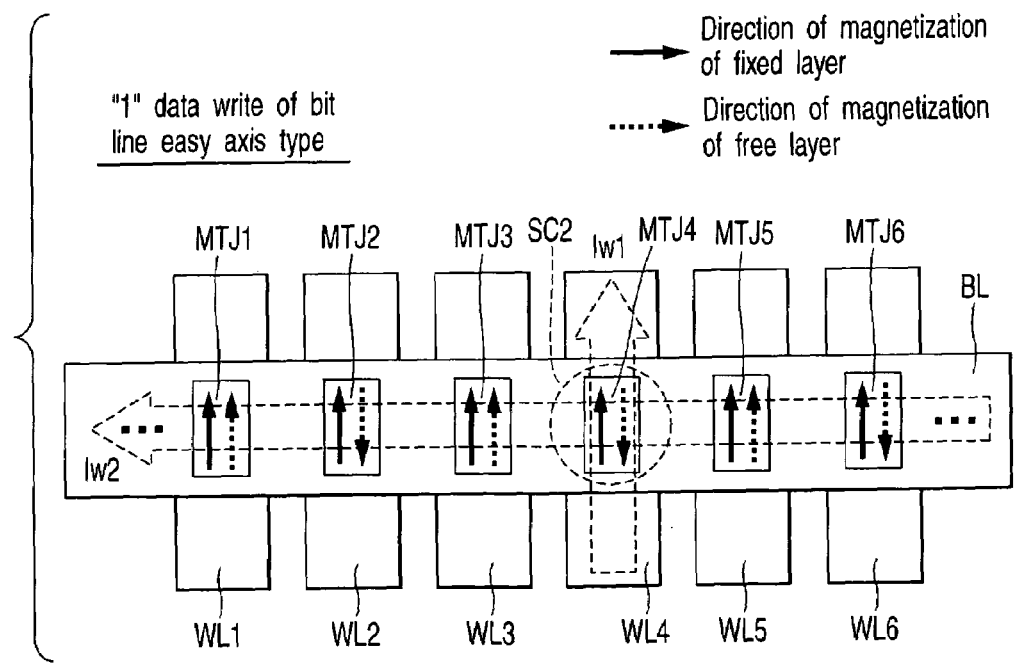
FIG. 9 is a schematic plan view of cells in the "1" data write of the bit line easy axis type according to the first embodiment of the present invention.

FIG. 9 is a schematic plan view of cells in the "1" data write of the bit line easy axis type according to the first embodiment of the present invention. The "1" data write operation of the bit line easy axis type will be described below.

A word line WL4 and bit line BL are selected. The first and second write currents Iw1 and Iw2 are supplied to the word line WL4 and bit line BL, respectively. A synthetic field generated by the first and second write currents Iw1 and Iw2 is applied to an MTJ element MTJ4 located at the cross point between the word line WL4 and the bit line BL. As a result, the magnetization directions of the fixed layer 13 and free layer 15 of the MTJ element MTJ4 become anti-parallel to each other, and data is written in the MTJ element MTJ4. The state in which the magnetization directions are anti-parallel is defined as a state in which "1" data is written.

In the example of this embodiment in which the magnetization of the fixed layer 13 is fixed upward on the drawing surface, to write "0" data, the second write current Iw2 is supplied to the bit line BL from the left to the right on the drawing surface (FIG. 8). To write "1" data, the second write current Iw2 is supplied to the bit line BL from the right to the left on the drawing surface (FIG. 9). When the second write current Iw2 is supplied in reverse directions in the above-described way, binary data can selectively be written. The first write current Iw1 can be supplied to the word lines WL3 and WL4 either from the lower side to the upper side or from the upper side to the lower side on the drawing surface.

B) Read Operation

Figure 10:
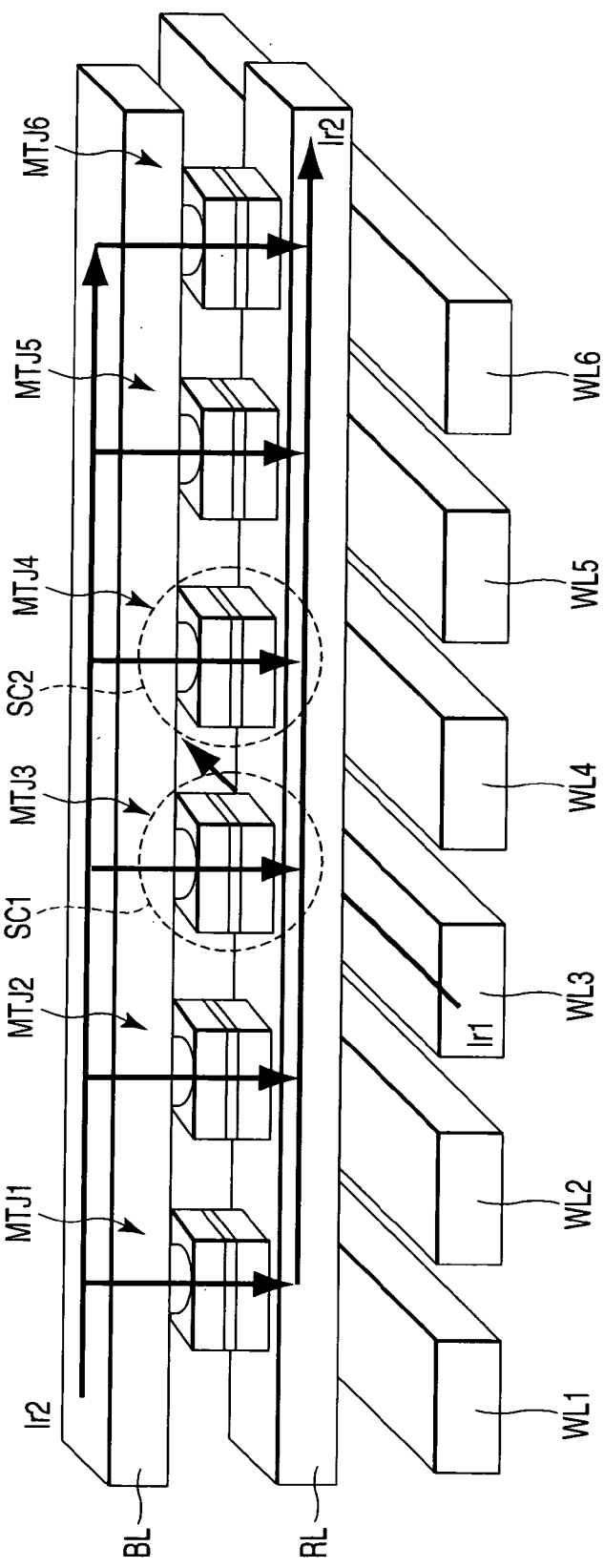
FIG. 10 is a schematic perspective view of the magnetic random access memory in the "1" and "0" data read of the bit line easy axis type according to the first embodiment of the present invention.

FIG. 10 is a schematic perspective view of the magnetic random access memory in the "1" and "0" data read of the bit line easy axis type according to the first embodiment of the present invention.

As shown in FIG. 10, in the read operation of the bit line easy axis type according to the first embodiment, a first read current Ir1 is supplied to the word line WLn corresponding to a selected cell SCn while supplying a second read current Ir2 to read the resistance value of the selected cell SCn from the bit line BL to the read line RL. A change in resistance value in the MTJ element MTJn is read from a change in second read current Ir2 in the first read current Ir1 supplying state, thereby discriminating between "1" and "0" data.

Figure 11:
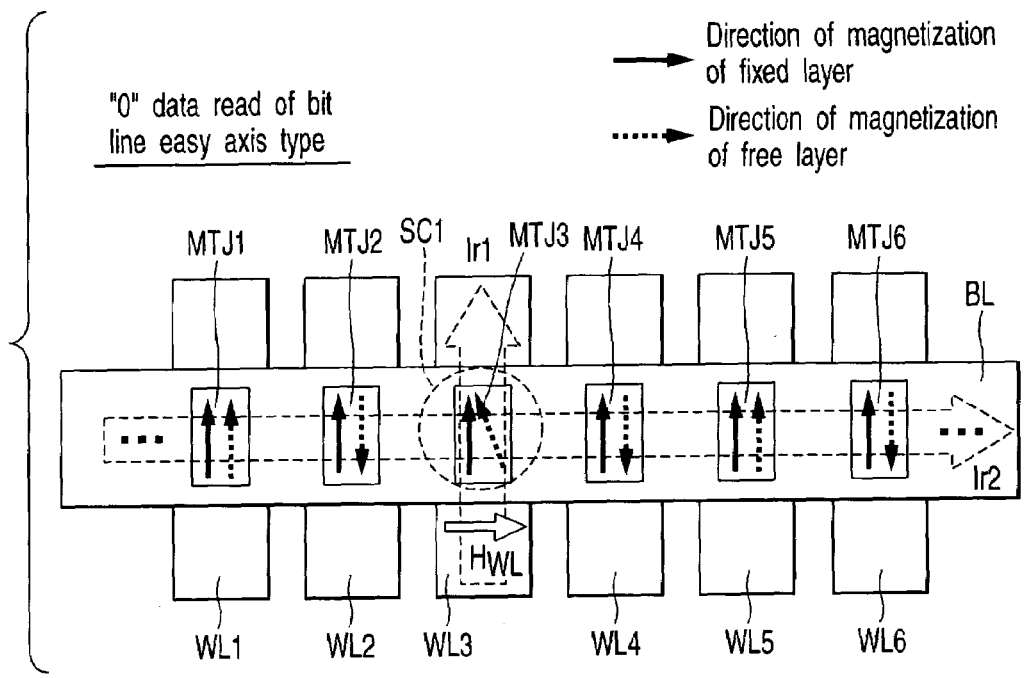
FIG. 11 is a schematic plan view of cells in the "0" data read of the bit line easy axis type according to the first embodiment of the present invention.

FIG. 11 is a schematic plan view of cells in the "0" data read of the bit line easy axis type according to the first embodiment of the present invention. The "0" data read operation of the bit line easy axis type will be described below with reference to FIG. 11.

The second read current Ir2 is supplied from the bit line BL to the read line RL. After that, when the first read current Ir1 is supplied to the word line WL3, a magnetic field $H_{WL}$ generated by the first read current Ir1 is applied to the MTJ element MTJ3. As a result, only the magnetization of the free layer 15 of the MTJ element MTJ3 reacts and rotates halfway. Before the read, the magnetization of the MTJ element MTJ3 is in the parallel state. However, while the first read current Ir1 flows, the magnetization of the MTJ element MTJ3 is not in the parallel state (the magnetizations of the fixed layer 13 and free layer 15 tilt from the parallel state). Since the parallel state with the lowest resistance is lost in the MTJ element MTJ3, the resistance value of the MTJ element MTJ3 increases. For this reason, only while the first read current Ir1 flows, a resistance value Rmtj of the MTJ elements in the whole block increases.

The difference between a current value I when only the second read current Ir2 flows and a current value I' of the second read current Ir2 when the first and second read currents Ir1 and Ir2 flow simultaneously is read. When the current value I' of the second read current Ir2 is smaller than the current value I, i.e., when the resistance value Rmtj of the MTJ elements in the whole block increases, it can be determined that "0" data is stored in a selected cell SC1.

When the first read current Ir1 supplied to the word line WL3 is turned off, the magnetization of the free layer 15 of the MTJ element MTJ3 returns to the initial state (parallel state in FIG. 8) again.

Figure 12:
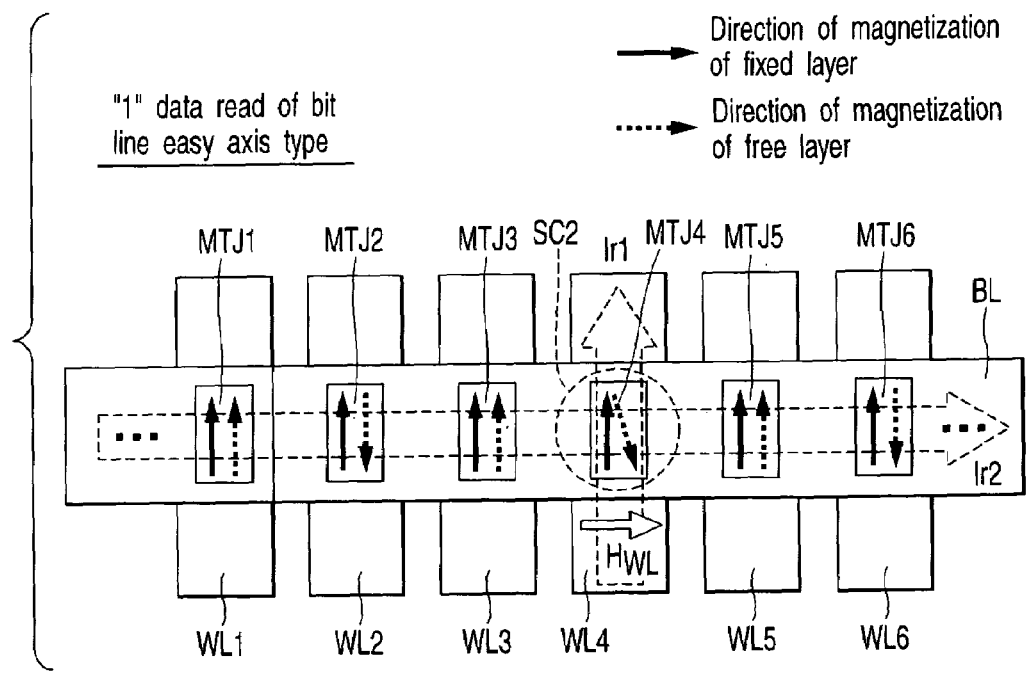
FIG. 12 is a schematic plan view of cells in the "1" data read of the bit line easy axis type according to the first embodiment of the present invention.

FIG. 12 is a schematic plan view of cells in the "1" data read of the bit line easy axis type according to the first embodiment of the present invention. The "1" data read operation of the bit line easy axis type will be described below with reference to FIG. 12.

The second read current Ir2 is supplied from the bit line BL to the read line RL. After that, when the first read current Ir1 is supplied to the word line WL4, the magnetic field $H_{WL}$ generated by the first read current Ir1 is applied to the MTJ element MTJ4. As a result, only the magnetization of the free layer 15 of the MTJ element MTJ4 reacts and rotates halfway. Before the read, the magnetization of the MTJ element MTJ4 is in the anti-parallel state. However, while the first read current Ir1 flows, the magnetization of the MTJ element MTJ4 is not in the anti-parallel state (the magnetizations of the fixed layer 13 and free layer 15 tilt from the anti-parallel state). Since the anti-parallel state with the highest resistance is lost in the MTJ element MTJ4, the resistance value of the MTJ element MTJ4 decreases. For this reason, only while the first read current Ir1 flows, the resistance value Rmtj of the MTJ elements in the whole block decreases.

The difference between the current value I when only the second read current Ir2 flows and the current value I' of the second read current Ir2 when the first and second read currents Ir1 and Ir2 flow simultaneously is read. When the current value I' of the second read current Ir2 is larger than the current value I, i.e., when the resistance value Rmtj of the MTJ elements in the whole block decreases, it can be determined that "1" data is stored in a selected cell SC2.

When the first read current Ir1 supplied to the word line WL4 is turned off, the magnetization of the free layer 15 of the MTJ element MTJ4 returns to the initial state (anti-parallel state in FIG. 9) again.

[1-3b] Word Line Easy Axis Type

In the word line easy axis type, the direction of the magnetic field generated by the word line current turns to the direction of axis of easy magnetization of the MTJ element. More specifically, the direction of axis of easy magnetization of the MTJ element is almost parallel to the running direction of the bit line BL. The direction of axis of hard magnetization of the MTJ element is almost parallel to the running direction of the word line WL.

A) Write Operation

Figure 13:
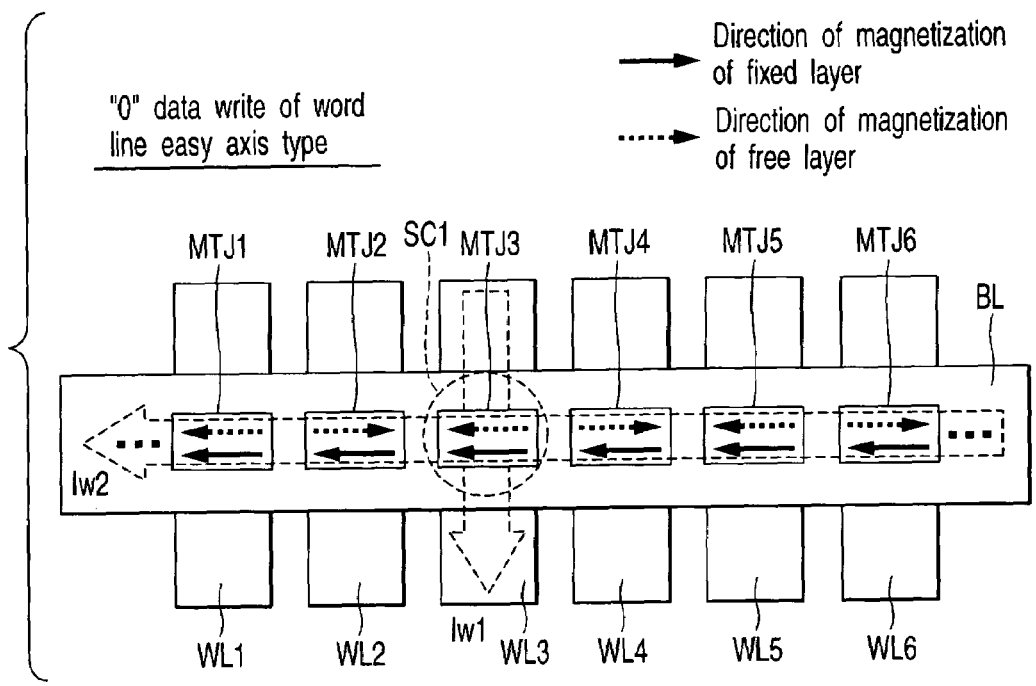
FIG. 13 is a schematic plan view of cells in the "0" data write of a word line easy axis type according to the first embodiment of the present invention.

FIG. 13 is a schematic plan view of cells in the "0" data write of the word line easy axis type according to the first embodiment of the present invention. The "0" data write operation of the word line easy axis type will be described below.

The word line WL3 and bit line BL are selected. The first and second write currents Iw1 and Iw2 are supplied to the word line WL3 and bit line BL, respectively. A synthetic field generated by the first and second write currents Iw1 and Iw2 is applied to the MTJ element MTJ3 located at the cross point between the word line WL3 and the bit line BL. As a result, the magnetization directions of the fixed layer 13 and free layer 15 of the MTJ element MTJ3 become parallel to each other, and data is written in the MTJ element MTJ3. The state in which the magnetization directions are parallel is defined as a state in which "0" data is written.

Figure 14:
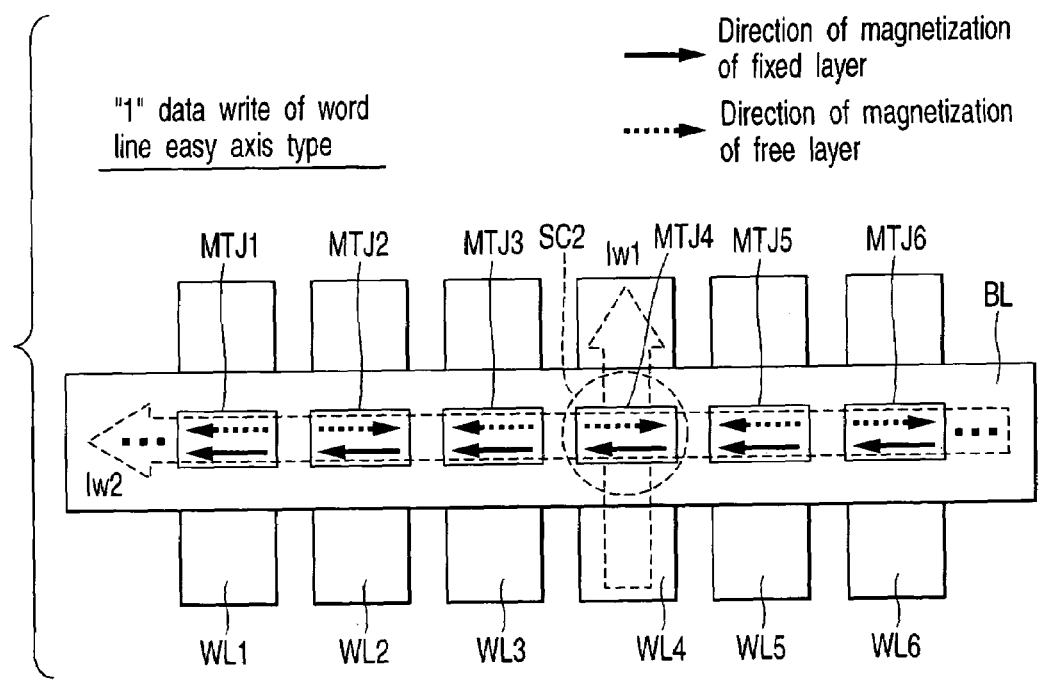
FIG. 14 is a schematic plan view of cells in the "1" data write of the word line easy axis type according to the first embodiment of the present invention.

FIG. 14 is a schematic plan view of cells in the "1" data write of the word line easy axis type according to the first embodiment of the present invention. The "1" data write operation of the word line easy axis type will be described below.

The word line WL4 and bit line BL are selected. The first and second write currents Iw1 and Iw2 are supplied to the word line WL4 and bit line BL, respectively. A synthetic field generated by the first and second write currents Iw1 and Iw2 is applied to the MTJ element MTJ4 located at the cross point between the word line WL4 and the bit line BL. As a result, the magnetization directions of the fixed layer 13 and free layer 15 of the MTJ element MTJ4 become anti-parallel to each other, and data is written in the MTJ element MTJ4. The state in which the magnetization directions are anti-parallel is defined as a state in which "1" data is written.

In the bit line easy axis type, the direction of the second write current Iw2 to be supplied to the bit line BL is changed in accordance with write data. In the word line easy axis type, the direction of the first write current Iw1 to be supplied to the word line WL is changed in accordance with write data. More specifically, in the example of this embodiment in which the magnetization of the fixed layer 13 is fixed leftward on the drawing surface, to write "0" data, the first write current Iw1 is supplied to the word line WL from the upper side to the lower side on the drawing surface (FIG. 13). To write "1" data, the first write current Iw1 is supplied to the word line WL from the lower side to the upper side on the drawing surface (FIG. 14). When the first write current Iw1 is supplied in reverse direction in the above-described ways, binary data can selectively be written. The second write current Iw2 can be supplied to the bit line BL either from the right to the left or from the left to the right on the drawing surface.

B) Read Operation

FIG. 15 is a schematic perspective view of the magnetic random access memory in the "1" and "0" data read of the word line easy axis type according to the first embodiment of the present invention.

As shown in FIG. 15, in the read operation of the word line easy axis type according to the first embodiment, the first read current Ir1 is supplied to the word line WLn corresponding to the selected cell SCn while supplying the second read current Ir2 to read the resistance value of the selected cell SCn from the bit line BL to the read line RL. A change in resistance value in the MTJ element MTJn is read from a change in second read current Ir2 in the first read current Ir1 supplying state, thereby discriminating between "1" and "0" data.

Figure 16:
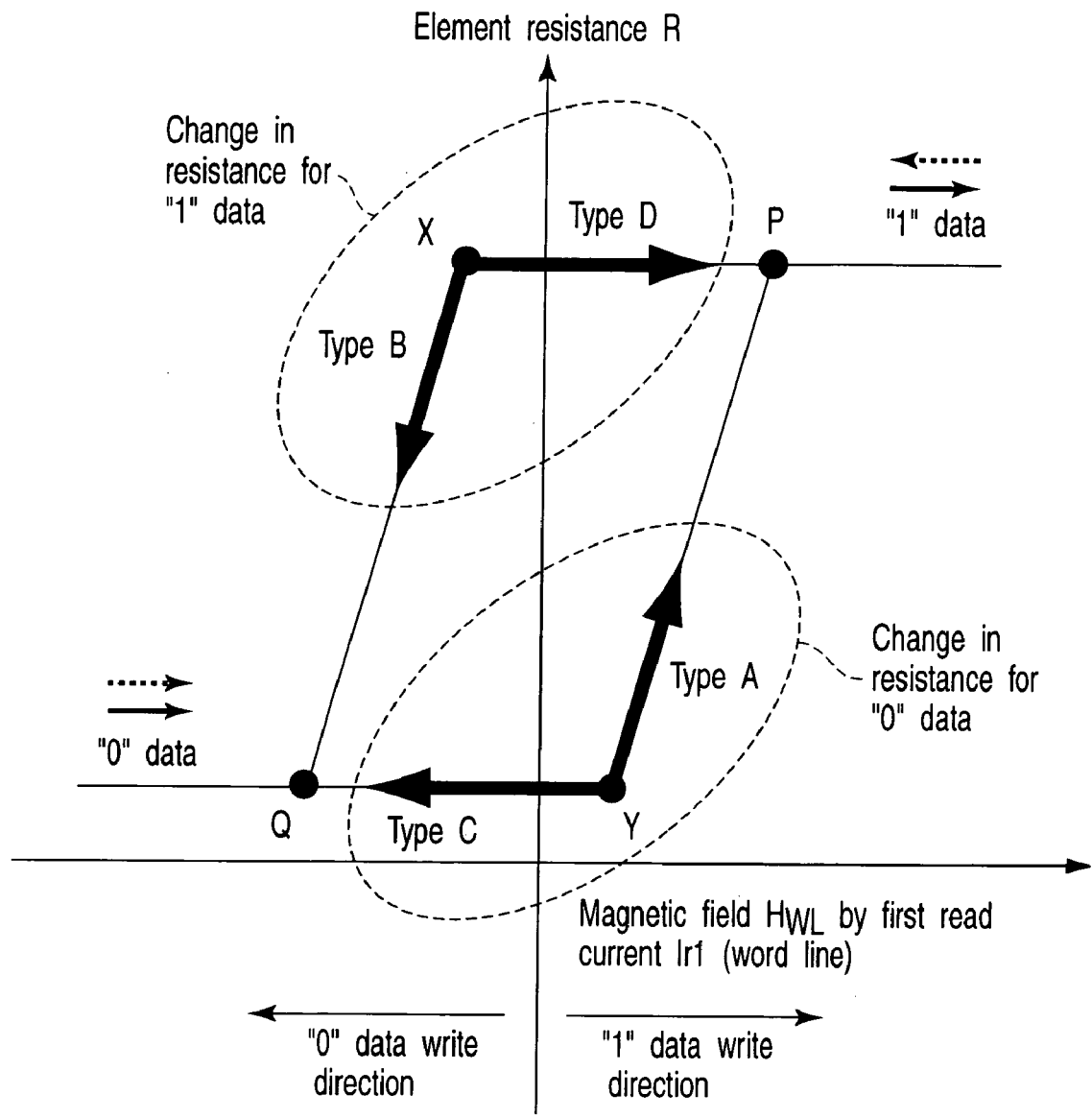
FIG. 16 is a graph showing the hysteresis curve of the word line easy axis type according to the first embodiment of the present invention.

FIG. 16 shows the hysteresis curve of the word line easy axis type according to the first embodiment of the present invention. Referring to FIG. 16, the abscissa represents the magnetic field $H_{WL}$ generated by the first read current Ir1, and the ordinate represents an element resistance R of the MTJ element.

As shown in FIG. 16, when the second read current Ir2 is sensed while the first read current Ir1 flows, the resistance value of the MTJ element MTJn changes like a type A, B, C, or D.

When the first read current Ir1 is supplied to the word line WLn in the "1" data write direction (positive side), the element resistance R of the MTJ element MTJn changes like the type A or D. When the element resistance R increases, like the type A, it can be determined that "0" data is written in the MTJ element MTJn. When the element resistance R does not change, like the type D, it can be determined that "1" data is written in the MTJ element MTJn.

When the first read current Ir1 is supplied to the word line WLn in the "0" data write direction (negative side), the element resistance R of the MTJ element MTJn changes like the type B or C. When the element resistance R decreases, like the type B, it can be determined that "1" data is written in the MTJ element MTJn. When the element resistance R does not change, like the type C, it can be determined that "0" data is written in the MTJ element MTJn.

The read method of discriminating between "1" and "0" data on the basis of the change in element resistance R like the type A, B, C, or D will be described below in detail.

(Type A)

Figure 17:
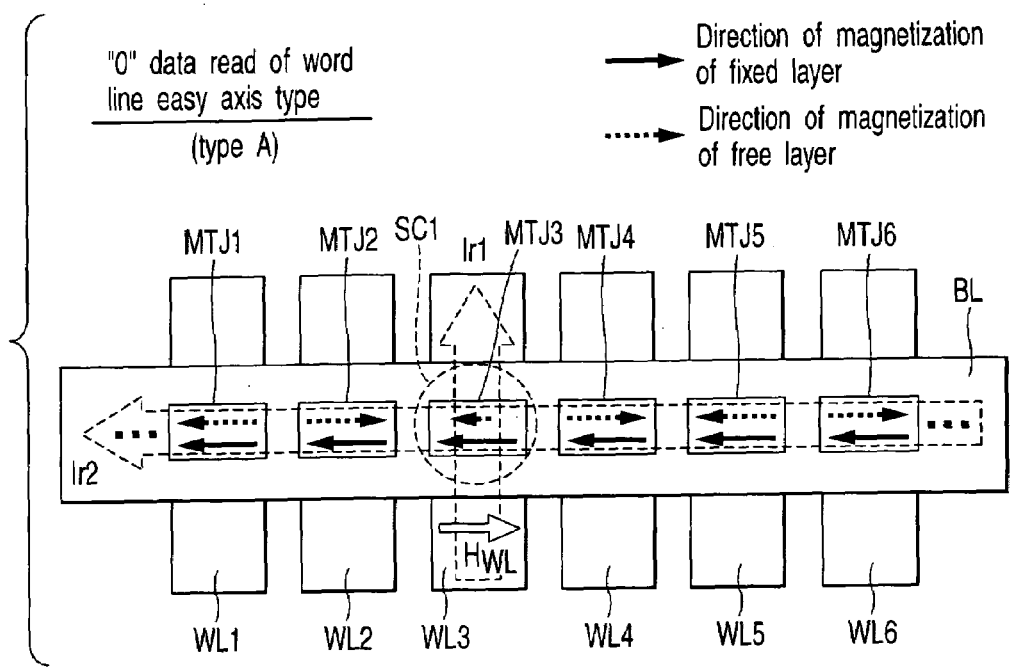
FIG. 17 is a schematic plan view of cells in the "0" data read of type A of the word line easy axis type according to the first embodiment of the present invention.

FIG. 17 is a schematic plan view of cells in the "0" data read of type A of the word line easy axis type according to the first embodiment of the present invention. The read operation of type A will be described below with reference to FIG. 17.

The second read current Ir2 is supplied from the bit line BL to the read line RL. After that, the first read current Ir1 is supplied to the word line WL3 in the "1" data write direction (from the lower side to the upper side on the drawing surface). The magnetic field $H_{WL}$ generated by the second read current Ir2 is applied to the MTJ element MTJ3. As a result, the magnetization of the free layer 15 of the MTJ element MTJ3 becomes small. Since the parallel state with the lowest resistance weakens in the MTJ element MTJ3, the resistance value of the MTJ element MTJ3 increases. For this reason, only while the first read current Ir1 flows, the resistance value Rmtj of the MTJ elements in the whole block increases.

The difference between the current value I when only the second read current Ir2 flows and the current value I' of the second read current Ir2 when the first and second read currents Ir1 and Ir2 flow simultaneously is read. When the current value I' of the second read current Ir2 is smaller than the current value I, i.e., when the resistance value Rmtj of the MTJ elements in the whole block increases, it can be determined that "0" data is stored in the selected cell SC1.

When the first read current Ir1 supplied to the word line WL3 is turned off, the magnetization of the free layer 15 of the MTJ element MTJ3 returns to the initial state (parallel state in FIG. 13) again.

(Type B)

Figure 18:
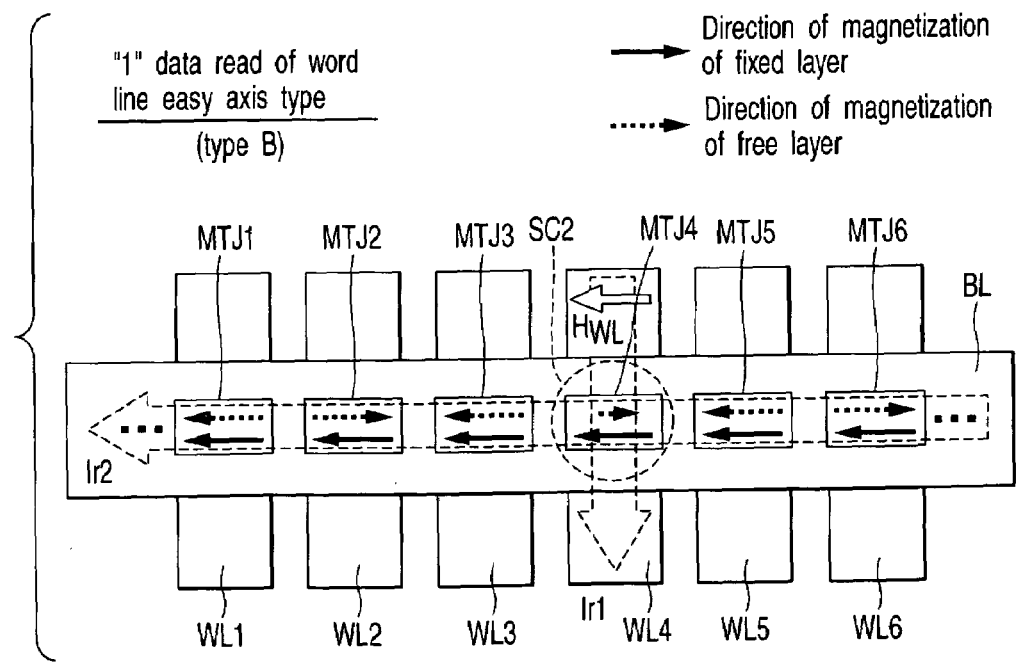
FIG. 18 is a schematic plan view of cells in the "1" data read of type B of the word line easy axis type according to the first embodiment of the present invention.

FIG. 18 is a schematic plan view of cells in the "1" data read of type B of the word line easy axis type according to the first embodiment of the present invention. The read operation of type B will be described below with reference to FIG. 18.

The second read current Ir2 is supplied from the bit line BL to the read line RL. After that, the first read current Ir1 is supplied to the word line WL4 in the "0" data write direction (from the upper side to the lower side on the drawing surface). The magnetic field $H_{WL}$ generated by the first read current Ir1 is applied to the MTJ element MTJ4. As a result, the magnetization of the free layer 15 of the MTJ element MTJ4 becomes small. Since the anti-parallel state with the highest resistance weakens in the MTJ element MTJ4, the resistance value of the MTJ element MTJ4 decreases. For this reason, only while the first read current Ir1 flows, the resistance value Rmtj of the MTJ elements in the whole block decreases.

The difference between the current value I when only the second read current Ir2 flows and the current value I' of the second read current Ir2 when the first and second read currents Ir1 and Ir2 flow simultaneously is read. When the current value I' of the second read current Ir2 is larger than the current value I, i.e., when the resistance value Rmtj of the MTJ elements in the whole block decreases, it can be determined that "1" data is stored in the selected cell SC2.

When the first read current Ir1 supplied to the word line WL4 is turned off, the magnetization of the free layer 15 of the MTJ element MTJ4 returns to the initial state (anti-parallel state in FIG. 14) again.

(Type C)

Figure 19:
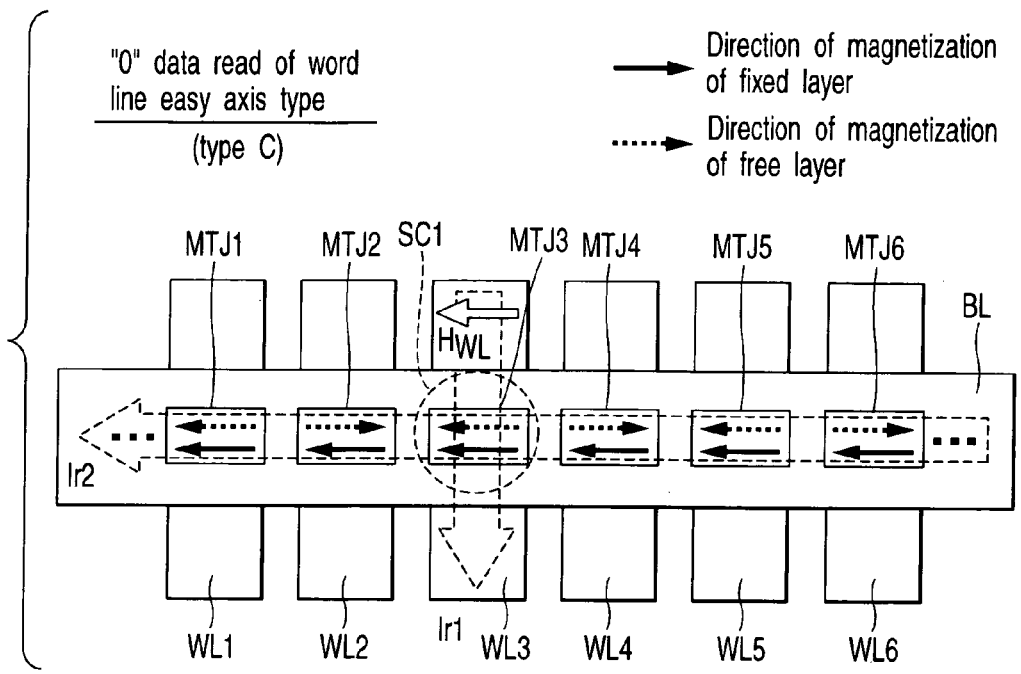
FIG. 19 is a schematic plan view of cells in the "0" data read of type C of the word line easy axis type according to the first embodiment of the present invention.

FIG. 19 is a schematic plan view of cells in the "0" data read of type C of the word line easy axis type according to the first embodiment of the present invention. The read operation of type C will be described below with reference to FIG. 19.

The second read current Ir2 is supplied from the bit line BL to the read line RL. After that, the first read current Ir1 is supplied to the word line WL3 in the "0" data write direction (from the upper side to the lower side on the drawing surface). The magnetic field $H_{WL}$ generated by the first read current Ir1 is applied to the MTJ element MTJ3. As a result, the magnetization of the free layer 15 of the MTJ element MTJ3 becomes large, though the parallel state of magnetizations is maintained. Hence, even when the first read current Ir1 flows, the resistance value of the MTJ element MTJ3 does not change. For this reason, the resistance value Rmtj of the MTJ elements in the whole block does not change, either.

The difference between the current value I when only the second read current Ir2 flows and the current value I' of the second read current Ir2 when the first and second read currents Ir1 and Ir2 flow simultaneously is read. When the current value I' of the second read current Ir2 almost equals the current value I, i.e., when the resistance value Rmtj of the MTJ elements in the whole block rarely changes, it can be determined that "0" data is stored in the selected cell SC1.

When the first read current Ir1 supplied to the word line WL3 is turned off, the magnetization of the free layer 15 of the MTJ element MTJ3 returns to the initial state (parallel state in FIG. 13) again.

(Type D)

Figure 20:
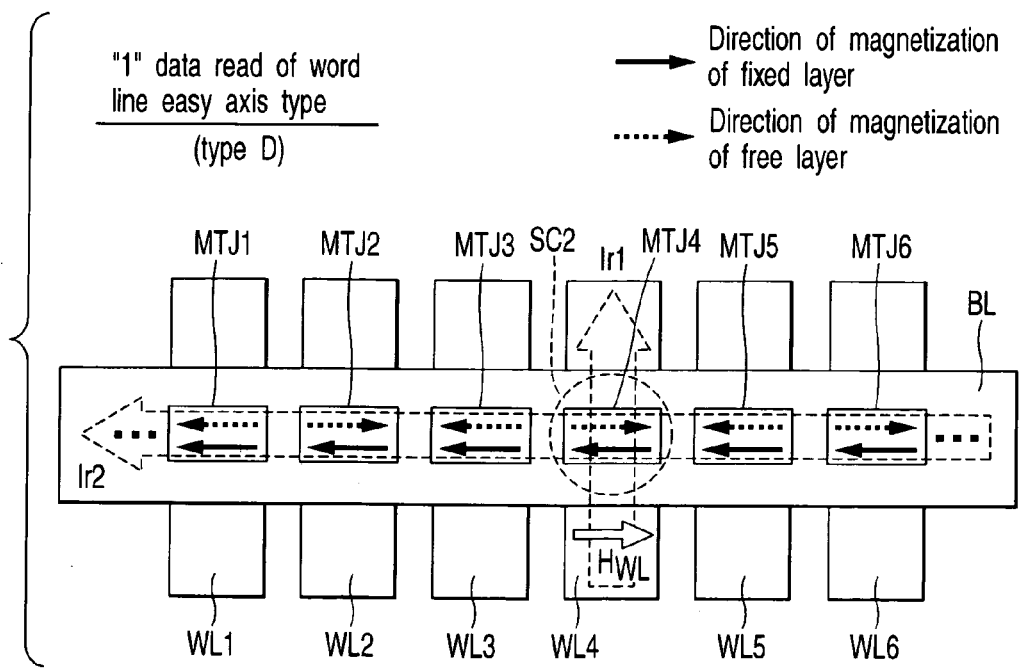
FIG. 20 is a schematic plan view of cells in the "1" data read of type D of the word line easy axis type according to the first embodiment of the present invention.

FIG. 20 is a schematic plan view of cells in the "1" data read of type D of the word line easy axis type according to the first embodiment of the present invention. The read operation of type D will be described below with reference to FIG. 20.

The second read current Ir2 is supplied from the bit line BL to the read line RL. After that, the first read current Ir1 is supplied to the word line WL4 in the "1" data write direction (from the lower side to the upper side on the drawing surface). The magnetic field $H_{WL}$ generated by the first read current Ir1 is applied to the MTJ element MTJ4. As a result, the magnetization of the free layer 15 of the MTJ element MTJ4 becomes large, though the parallel state of magnetizations is maintained. Hence, even when the first read current Ir1 flows, the resistance value of the MTJ element MTJ4 does not change. For this reason, the resistance value Rmtj of the MTJ elements in the whole block does not change, either.

The difference between the current value I when only the second read current Ir2 flows and the current value I' of the second read current Ir2 when the first and second read currents Ir1 and Ir2 flow simultaneously is read. When the current value I' of the second read current Ir2 almost equals the current value I, i.e., when the resistance value Rmtj of the MTJ elements in the whole block rarely changes, it can be determined that "1" data is stored in the selected cell SC2.

When the first read current Ir1 supplied to the word line WL4 is turned off, the magnetization of the free layer 15 of the MTJ element MTJ4 returns to the initial state (anti-parallel state in FIG. 14) again.

[1-3c] Summary of Write and Read Operations

Figure 21A:
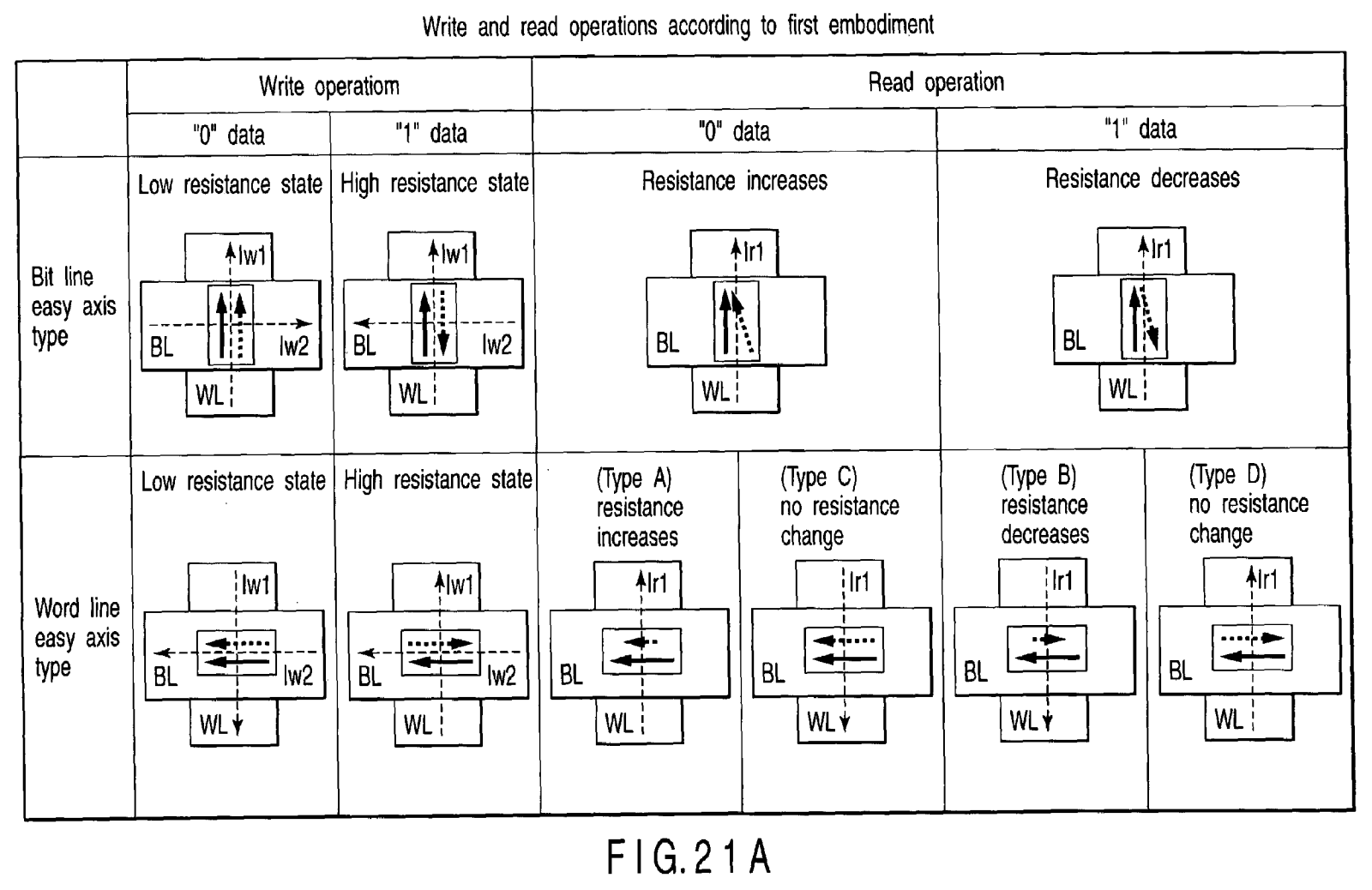
Figure 21B:
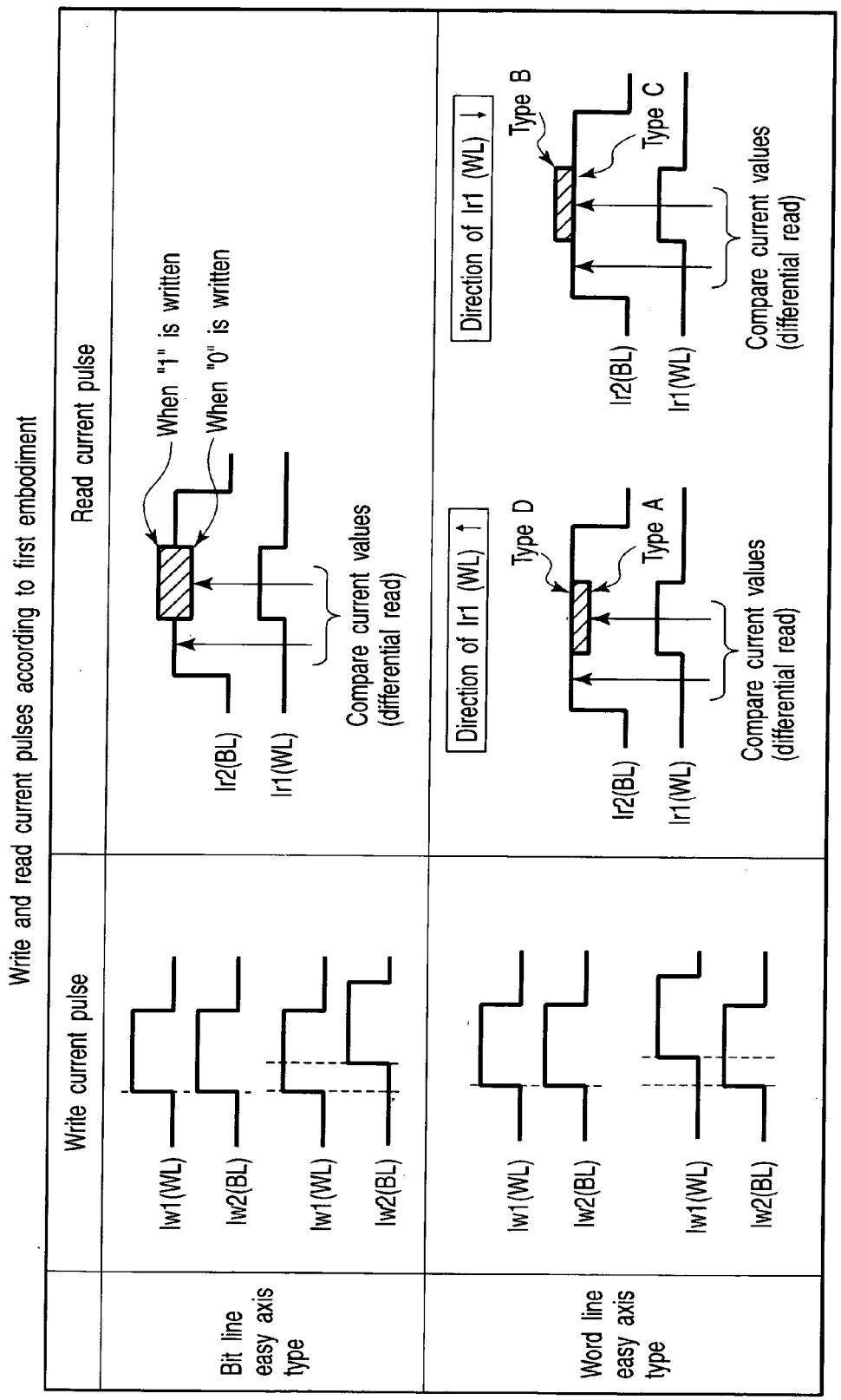
FIG. 21B is a list of write and read current pulses according to the first embodiment of the present invention.

FIG. 21A is a schematic list of the write and read operations according to the first embodiment of the present invention. FIG. 21B is a list of write and read current pulses according to the first embodiment of the present invention. The write and read operations will be described briefly while comparing the bit line easy axis type and word line easy axis type with reference to FIGS. 21A and 21B.

(Write Operation)

In both the bit line easy axis type and the word line easy axis type, a biaxial write using the bit line BL and word line WL is executed. In the bit line easy axis type, binary data is selectively written by changing the direction of the current Iw2 to be supplied to the bit line BL. In the word line easy axis type, binary data is selectively written by changing the direction of the current Iw1 to be supplied to the word line WL.

In the write operation, the supply timings of the write currents Iw1 and Iw2 are preferably adjusted in, e.g., the following way.

In the bit line easy axis type, the write currents Iw1 and Iw2 may be supplied almost simultaneously. Alternatively, the write current Iw1 may be supplied to the word line WL first, and the write current Iw2 may be supplied to the bit line BL next.

In the word line easy axis type, the write currents Iw1 and Iw2 may be supplied almost simultaneously. Alternatively, the write current Iw2 may be supplied to the bit line BL first, and the write current Iw1 may be supplied to the word line WL next.

Assume that the supply timings of the write currents Iw1 and Iw2 are shifted in the bit line easy axis type and word line easy axis type. In this case, when magnetization reversal is caused after the asteroid curve is made slightly narrower, the write currents Iw1 and Iw2 can be reduced. In addition, the write operation can be made more stable, and write errors can be prevented.

(Read Operation)

In both the bit line easy axis type and the word line easy axis type, discrimination between "1" and "0" data is done by determining whether the resistance of the MTJ element "increases" or "decreases" in the read.

The word line easy axis type has the following three read methods.

(1) The read is executed by supplying the word line current to "1" and "0" cells in the same direction (e.g., "1" write direction). If the resistance value of the MTJ element increases, the data is discriminated as "0". If the resistance value does not change, the data is discriminated as "1".

(2) The read is executed by supplying the word line current to "1" and "0" cells in the same direction (e.g., "0" write direction). If the resistance value of the MTJ element does not change, the data is discriminated as "0". If the resistance value decreases, the data is discriminated as "1".

(3) The read is executed by supplying the word line current to "1" and "0" cells in both directions ("0" and "1" write directions). If the resistance value of the MTJ element increases by one of the two-way current pulses, the data is discriminated as "0". If the resistance value decreases, the data is discriminated as "1".

In the read operation, the supply timings of the read currents Ir1 and Ir2 are preferably adjusted in, e.g., the following way.

In both the bit line easy axis type and the word line easy axis type, the read current Ir1 is supplied to the word line WL while the read current Ir2 is supplied to the bit line BL first. The difference between the current Ir2 when the read current Ir1 is supplied to the word line WL and that when the read current Ir1 is not supplied is read.

[1-3d] Asteroid Curve

Figure 22:
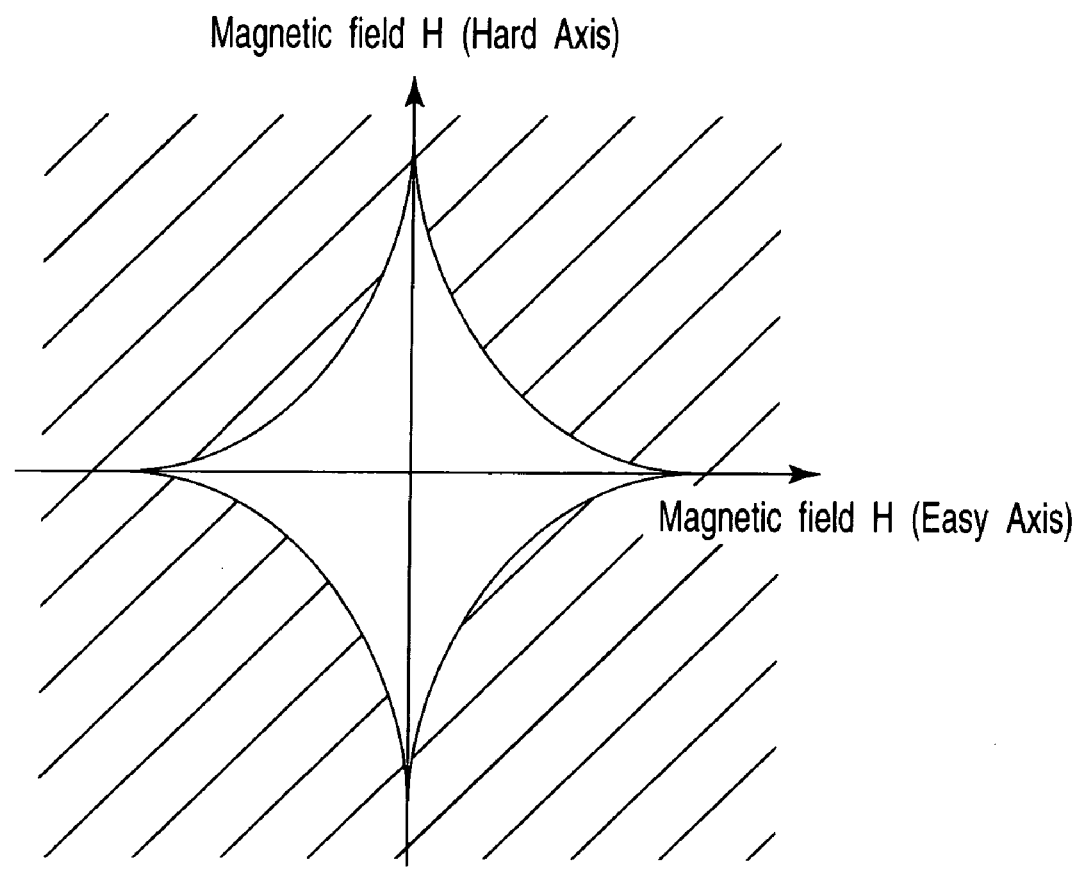
FIG. 22 is a graph showing the asteroid curve of the principle of the read and write operations according to the first embodiment of the present invention.

FIG. 22 shows the asteroid curve of the principle of the read and write operations according to the first embodiment of the present invention. The abscissa represents a magnetic field H (Easy Axis) applied in the direction of axis of easy magnetization of the MTJ element, and the ordinate represents the magnetic field H (Hard Axis) applied in the direction of axis of hard magnetization of the MTJ element.

To write data in the MTJ element, the magnetic field outside (hatched portion) the asteroid curve is used. When the synthetic field of the magnetic field H (Easy Axis) and magnetic field H (Hard Axis) is applied to the MTJ element, data can be written.

To read out data from the MTJ element, the magnetic field (magnetic field except point 0) inside (portion without hatching) the asteroid curve is used. That is, in the read, a magnetic field not to rewrite data in the MTJ element (not to completely reverse the magnetization), i.e., a magnetic field smaller than in the write is applied to the MTJ element. Both the magnetic field H (Easy Axis) and the magnetic field H (Hard Axis) may be used when they are inside the asteroid curve. However, it is preferable to use one of the magnetic field H (Easy Axis) and magnetic field H (Hard Axis). For, e.g., the bit line easy axis type, the magnetic field (magnetic field H (Easy Axis)=0) on the ordinate of the asteroid curve generated by supplying the read current Ir1 to only the word line WL is preferably used.

In the write, the write currents Iw1 and Iw2 of, e.g., about 1 mA are supplied to the bit line BL and word line WL, respectively.

In the read, the read current Ir1 supplied to the word line WL is preferably larger than the read current Ir2 supplied to the bit line BL. Hence, the read current Ir2 of, e.g., several μA is supplied to the bit line BL. The read current Ir1 of, e.g., several μA to 1 mA is supplied to the word line WL.

[1-4] Effect

According to the above-described first embodiment, in the ladder structure in which the plurality of MTJ elements are connected in parallel, in the data read, the first read current Ir1 is supplied to the word line WLn corresponding to a selected cell SC while the second read current Ir2 is supplied from the bit line BL to the read line RL, thereby applying a magnetic field to the MTJ element of the selected cell SC. The difference between the current Ir2 when the first read current Ir1 is supplied to the word line WLn and that when the first read current Ir1 is not supplied is read. Discrimination between "1" and "0" data can be done by determining whether the resistance value of the MTJ element decreases or increases.

As described above, in the first embodiment, the memory cells have the ladder structure. Hence, the density of the cells can be increased. Simultaneously, the read operation speed can be increased by executing the data read in one cycle.

[2] Second Embodiment

In the second embodiment, a ladder-shaped magnetic random access memory using giant magneto-resistance (GMR) elements will be described.

[2-1] Structure

Figure 23:
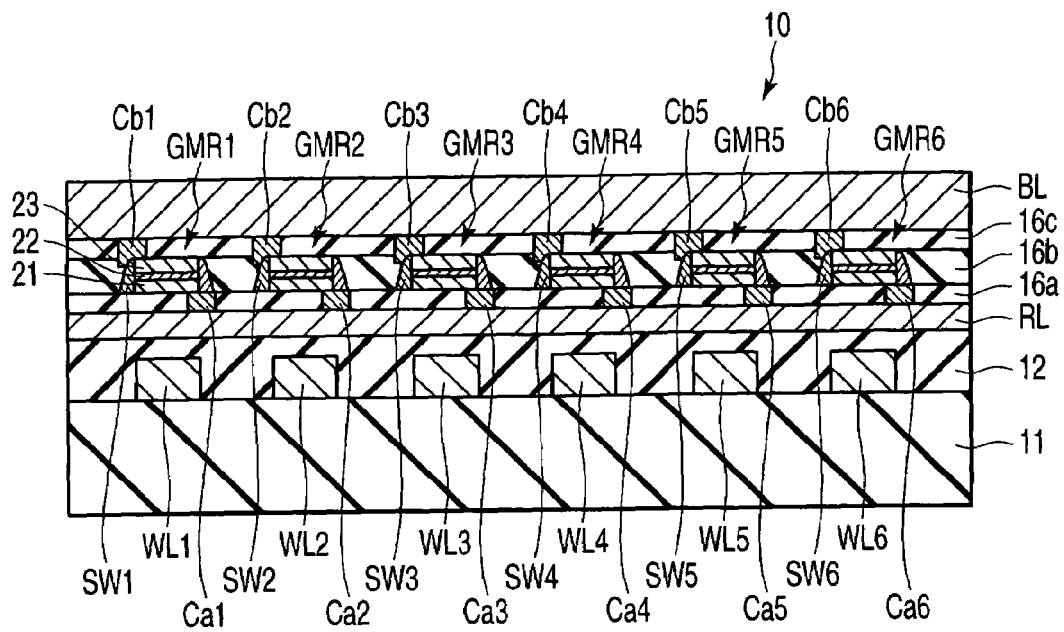
FIG. 23 is a sectional view showing a magnetic random access memory according to the second embodiment of the present invention.

FIG. 23 is a sectional view of a magnetic random access memory according to the second embodiment. As shown in FIG. 23, in the second embodiment, GMR elements are used in place of the MTJ elements of the first embodiment. The structure of the magnetic random access memory according to the second embodiment, which is different from the first embodiment, will mainly be described below.

A GMR element includes free layers 21 and 23 serving as soft magnetic layers and a low-resistance conductive layer 22 serving as a nonmagnetic layer. Since the conductive layer 22 is sandwiched between the free layers 21 and 23, an antiferromagnetic coupling structure is formed so that antiferromagnetic coupling by exchange interaction occurs. The GMR element will be described in the eighth embodiment.

In the first embodiment which uses MTJ elements, the read current is supplied in the direction perpendicular to the film surface of the MTJ elements (vertical direction). In the second embodiment which uses GMR elements, the read current is supplied in the direction parallel to the film surface of the MTJ elements (horizontal direction). For this reason, in the second embodiment, the connection structure of the GMR elements to a bit line BL and read line RL is different from the first embodiment.

More specifically, sidewalls SWn (n=1, 2, 3, . . . ) are provided on both side surfaces of each GMR element GMRn. A contact Can to electrically connect one of the sidewalls SWn to the read line RL is provided. A contact Cbn to electrically connect the other of the sidewalls SWn to the bit line BL is provided.

[2-2] Manufacturing Method

FIGS. 24 to 30 are schematic sectional views showing steps in manufacturing the magnetic random access memory according to the second embodiment of the present invention. The method of manufacturing the magnetic random access memory according to the second embodiment will be described below.

Figure 24:
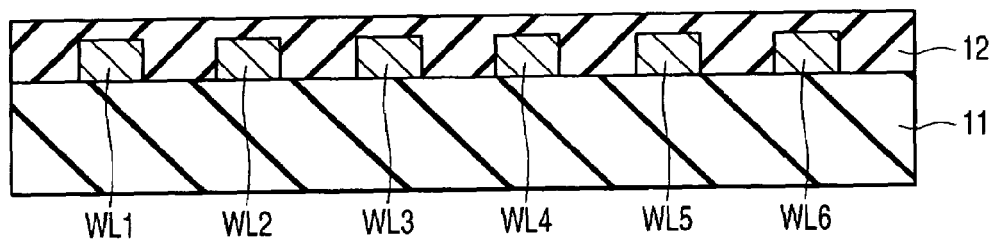
FIGS. 24 to 30 are sectional views showing steps in manufacturing the magnetic random access memory according to the second embodiment of the present invention.

As shown in FIG. 24, a CMOS circuit (not shown) is formed on a silicon substrate (not shown) by a normal semiconductor process. A multilayered wiring (not shown) is formed on the CMOS circuit. A first insulating film 11 is formed on the multilayered wiring. The upper surface of the first insulating film 11 is planarized by CMP. Word lines WLn are formed on the first insulating film 11 by using a normal metal wiring process. The word lines WLn are covered with a second insulating film 12. The upper surface of the second insulating film 12 is planarized by CMP.

Figure 25:
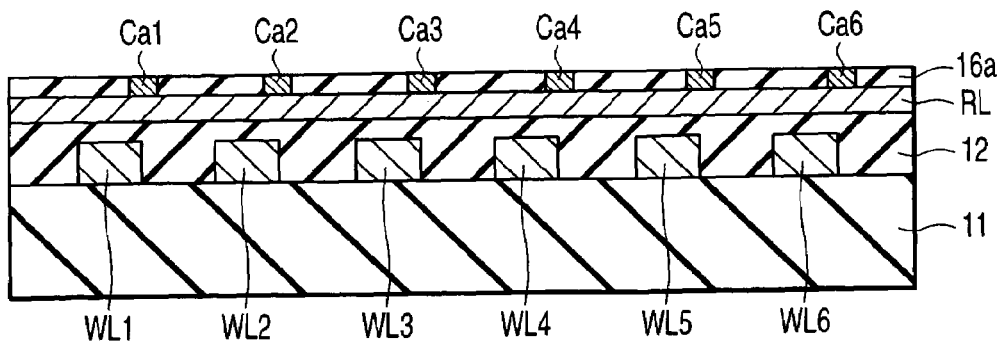

As shown in FIG. 25, the read line RL is formed on the second insulating film 12. A third insulating film 16a is formed on the read line RL. The contacts Can are formed in the third insulating film 16a.

Figure 26:
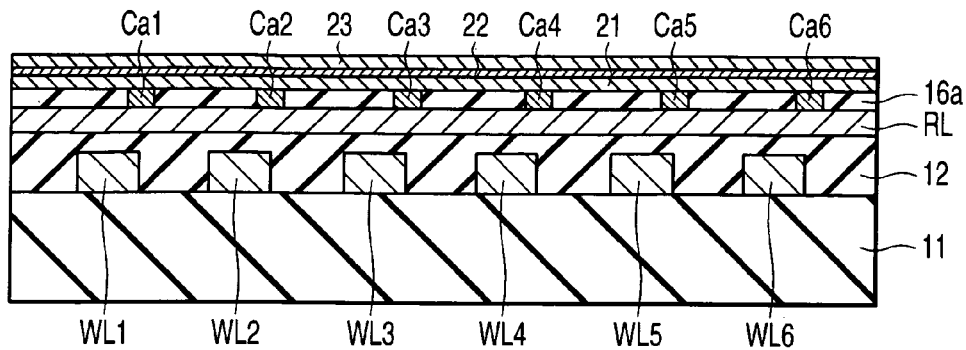

As shown in FIG. 26, the free layer 21, conductive layer 22, and free layer 23 as the prospective GMR elements are sequentially deposited on the third insulating film 16a and contacts Can.

Figure 27:
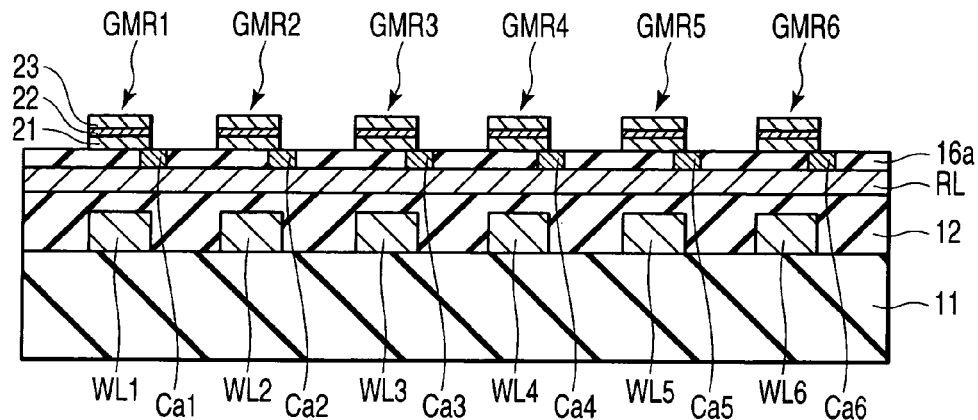

As shown in FIG. 27, the free layer 21, conductive layer 22, and free layer 23 are patterned by lithography using a normal resist to form the GMR elements GMRn. At this time, etching to pattern the GMR elements GMRn may be stopped on the upper surface of the free layer 21 or the lower surface of the free layer 21.

Figure 28:
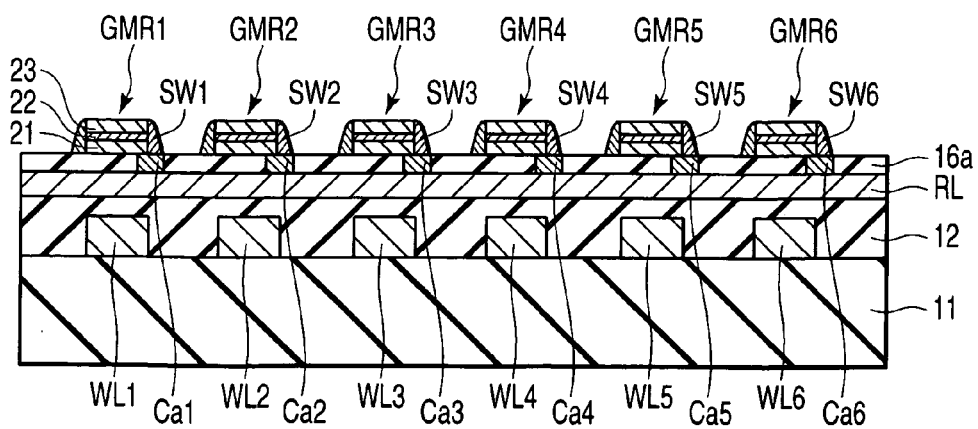

As shown in FIG. 28, the sidewalls SWn made of a conductive material are formed on both side surfaces of each GMR element GMRn. One of the sidewalls SWn provided on both side surfaces of each GMR element GMRn contacts the contact Can.

Figure 29:
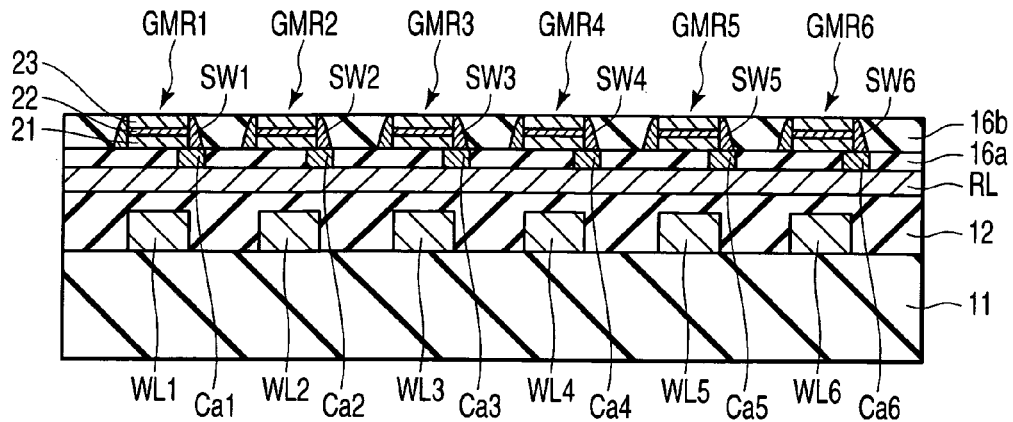

As shown in FIG. 29, a fourth insulating film 16b is formed on the GMR elements GMRn. The upper surface of the fourth insulating film 16b is planarized by CMP until the upper surfaces of the GMR elements GMRn are exposed.

Figure 30:
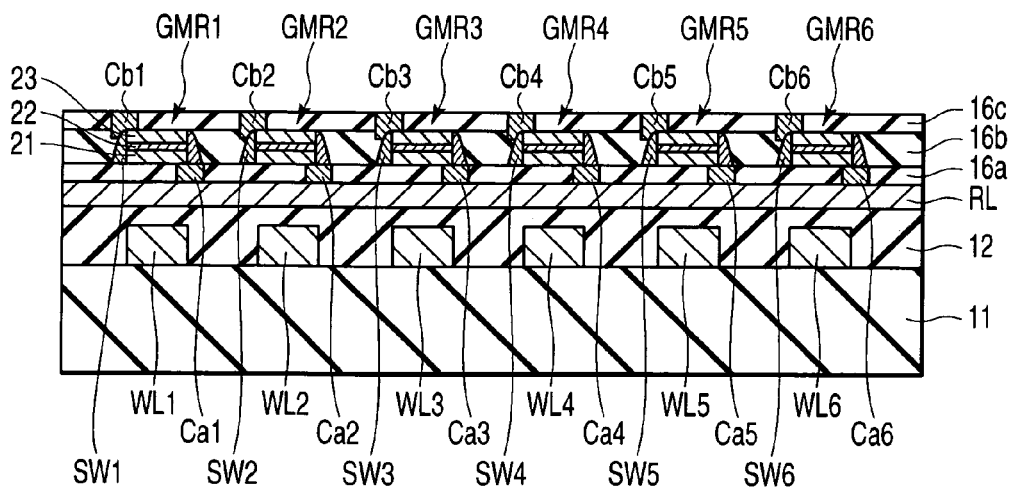

As shown in FIG. 30, a fifth insulating film 16c is formed on the fourth insulating film 16b and GMR elements GMRn. Via holes are formed in the fifth insulating film 16c to expose the sidewalls SWn. The via holes are filled with a metal material to form the contacts Cbn connected to the sidewalls SWn. To electrically connect the contacts Cbn to the sidewalls SWn, the via holes are preferably formed by overetching to some extent.

Next, as shown in FIG. 23, the bit line BL is formed on the fifth insulating film 16c and contacts Cbn by using a normal metal wiring process. In this way, the ladder-shaped magnetic random access memory is completed.

[2-3] Write and Read Operations

The write and read operations of the magnetic random access memory according to the second embodiment will be described below.

Each GMR element is arranged such that the direction of axis of easy magnetization of the GMR element is almost parallel to the running direction of the word line WL, and the direction of axis of hard magnetization of the GMR element is almost parallel to the running direction of the bit line BL.

A) Write Operation

Figure 31:
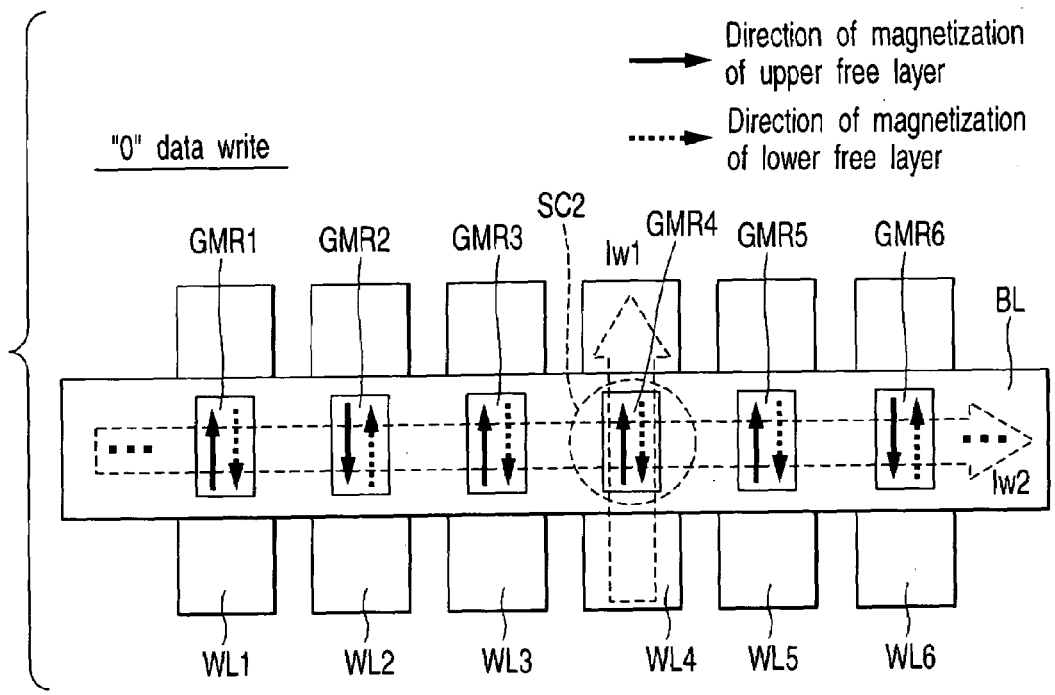
FIG. 31 is a schematic plan view of cells in the "0" data write according to the second embodiment of the present invention.

FIG. 31 is a schematic plan view of cells in the "0" data write according to the second embodiment of the present invention. The "0" data write operation will be described below.

A word line WL4 and bit line BL are selected. First and second write currents Iw1 and Iw2 are supplied to the word line WL4 and bit line BL, respectively. A synthetic field generated by the first and second write currents Iw1 and Iw2 is applied to a GMR element GMR4 located at the cross point between the word line WL4 and the bit line BL. As a result, the magnetizations of the free layers 21 and 23 of the GMR element GMR4 are reversed while maintaining anti-ferromagnetic coupling, and data is written in the GMR element GMR4. The magnetization state shown in FIG. 31 is defined as a state in which "0" data is written.

Figure 32:
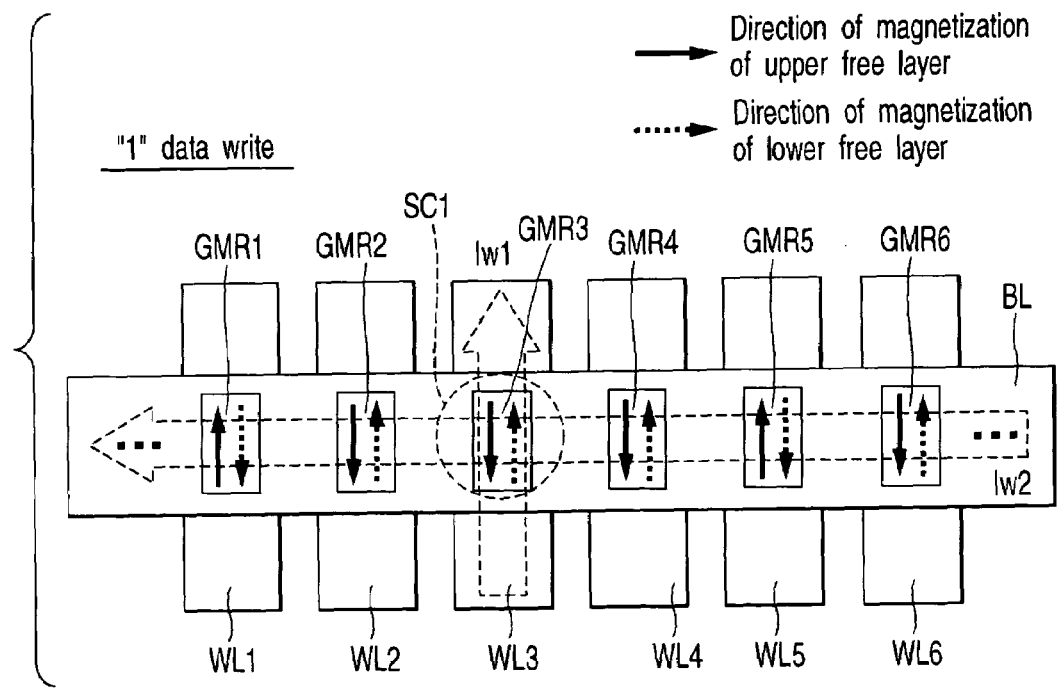
FIG. 32 is a schematic plan view of cells in the "1" data write according to the second embodiment of the present invention.

FIG. 32 is a schematic plan view of cells in the "1" data write according to the second embodiment of the present invention. The "1" data write operation will be described below.

A word line WL3 and bit line BL are selected. The first and second write currents Iw1 and Iw2 are supplied to the word line WL3 and bit line BL, respectively. A synthetic field generated by the first and second write currents Iw1 and Iw2 is applied to a GMR element GMR3 located at the cross point between the word line WL3 and the bit line BL. As a result, the magnetizations of the free layers 21 and 23 of the GMR element GMR3 are reversed while maintaining anti-ferromagnetic coupling, and data is written in the GMR element GMR3. The magnetization state shown in FIG. 32 is defined as a state in which "1" data is written.

To write "0" data, the second write current Iw2 is supplied to the bit line BL from the left to the right on the drawing surface (FIG. 31). To write "1" data, the second write current Iw2 is supplied to the bit line BL from the right to the left on the drawing surface (FIG. 32). When the second write current Iw2 is supplied in reverse direction in the above-described ways, binary data can selectively be written. The first write current Iw1 can be supplied to the word lines WL3 and WL4 either from the lower side to the upper side or from the upper side to the lower side on the drawing surface.

In this embodiment, the resistance value of the GMR element when "0" data is written (anti-parallel state) equals the resistance value of the GMR element when "1" data is written (anti-parallel state).

B) Read Operation

Figure 33:
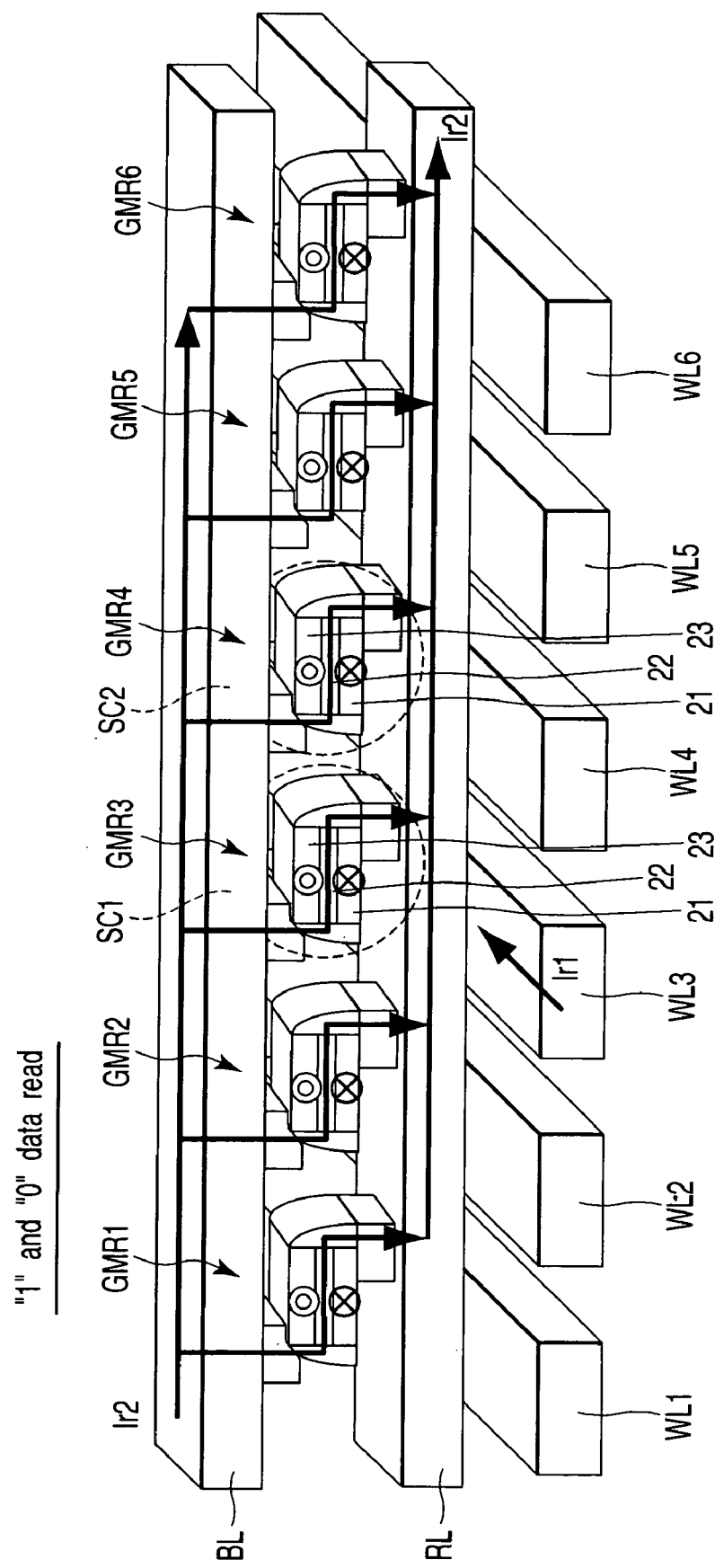
FIG. 33 is a schematic perspective view of the magnetic random access memory in the "1" and "0" data read according to the second embodiment of the present invention.

FIG. 33 is a schematic perspective view of the magnetic random access memory in the "1" and "0" data read according to the second embodiment of the present invention.

As shown in FIG. 33, in the read operation according to the second embodiment, a first read current Ir1 is supplied to the word line WLn corresponding to a selected cell SCn. In addition, a second read current Ir2 to read the resistance value of the selected cell SCn is supplied from the bit line BL to the read line RL. In the second embodiment, the magnetic field generated by the second read current Ir2 is also applied to the selected cell SCn, unlike the first embodiment. A change in resistance value in the GMR element GMRn is read from a change in second read current Ir2 in the first read current Ir1 supplying state, thereby discriminating between "1" and "0" data.

In this example, all the magnetizations of the free layers 21 and 23 of the GMR elements GMRn are in the anti-parallel state (FIGS. 31 and 32).

Figure 34A:
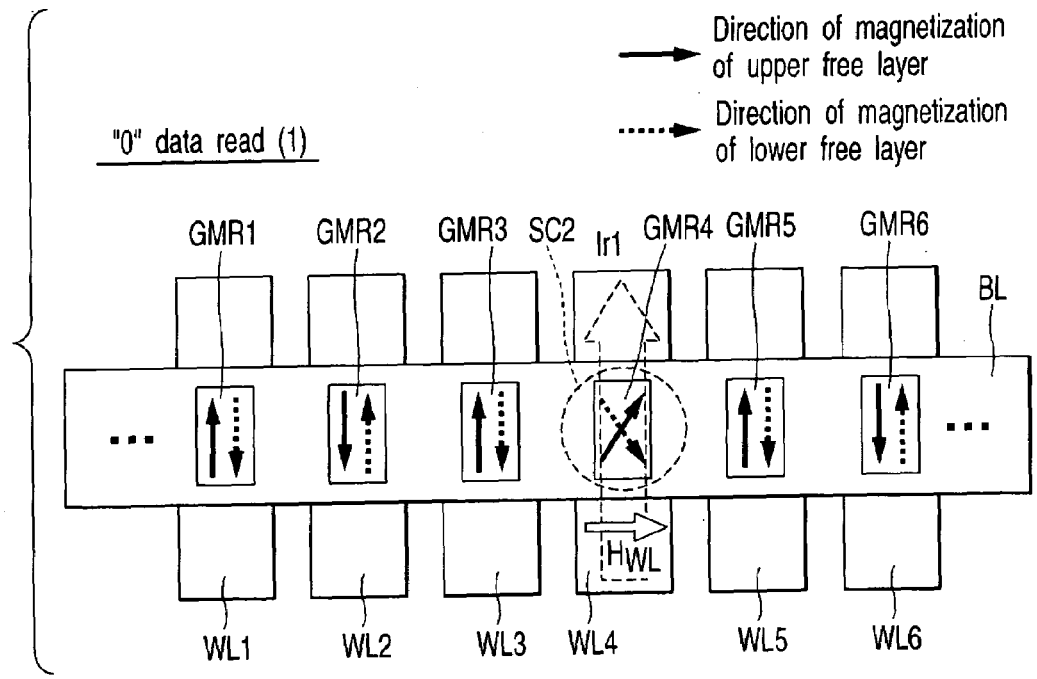
FIGS. 34A and 34B are schematic plan views of cells in the "0" data read according to the second embodiment of the present invention.
Figure 34B:
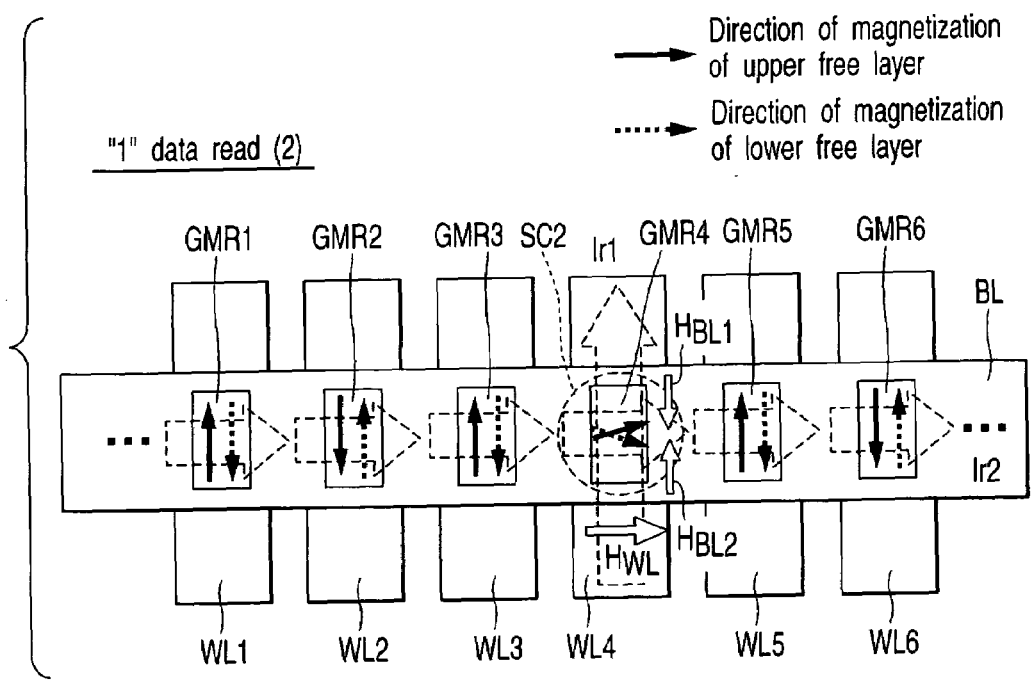

FIGS. 34A and 34B are schematic plan views of cells in the "0" data read according to the second embodiment of the present invention. The "0" data read operation will be described below with reference to FIGS. 34A and 34B.

As shown in FIG. 34A, the word line WL4 is selected. The first read current Ir1 is supplied to the word line WL4. A magnetic field $H_{WL}$ generated by the first read current Ir1 is applied to the GMR element GMR4. As a result, the magnetizations of the free layers 21 and 23 of the GMR element GMR4 rotate halfway so that the magnetizations of the free layers 21 and 23 start turning to the direction of the applied field $H_{WL}$.

As shown in FIG. 34B, the second read current Ir2 is supplied from the bit line BL to the read line RL. A magnetic field $H_{BL}$ generated by the second read current Ir2 when it passes through the conductive layer 22 of the GMR element is applied to the GMR element GMR4. The magnetic field $H_{BL}$ ($H_{BL1}$) acts on the upper free layer 23 downward on the drawing surface (to the near side on the drawing surface of FIG. 33). The magnetic field $H_{BL}$ ($H_{BL2}$) acts on the lower free layer 21 upward on the drawing surface (to the far side on the drawing surface of FIG. 33). As a result, the magnetization of the upper free layer 23 starts turning to the direction of the applied field $H_{BL}$ ($H_{BL1}$) (downward on the drawing surface). The magnetization of the lower free layer 21 starts turning to the direction of the applied field $H_{BL}$ ($H_{BL2}$) (upward on the drawing surface). Hence, the magnetizations of the two free layers start turning to the direction of the applied field $H_{WL}$.

Before the read, the magnetization of the GMR element GMR4 is in the anti-parallel state. However, in the read, the magnetization of the GMR element GMR4 is not in the anti-parallel state. Since the anti-parallel state with the highest resistance is lost in the GMR element GMR4, the resistance value of the GMR element GMR4 decreases. For this reason, only while the first read current Ir1 flows, a resistance value Rgmr of the GMR elements in the whole block decreases.

In this way, the change in state of the resistance value Rgmr of the GMR elements in the whole block is read by the second read current Ir2. When the resistance value Rgmr of the GMR elements in the whole block decreases, it can be determined that "0" data is stored in a selected cell SC2. Data discrimination is done by comparing the resistance value Rgmr of the GMR element with the current value of a reference cell to which the first read current Ir1 is not supplied.

When the first read current Ir1 supplied to the word line WL4 is turned off, the magnetizations of the free layers 21 and 23 of the GMR element GMR4 return to the initial state (anti-parallel state in FIG. 31) again.

Figure 35A:
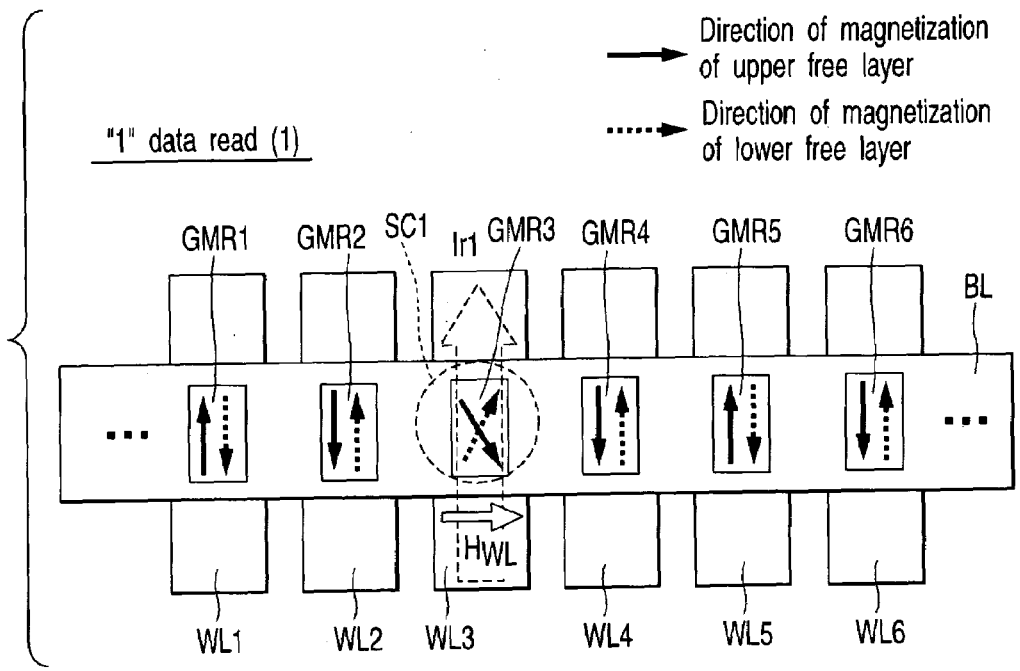
FIGS. 35A and 35B are schematic plan views of cells in the "1" data read according to the second embodiment of the present invention.
Figure 35B:
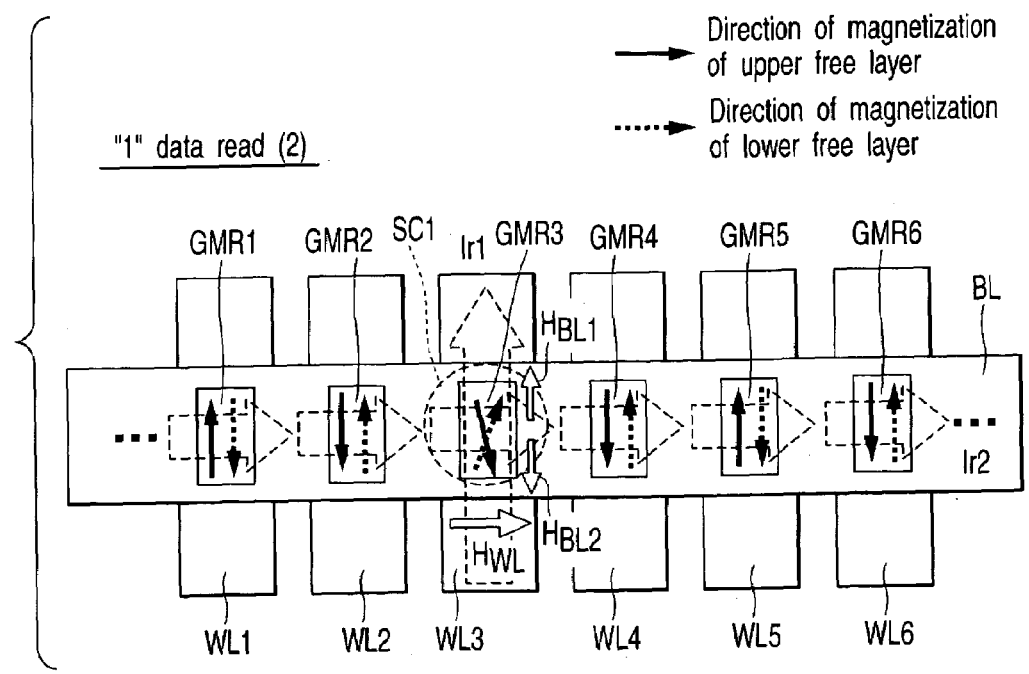

FIGS. 35A and 35B are schematic plan views of cells in the "1" data read according to the second embodiment of the present invention. The "1" data read operation will be described below with reference to FIGS. 35A and 35B.

As shown in FIG. 35A, the word line WL3 is selected. The first read current Ir1 is supplied to the word line WL3. The magnetic field $H_{WL}$ generated by the first read current Ir1 is applied to the GMR element GMR3. As a result, the magnetizations of the free layers 21 and 23 of the GMR element GMR3 rotate halfway so that the magnetizations of the free layers 21 and 23 start turning to the direction of the applied field $H_{WL}$.

As shown in FIG. 35B, the second read current Ir2 is supplied from the bit line BL to the read line RL. The magnetic field $H_{BL}$ generated by the second read current Ir2 when it passes through the conductive layer 22 of the GMR element is applied to the GMR element GMR3. The magnetic field $H_{BL}$ ($H_{BL1}$) acts on the upper free layer 23 downward on the drawing surface (to the near side on the drawing surface of FIG. 33). The magnetic field $H_{BL}$ ($H_{BL2}$) acts on the lower free layer 21 upward on the drawing surface (to the far side on the drawing surface of FIG. 33). As a result, the magnetization of the upper free layer 23 starts turning to the direction of the applied field $H_{BL}$ ($H_{BL1}$) (downward on the drawing surface). The magnetization of the lower free layer 21 starts turning to the direction of the applied field $H_{BL}$ ($H_{BL2}$) (upward on the drawing surface). Hence, the magnetizations of the two free layers start returning to the initial state (anti-parallel state in FIG. 32).

In the read, the magnetization state of a selected cell SC1 rarely changes from the magnetization state of an unselected cell. Hence, the resistance value of the GMR element GMR3 almost equals that of the GMR element of an unselected cell. For this reason, even while the first read current Ir1 flows, the resistance value Rgmr of the GMR elements in the whole block rarely changes.

In this way, the change in state of the resistance value Rgmr of the GMR elements in the whole block is read by the second read current Ir2. When the resistance value Rgmr of the GMR elements in the whole block does not change, it can be determined that "1" data is stored in the selected cell SC1. Data discrimination is done by comparing the resistance value Rgmr of the GMR element with the current value of a reference cell to which the first read current Ir1 is not supplied.

When the first read current Ir1 supplied to the word line WL3 is turned off, the magnetizations of the free layers 21 and 23 of the GMR element GMR3 return to the initial state (anti-parallel state in FIG. 32) again.

C) Summary of Write and Read Operations

Figure 36A:
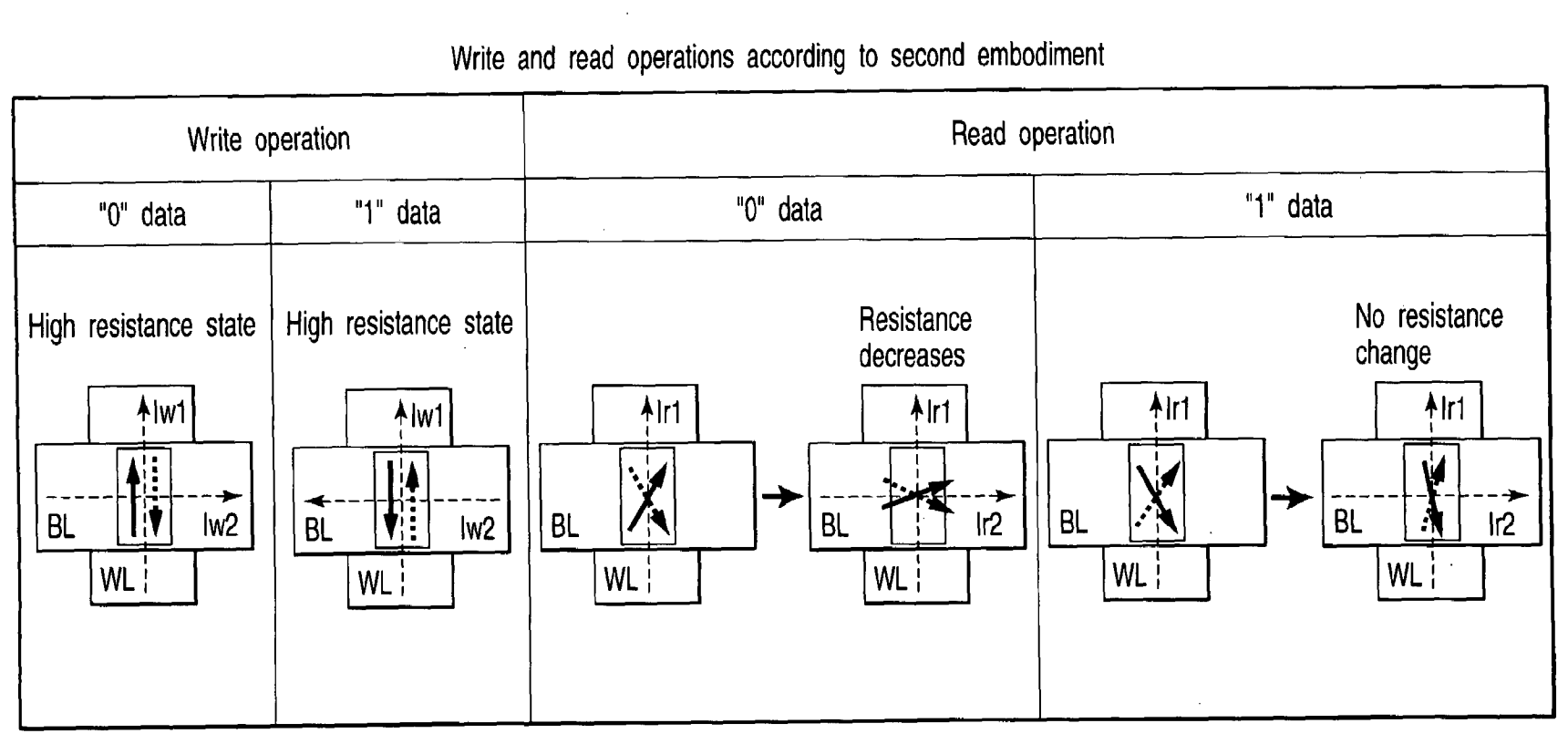
Figure 36B:
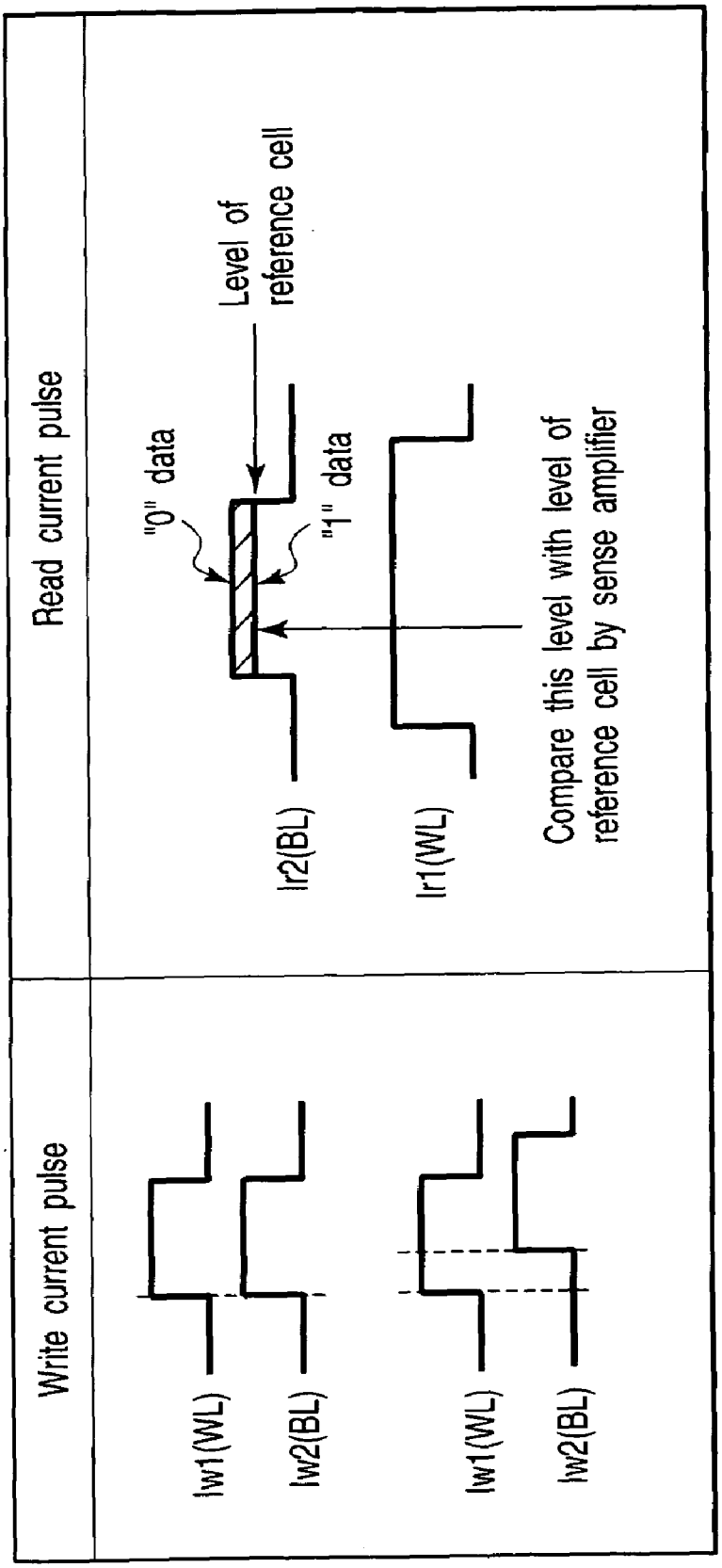
FIG. 36B is a list of write and read current pulses according to the second embodiment of the present invention.

FIG. 36A is a schematic list of the write and read operations according to the second embodiment of the present invention. FIG. 36B is a list of write and read current pulses according to the second embodiment of the present invention. The write and read operations will be described briefly with reference to FIGS. 36A and 36B.

(Write Operation)

A biaxial write using the bit line BL and word line WL is executed. Binary data is selectively written by changing the direction of the current Iw2 to be supplied to the bit line BL.

As for the supply timings of the write currents Iw1 and Iw2, the write currents Iw1 and Iw2 may be supplied almost simultaneously. Alternatively, the write current Iw1 may be supplied to the word line WL first, and the write current Iw2 may be supplied to the bit line BL next. In the latter case, when magnetization reversal is caused after the asteroid curve is made slightly narrower, the write currents Iw1 and Iw2 can be reduced. In addition, the write operation can be made more stable, and write errors can be prevented.

(Read Operation)

Discrimination between "1" and "0" data is done by determining whether the resistance of the GMR element does not change or decreases in the read.

As for the supply timings of the read currents Ir1 and Ir2, the read current Ir1 is supplied to the word line WL first, and in this state, the read current Ir2 is supplied to the bit line BL. Data is read by comparing the level (current value) of the current Ir2 with the level (current value) of the reference cell by a sense amplifier.

[2-4] Effect

According to the above-described second embodiment, in the ladder structure in which the plurality of GMR elements are connected in parallel, in the data read, the first read current Ir1 is supplied to the word line WLn corresponding to a selected cell SC to apply a magnetic field to the GMR element of the selected cell SC. In this state, the second read current Ir2 is supplied from the bit line BL to the read line RL to further apply a magnetic field to the GMR element of the selected cell SC. The current value of the second read current Ir2 is compared with the current value of the reference cell to which the first read current Ir1 is not supplied. Depending on whether the resistance value of the GMR element does not change or decreases, discrimination between "1" and "0" data can be done.

As described above, in the second embodiment, the memory cells have the ladder structure. Hence, the density of the cells can be increased. Simultaneously, the read operation speed can be increased by executing the data read in one cycle.

In this embodiment, even in a cross-point cell structure like a ladder structure, cells except a selected cell have the same resistance value. The sense operation of a normal DRAM memory cell can also be executed in which, e.g., a reference cell block is prepared, and a selected bit line is compared with a reference bit line by a sense amplifier. Hence, the read can be executed at higher speed.

[3] Third Embodiment

In the third embodiment, a ladder-shaped magnetic random access memory using GMR elements will be described, as in the second embodiment. In the GMR element of the second embodiment, the conductive layer is sandwiched between two free layers. In the GMR element of the third embodiment, however, the conductive layer is sandwiched between a free layer and a fixed layer.

[3-1] Structure

Figure 37:
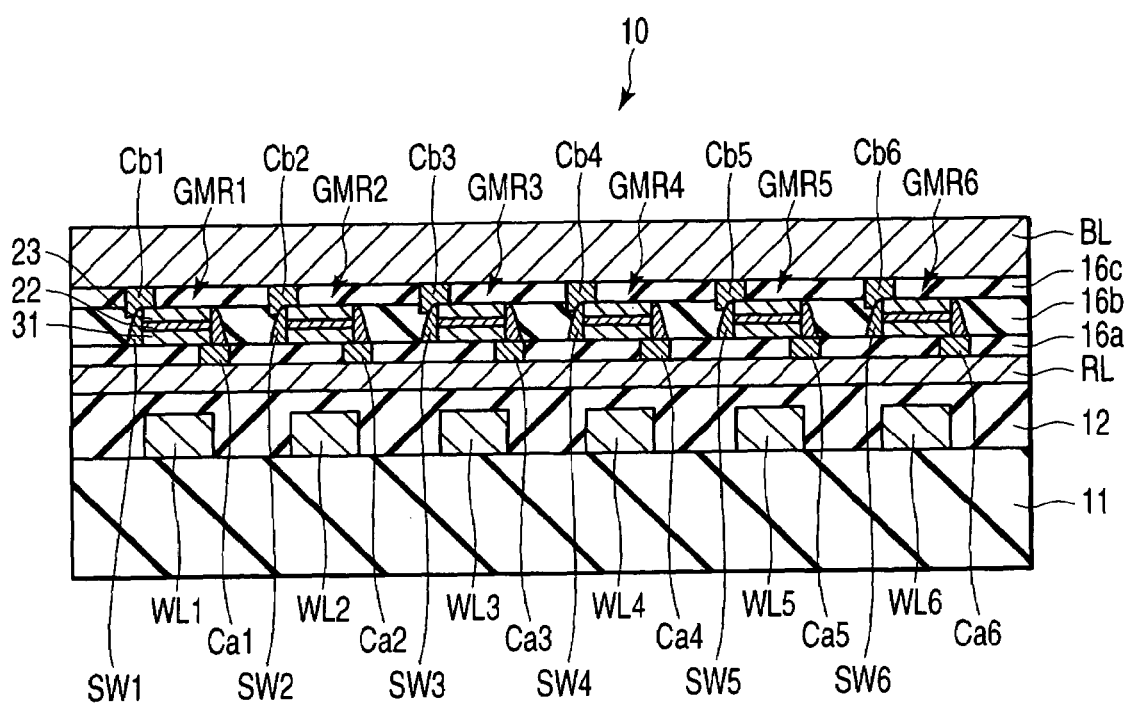
FIG. 37 is a sectional view showing a magnetic random access memory according to the third embodiment of the present invention.

FIG. 37 is a sectional view of a magnetic random access memory according to the third embodiment. As shown in FIG. 37, in the third embodiment, the lower free layer of the GMR element of the second embodiment is replaced with a fixed layer 31. Hence, the GMR element includes the fixed layer 31, a free layer 23, and a conductive layer 22 sandwiched between the fixed layer 31 and the free layer 23. The remaining structure is the same as in the second embodiment, and a description thereof will be omitted.

[3-2] Manufacturing Method

The manufacturing method according to the third embodiment is the same as that of the above-described second embodiment except that the free layer 21 is changed to the fixed layer 31, and a description thereof will be omitted.

[3-3] Write and Read Operations

The write and read operations of the magnetic random access memory according to the third embodiment will be described below.

Each GMR element is arranged such that the direction of axis of easy magnetization of the GMR element is almost parallel to the running direction of a word line WL, and the direction of axis of hard magnetization of the GMR element is almost parallel to the running direction of a bit line BL. The free layer 23 of the GMR element is arranged on the conductive layer 22.

A) Write Operation

Figure 38:
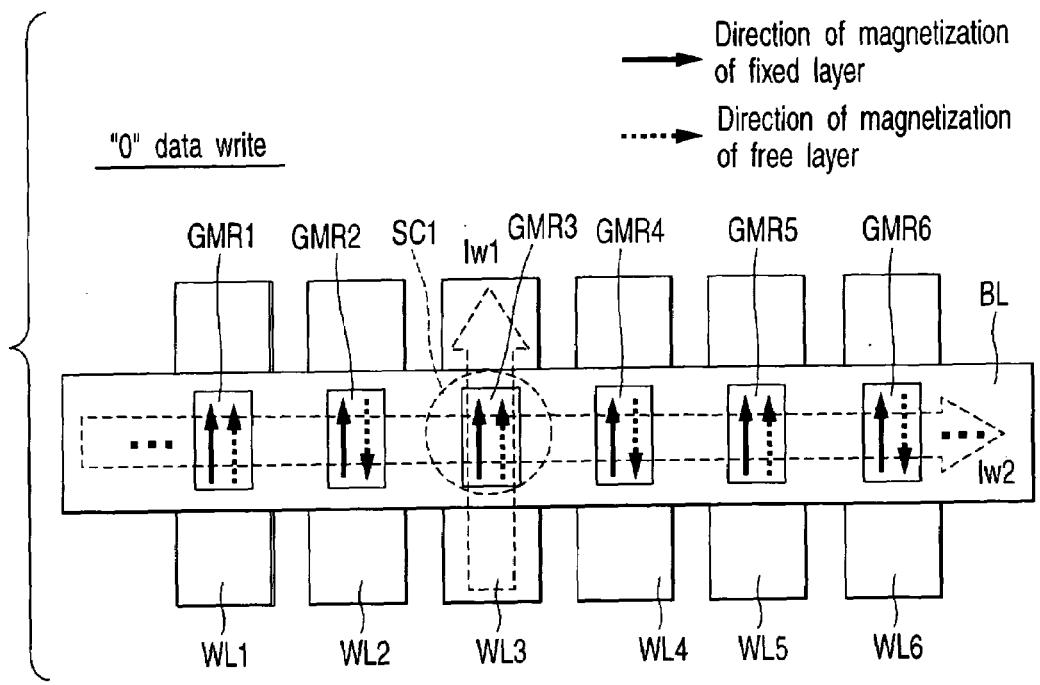
FIG. 38 is a schematic plan view of cells in the "0" data write according to the third embodiment of the present invention.

FIG. 38 is a schematic plan view of cells in the "0" data write according to the third embodiment of the present invention. The "0" data write operation will be described below.

A word line WL3 and bit line BL are selected. First and second write currents Iw1 and Iw2 are supplied to the word line WL3 and bit line BL, respectively. A synthetic field generated by the first and second write currents Iw1 and Iw2 is applied to a GMR element GMR3 located at the cross point between the word line WL3 and the bit line BL. As a result, the magnetization directions of the fixed layer 31 and free layer 23 of the GMR element GMR3 become parallel to each other, and data is written in the GMR element GMR3. The state in which the magnetization directions are parallel is defined as a state in which "0" data is written.

Figure 39:
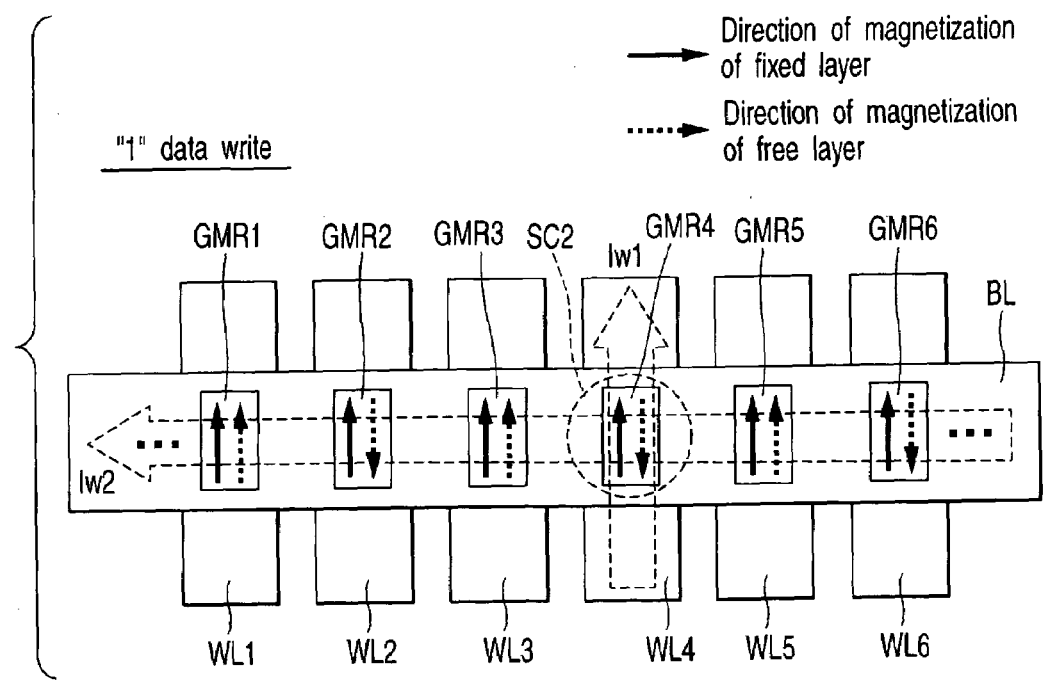
FIG. 39 is a schematic plan view of cells in the "1" data write according to the third embodiment of the present invention.

FIG. 39 is a schematic plan view of cells in the "1" data write according to the third embodiment of the present invention. The "1" data write operation will be described below.

A word line WL4 and bit line BL are selected. The first and second write currents Iw1 and Iw2 are supplied to the word line WL4 and bit line BL, respectively. A synthetic field generated by the first and second write currents Iw1 and Iw2 is applied to a GMR element GMR4 located at the cross point between the word line WL4 and the bit line BL. As a result, the magnetization directions of the fixed layer 31 and free layer 23 of the GMR element GMR4 become anti-parallel to each other, and data is written in the GMR element GMR4. The state in which the magnetization directions are anti-parallel is defined as a state in which "1" data is written.

In the example of this embodiment in which the magnetization of the fixed layer 31 is fixed upward on the drawing surface, to write "0" data, the second write current Iw2 is supplied to the bit line BL from the left to the right on the drawing surface (FIG. 38). To write "1" data, the second write current Iw2 is supplied to the bit line BL from the right to the left on the drawing surface (FIG. 39). When the second write current Iw2 is supplied in reverse direction in the above-described ways, binary data can selectively be written. The first write current Iw1 can be supplied to the word lines WL3 and WL4 either from the lower side to the upper side or from the upper side to the lower side on the drawing surface.

B) Read Operation

Figure 40:
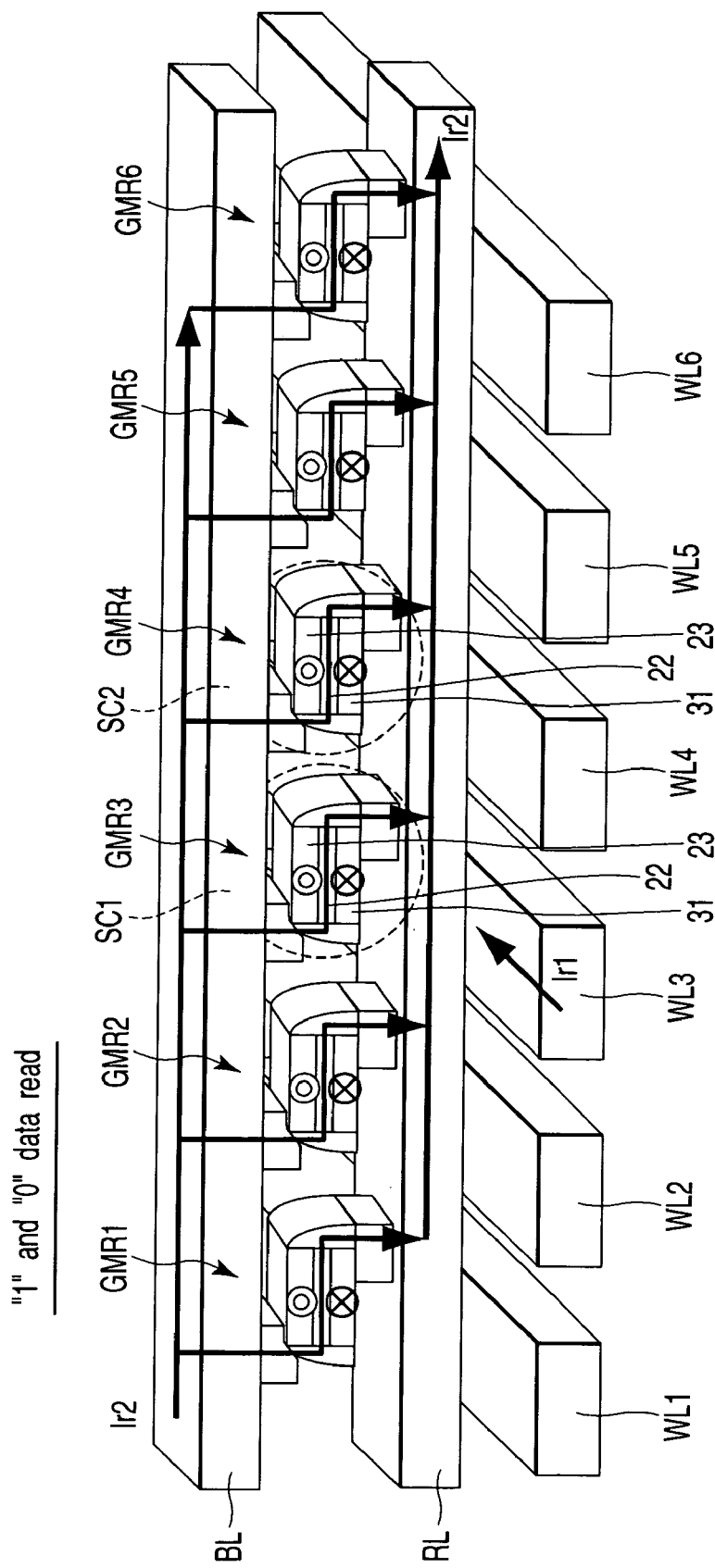
FIG. 40 is a schematic perspective view of the magnetic random access memory in the "1" and "0" data read according to the third embodiment of the present invention.

FIG. 40 is a schematic perspective view of the magnetic random access memory in the "1" and "0" data read according to the third embodiment of the present invention.

As shown in FIG. 40, in the read operation according to the third embodiment, a first read current Ir1 is supplied to a word line WLn corresponding to a selected cell SCn. In addition, a second read current Ir2 to read the resistance value of the selected cell SCn is supplied from the bit line BL to a read line RL. In the third embodiment, the magnetic field generated by the second read current Ir2 is also applied to the selected cell SCn, as in the second embodiment. In the second embodiment, both the magnetizations of the magnetic layers sandwiching the conductive layer react to the magnetic field. In the third embodiment, however, only the magnetization of one (free layer) of the magnetic layers sandwiching the conductive layer reacts. A change in resistance value in a GMR element GMRn is read from a change in second read current Ir2 in the first read current Ir1 supplying state, thereby discriminating between "1" and "0" data.

Figure 41A:
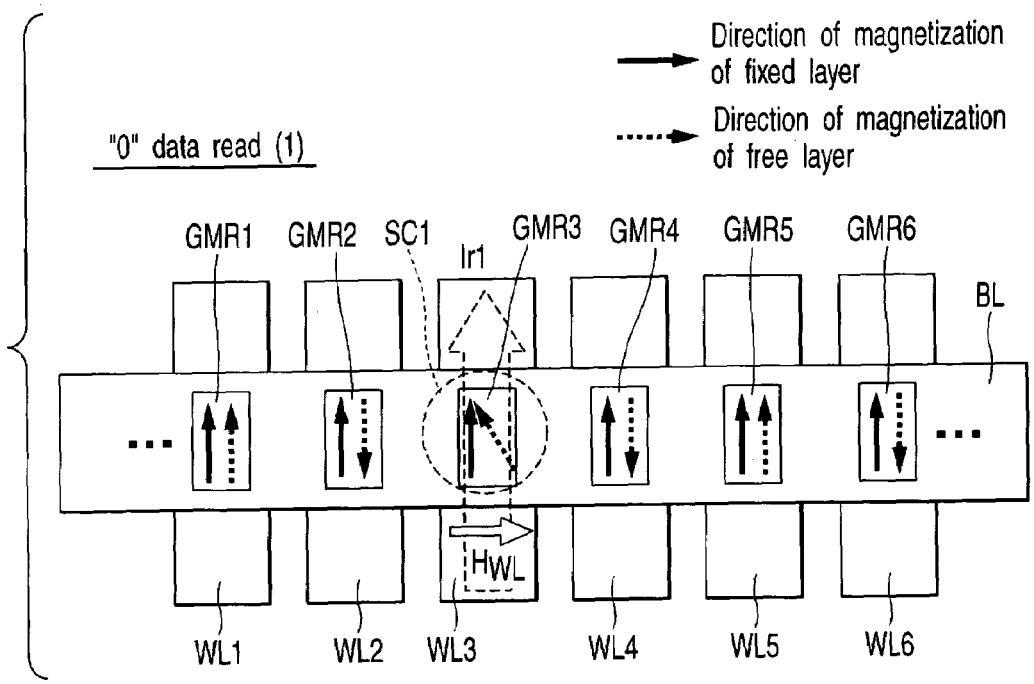
FIGS. 41A and 41B are schematic plan views of cells in the "0" data read according to the third embodiment of the present invention.
Figure 41B:
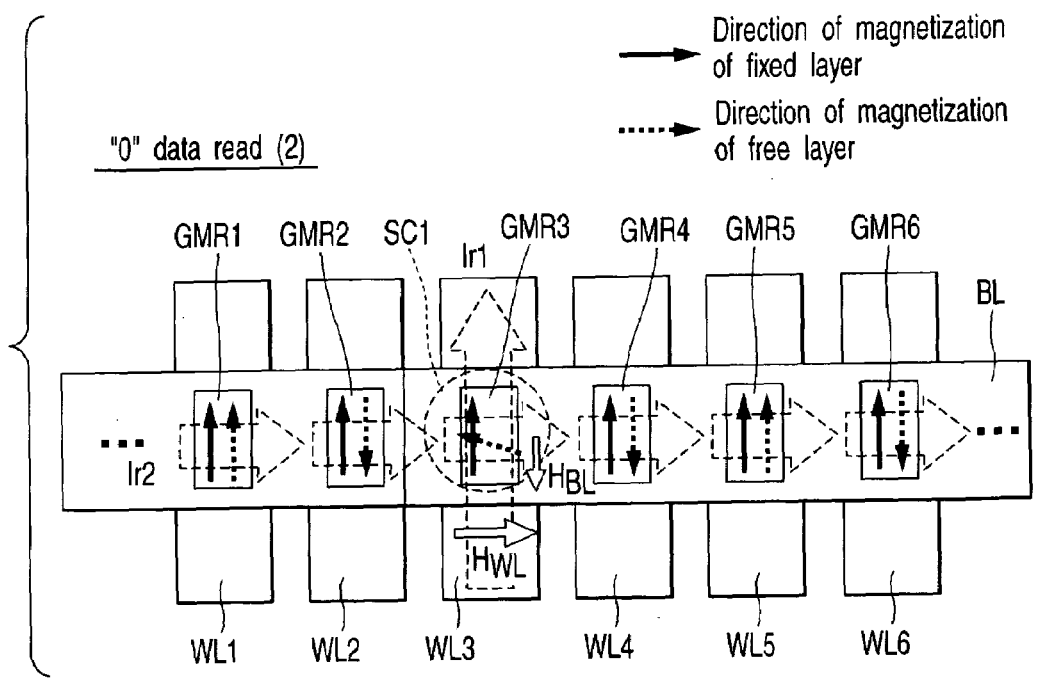

FIGS. 41A and 41B are schematic plan views of cells in the "0" data read according to the third embodiment of the present invention. The "0" data read operation will be described below with reference to FIGS. 41A and 41B.

As shown in FIG. 41A, the word line WL3 is selected. The first read current Ir1 is supplied to the word line WL3. A magnetic field $H_{WL}$ generated by the first read current Ir1 is applied to the GMR element GMR3. As a result, only the magnetization of the free layer 23 of the GMR element GMR3 reacts by the magnetic field $H_{WL}$ and rotates halfway.

As shown in FIG. 41B, the second read current Ir2 is supplied from the bit line BL to the read line RL. A magnetic field $H_{BL}$ generated by the second read current Ir2 when it passes through the conductive layer 22 of the GMR element is applied to the GMR element GMR3. The magnetic field $H_{BL}$ acts on the free layer 23 downward on the drawing surface (to the near side on the drawing surface of FIG. 40). As a result, the magnetization of the free layer 23 further rotates.

Before the read, the magnetization of the GMR element GMR3 is in the parallel state. However, while the first read current Ir1 flows, the magnetization of the GMR element GMR3 is not in the parallel state (the magnetizations of the fixed layer 31 and free layer 23 tilt from the parallel state). Since the parallel state with the lowest resistance is lost in the GMR element GMR3, the resistance value of the GMR element GMR3 increases. For this reason, only while the first read current Ir1 flows, a resistance value Rgmr of the GMR elements in the whole block increases.

In this way, the change in state of the resistance value Rgmr of the GMR elements in the whole block is read by the second read current Ir2. When the resistance value Rgmr of the GMR elements in the whole block increases, it can be determined that "0" data is stored in a selected cell SC1.

When the first read current Ir1 supplied to the word line WL3 is turned off, the magnetization of the free layer 23 of the GMR element GMR3 returns to the initial state (parallel state in FIG. 38) again.

Figure 42A:
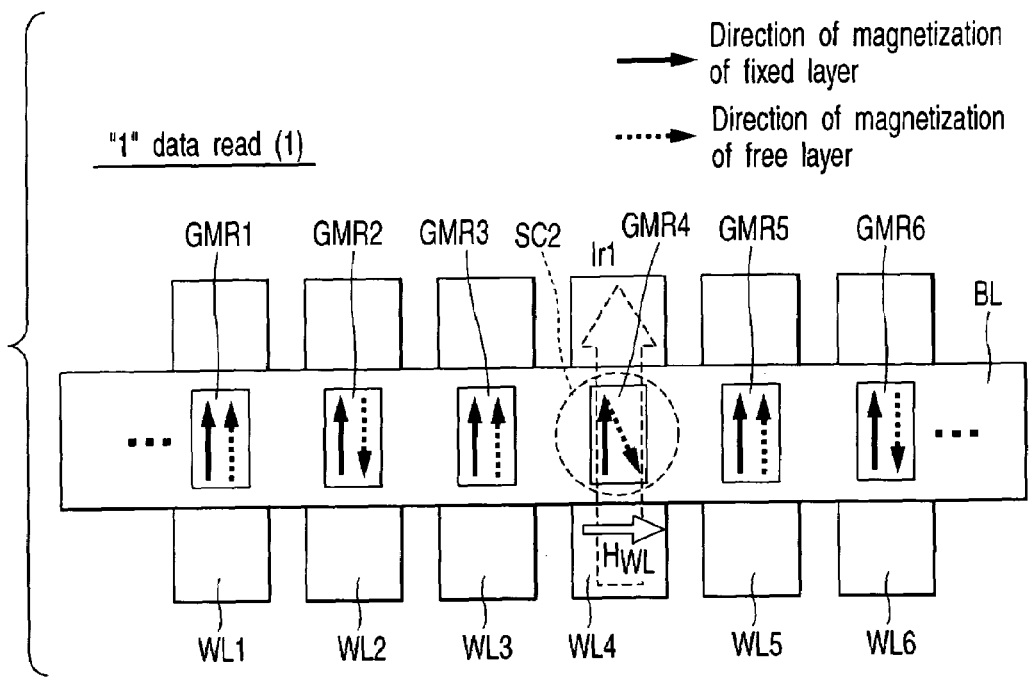
FIGS. 42A and 42B are schematic plan views of cells in the "1" data read according to the third embodiment of the present invention.
Figure 42B:
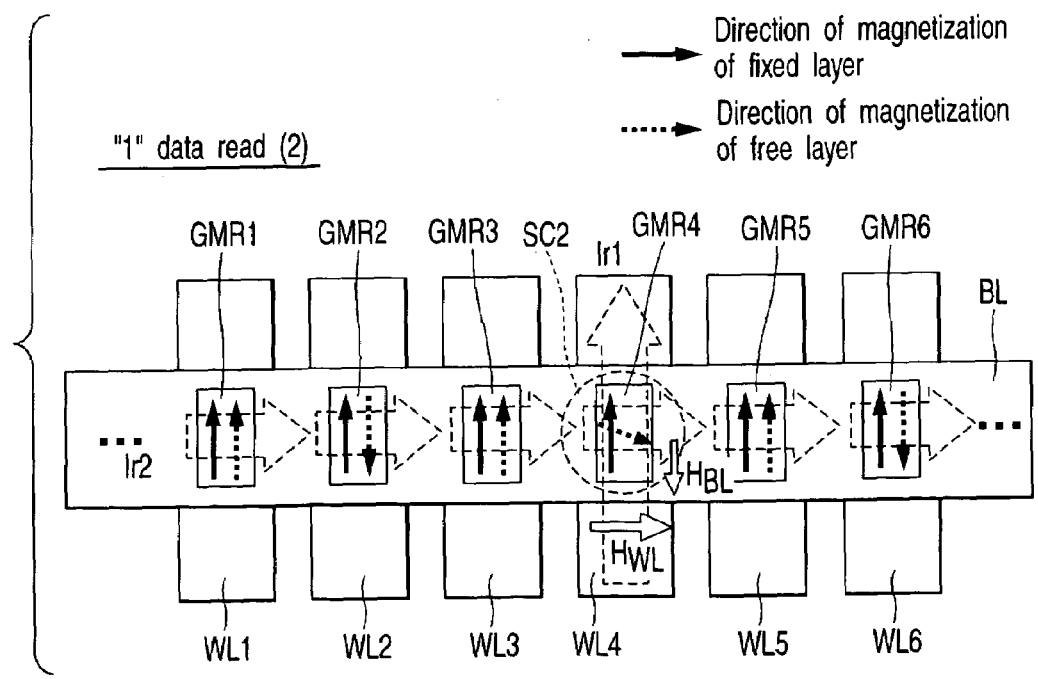

FIGS. 42A and 42B are schematic plan views of cells in the "1" data read according to the third embodiment of the present invention. The "1" data read operation will be described below with reference to FIGS. 42A and 42B.

As shown in FIG. 42A, the word line WL4 is selected. The first read current Ir1 is supplied to the word line WL4. The magnetic field $H_{WL}$ generated by the first read current Ir1 is applied to the GMR element GMR4. As a result, only the magnetization of the free layer 23 of the GMR element GMR4 reacts by the magnetic field $H_{WL}$ and rotates halfway.

As shown in FIG. 42B, the second read current Ir2 is supplied from the bit line BL to the read line RL. The magnetic field $H_{BL}$ generated by the second read current Ir2 when it passes through the conductive layer 22 of the GMR element is applied to the GMR element GMR4. The magnetic field $H_{BL}$ acts on the free layer 23 downward on the drawing surface (to the near side on the drawing surface of FIG. 40). As a result, the magnetization of the free layer 23 rotates.

Before the read, the magnetization of the GMR element GMR4 is in the anti-parallel state. In the read, however, the magnetization of the GMR element GMR4 is not in the anti-parallel state. Since the anti-parallel state with the highest resistance is lost in the GMR element GMR4, the resistance value of the GMR element GMR4 decreases. For this reason, only while the first read current Ir1 flows, the resistance value Rgmr of the GMR elements in the whole block decreases.

In this way, the change in state of the resistance value Rgmr of the GMR elements in the whole block is read by the second read current Ir2. When the resistance value Rgmr of the GMR elements in the whole block decreases, it can be determined that "1" data is stored in a selected cell SC2.

When the first read current Ir1 supplied to the word line WL4 is turned off, the magnetization of the free layer 23 of the GMR element GMR4 returns to the initial state (anti-parallel state in FIG. 39) again.

C) Summary of Write and Read Operations

Figure 43:
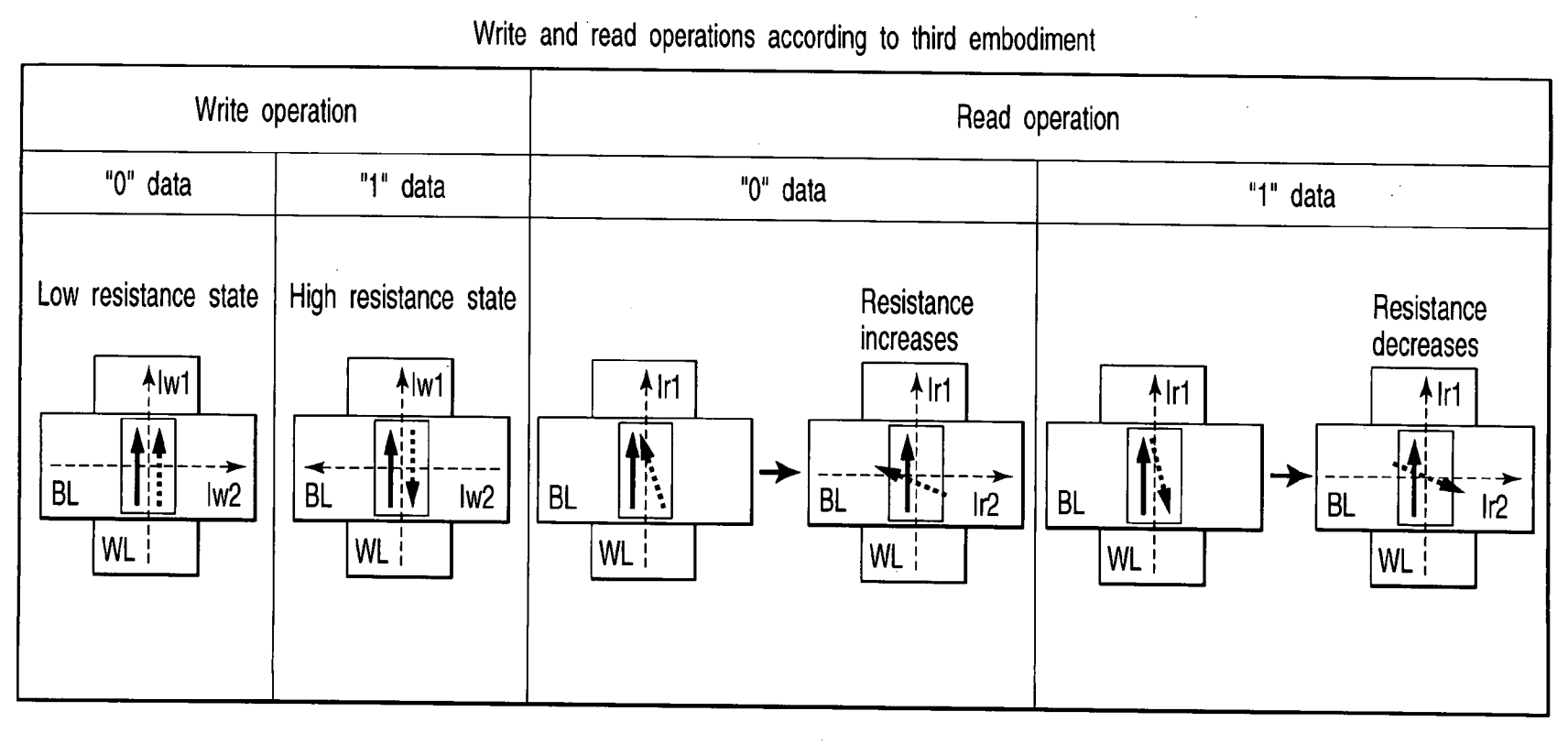

FIG. 43 is a schematic list of the write and read operations according to the third embodiment of the present invention. The write and read operations will be described briefly with reference to FIG. 43.

(Write Operation)

A biaxial write using the bit line BL and word line WL is executed. Binary data is selectively written by changing the direction of the current Iw2 to be supplied to the bit line BL.

As for the supply timings of the write currents Iw1 and Iw2, the write currents Iw1 and Iw2 may be supplied almost simultaneously. Alternatively, the write current Iw1 may be supplied to the word line WL first, and the write current Iw2 may be supplied to the bit line BL next. In the latter case, when magnetization reversal is caused after the asteroid curve is made slightly narrower, the write currents Iw1 and Iw2 can be reduced. In addition, the write operation can be made more stable, and any write error can be prevented.

(Read Operation)

Discrimination between "1" and "0" data is done by determining whether the resistance of the GMR element decreases or increases in the read.

As for the supply timings of the read currents Ir1 and Ir2, the read current Ir2 is supplied to the bit line BL first, and in this state, the read current Ir1 is supplied to the word line WL. The difference between the current Ir2 when the read current Ir1 is supplied to the word line WL and that when the read current Ir1 is not supplied is read. Since the magnetic field generated by the current Ir2 is very weak, the influence of the magnetic field on the magnetization of the free layer can be neglected.

[3-4] Effect

According to the above-described third embodiment, in the ladder structure in which the plurality of GMR elements are connected in parallel, in the data read, the first read current Ir1 is supplied to the word line WLn corresponding to a selected cell SC to apply a magnetic field to the GMR element of the selected cell SC. In this state, the second read current Ir2 is supplied from the bit line BL to the read line RL to further apply a magnetic field to the GMR element of the selected cell SC. The difference between the current Ir2 when the first read current Ir1 is supplied to the word line WLn and that when the first read current Ir1 is not supplied is read. Depending on whether the resistance value of the GMR element decreases or increases, discrimination between "1" and "0" data can be done.

As described above, in the third embodiment, the memory cells have the ladder structure. Hence, the density of the cells can be increased. Simultaneously, the read operation speed can be increased by executing the data read in one cycle.

[4] Fourth Embodiment

In the fourth embodiment, a cross-point magnetic random access memory using MTJ elements will be described.

[4-1] Structure

Figure 44:
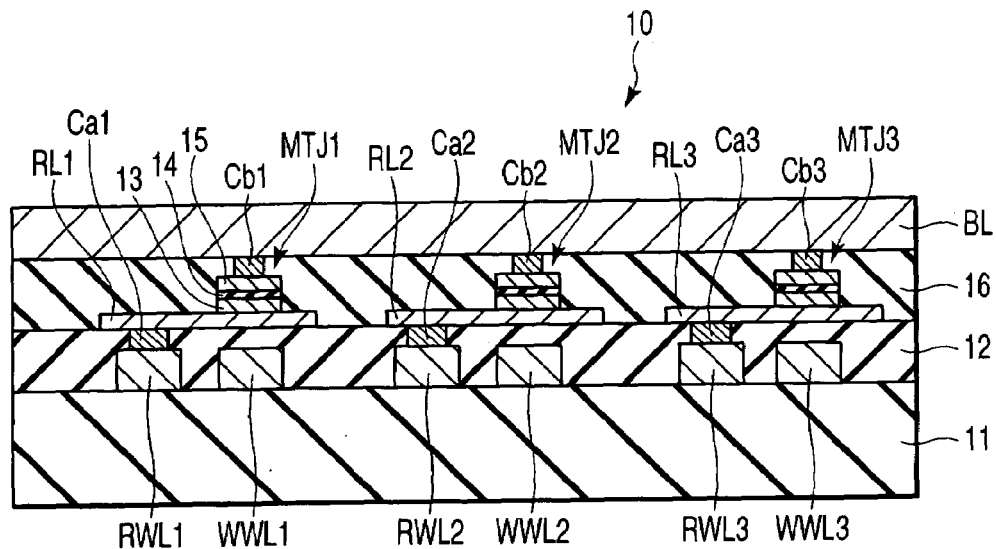
FIG. 44 is a sectional view showing a magnetic random access memory according to the fourth embodiment of the present invention.

FIG. 44 is a sectional view of a magnetic random access memory according to the fourth embodiment of the present invention. FIG. 44 shows part of a block 10 using a common bit line in the memory cell array. The structure of the magnetic random access memory according to the fourth embodiment of the present invention will be described below.

As shown in FIG. 44, bit lines BL and word lines WWLn and RWLn are arranged in a matrix so that they cross each other. MTJ elements MTJn are arranged at the intersections of the bit lines BL and the write word lines WWLn. The memory cell of the fourth embodiment is a so-called cross-point cell in which no read switching element is present for each cell. Each word line is divided into the write word line WWLn and read word line RWLn.

Each MTJ element MTJn includes a fixed layer (pinned layer) 13, tunnel barrier layer 14, and free layer 15. The fixed layer 13 of each MTJ element MTJn is connected to the read word line RWLn through a read line RLn and contact Can. The free layer 15 of each MTJ element MTJn is connected to the bit line BL through a contact Cbn. The write word lines WWLn are arranged under the read lines RLn and electrically disconnected from the MTJ elements MTJn.

[4-2] Manufacturing Method

FIGS. 45 to 48 are schematic sectional views showing steps in manufacturing the magnetic random access memory according to the fourth embodiment of the present invention. The method of manufacturing the magnetic random access memory according to the fourth embodiment will be described below.

Figure 45:
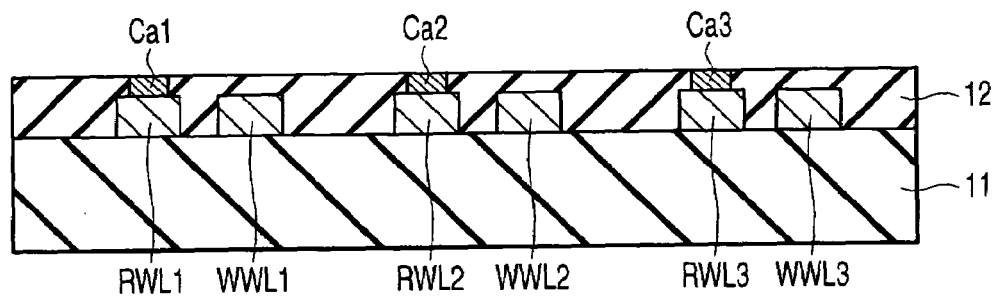

As shown in FIG. 45, a first insulating film 11 is formed on a silicon substrate (not shown). The write and read word lines WWLn and RWLn are formed on the first insulating film 11 by using a normal metal wiring process. The write and read word lines WWLn and RWLn are covered with a second insulating film 12. The upper surface of the second insulating film 12 is planarized by CMP. The contacts Can connected to the read word lines RWLn are formed in the second insulating film 12.

Figure 46:
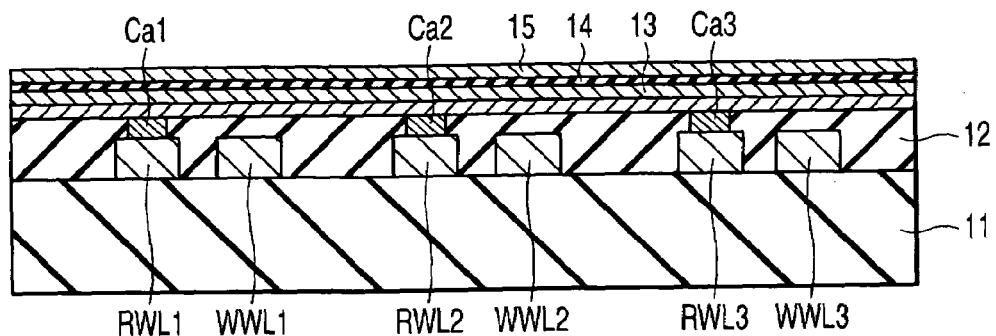

As shown in FIG. 46, the read line RL is formed on the second insulating film 12 and contacts Can. The fixed layer 13, tunnel barrier layer 14, and free layer 15 as the prospective MTJ elements are sequentially deposited on the read line RL.

As shown in FIG. 47, the fixed layer 13, tunnel barrier layer 14, and free layer 15 are patterned by lithography using a normal resist to form the MTJ elements MTJn. After that, the read line RL is patterned and divided into the read lines RLn for the respective cells. Etching to pattern the MTJ elements MTJn may be stopped on the upper surface of the fixed layer 13 or the upper surface of the read line RL.

As shown in FIG. 48, a third insulating film 16 is deposited. The upper surface of the third insulating film 16 is planarized. Via holes are formed in the third insulating film 16 to expose part of the upper surface of each MTJ element MTJn. The via holes are filled with a metal material to form the contacts Cbn connected to the MTJ elements MTJn. Instead of forming the via holes, the insulating film 16 on the MTJ elements MTJn may be removed by resist etch back or CMP to expose only the upper portions of the MTJ elements MTJn.

Next, as shown in FIG. 44, the bit line BL is formed on the third insulating film 16 and contacts Cbn by using a normal metal wiring process. In this way, the cross-point magnetic random access memory is completed.

[4-3] Write and Read Operations

The write and read operations of the magnetic random access memory according to the fourth embodiment will be described below for each of a bit line easy axis type and word line easy axis type.

[4-3a] Bit Line Easy Axis Type

In the bit line easy axis type, the direction of the magnetic field generated by the bit line current turns to the direction of axis of easy magnetization of the MTJ element. More specifically, the direction of axis of easy magnetization of the MTJ element is almost parallel to the running direction of the write word line WWL. The direction of axis of hard magnetization of the MTJ element is almost parallel to the running direction of the bit line BL.

A) Write Operation

Figure 49:
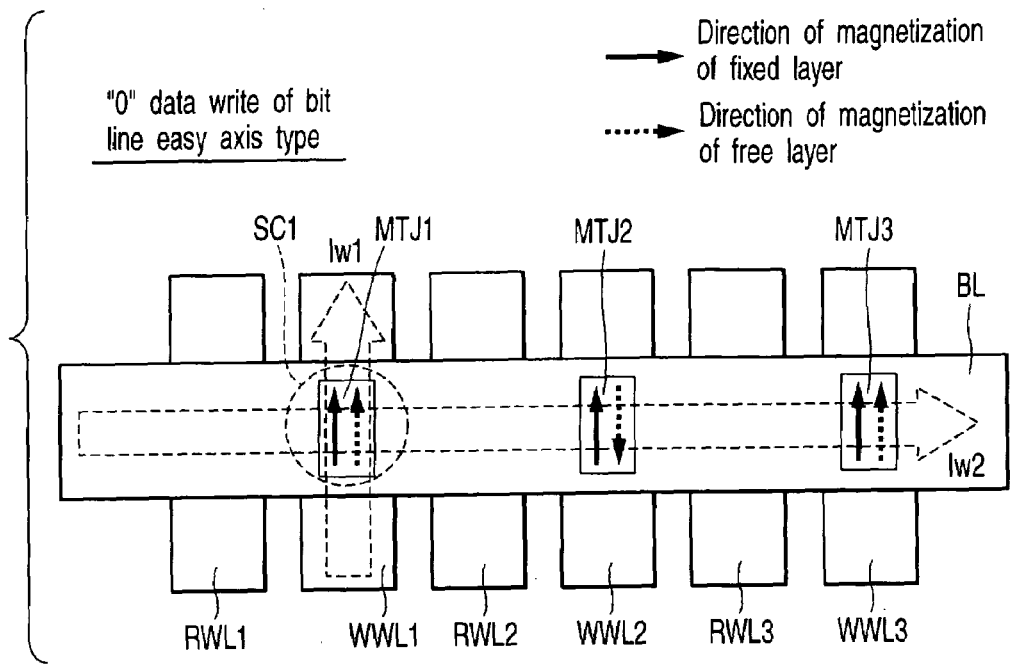
FIG. 49 is a schematic plan view of cells in the "0" data write of a bit line easy axis type according to the fourth embodiment of the present invention.

FIG. 49 is a schematic plan view of cells in the "0" data write of the bit line easy axis type according to the fourth embodiment of the present invention. The "0" data write operation of the bit line easy axis type will be described below.

A write word line WWL1 and bit line BL are selected. First and second write currents Iw1 and Iw2 are supplied to the write word line WWL1 and bit line BL, respectively. A synthetic field generated by the first and second write currents Iw1 and Iw2 is applied to an MTJ element MTJ1 located at the cross point between the write word line WWL1 and the bit line BL. As a result, the magnetization directions of the fixed layer 13 and free layer 15 of the MTJ element MTJ1 become parallel to each other, and data is written in the MTJ element MTJ1. The state in which the magnetization directions are parallel is defined as a state in which "0" data is written.

Figure 50:
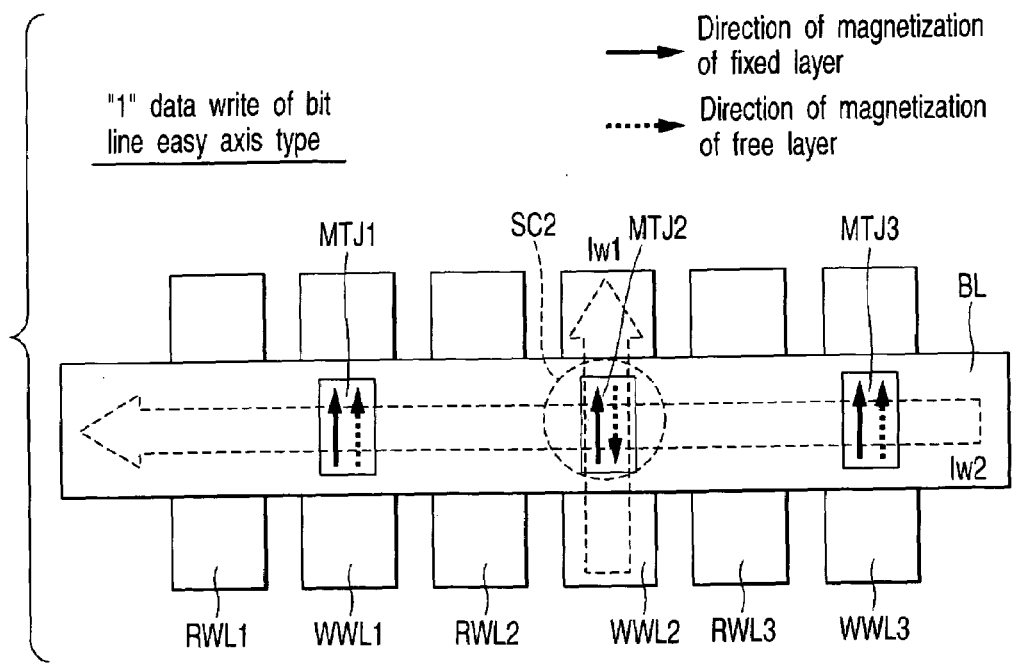
FIG. 50 is a schematic plan view of cells in the "1" data write of the bit line easy axis type according to the fourth embodiment of the present invention.

FIG. 50 is a schematic plan view of cells in the "1" data write of the bit line easy axis type according to the fourth embodiment of the present invention. The "1" data write operation of the bit line easy axis type will be described below.

A write word line WWL2 and bit line BL are selected. The first and second write currents Iw1 and Iw2 are supplied to the write word line WWL2 and bit line BL, respectively. A synthetic field generated by the first and second write currents Iw1 and Iw2 is applied to an MTJ element MTJ2 located at the cross point between the write word line WWL2 and the bit line BL. As a result, the magnetization directions of the fixed layer 13 and free layer 15 of the MTJ element MTJ2 become anti-parallel to each other, and data is written in the MTJ element MTJ2. The state in which the magnetization directions are anti-parallel is defined as a state in which "1" data is written.

In the example of this embodiment in which the magnetization of the fixed layer 13 is fixed upward on the drawing surface, to write "0" data, the second write current Iw2 is supplied to the bit line BL from the left to the right on the drawing surface (FIG. 49). To write "1" data, the second write current Iw2 is supplied to the bit line BL from the right to the left on the drawing surface (FIG. 50). When the second write current Iw2 is supplied in reverse directions in the above-described way, binary data can selectively be written. The first write current Iw1 can be supplied to the write word lines WWL1 and WWL2 either from the lower side to the upper side or from the upper side to the lower side on the drawing surface.

B) Read Operation

Figure 51:
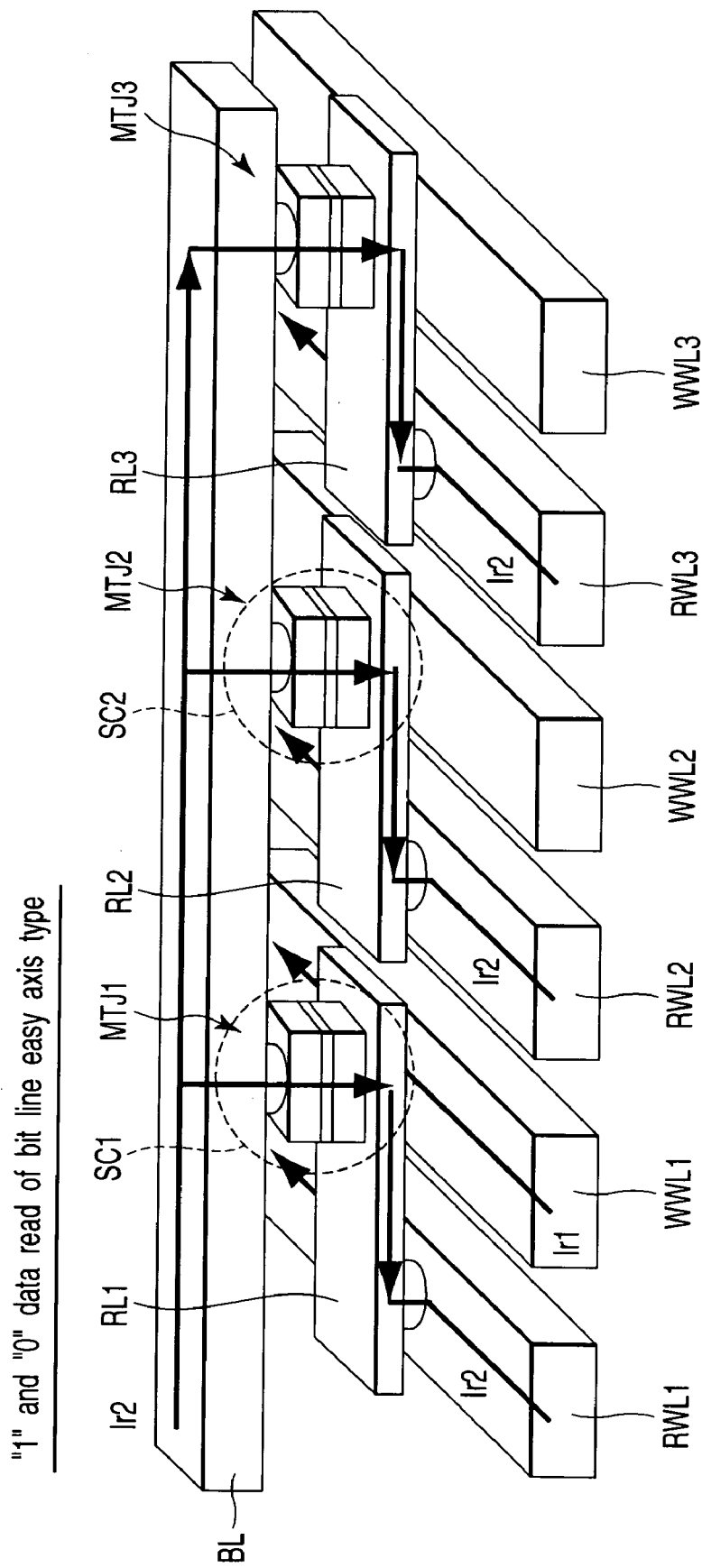
FIG. 51 is a schematic perspective view of the magnetic random access memory in the "1" and "0" data read of the bit line easy axis type according to the fourth embodiment of the present invention.

FIG. 51 is a schematic perspective view of the magnetic random access memory in the "1" and "0" data read of the bit line easy axis type according to the fourth embodiment of the present invention. No sneak current is illustrated in FIG. 51.

As shown in FIG. 51, in the read operation of the bit line easy axis type according to the fourth embodiment, a first read current Ir1 is supplied to the write word line WWLn corresponding to a selected cell SCn while supplying a second read current Ir2 to read the resistance value of the selected cell SCn from the bit line BL to the read line RL. A change in resistance value in the MTJ element MTJn is read from a change in second read current Ir2 in the first read current Ir1 supplying state, thereby discriminating between "1" and "0" data.

Figure 52:
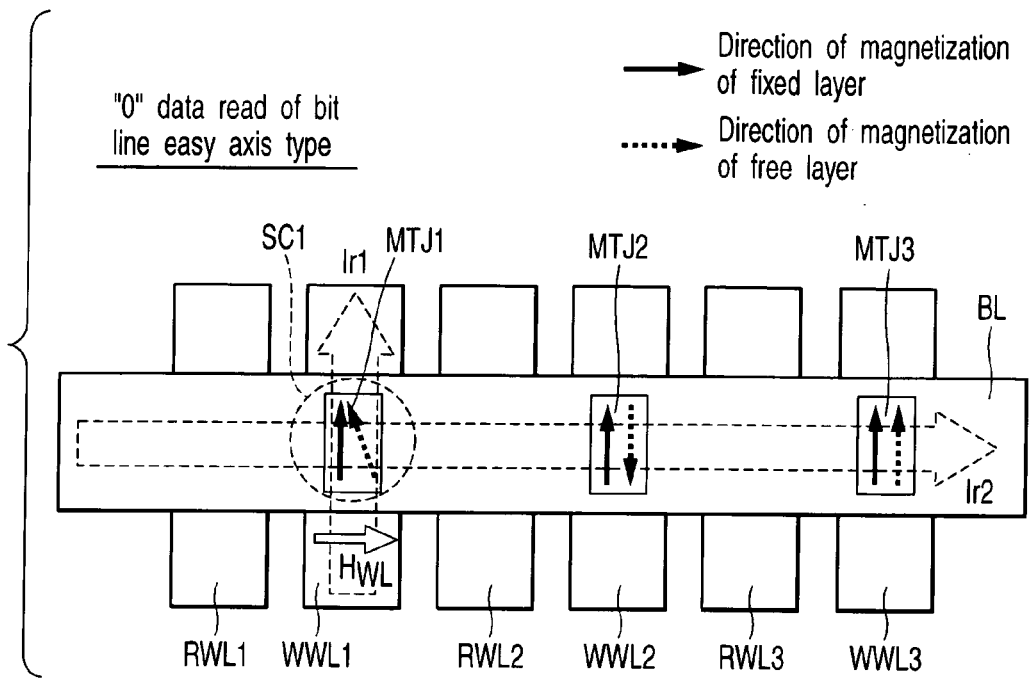
FIG. 52 is a schematic plan view of cells in the "0" data read of the bit line easy axis type according to the fourth embodiment of the present invention.

FIG. 52 is a schematic plan view of cells in the "0" data read of the bit line easy axis type according to the fourth embodiment of the present invention. The "0" data read operation of the bit line easy axis type will be described below with reference to FIG. 52.

The second read current Ir2 is supplied from the bit line BL to the read line RL. After that, when the first read current Ir1 is supplied to the write word line WWL1, a magnetic field $H_{WL}$ generated by the first read current Ir1 is applied to the MTJ element MTJ1. As a result, only the magnetization of the free layer 15 of the MTJ element MTJ1 reacts and rotates halfway. Before the read, the magnetization of the MTJ element MTJ1 is in the parallel state. However, while the first read current Ir1 flows, the magnetization of the MTJ element MTJ1 is not in the parallel state (the magnetizations of the fixed layer 13 and free layer 15 tilt from the parallel state). Since the parallel state with the lowest resistance is lost in the MTJ element MTJ1, the resistance value of the MTJ element MTJ1 increases. For this reason, only while the first read current Ir1 flows, a resistance value Rmtj of the MTJ elements in the whole block increases.

The difference between a current value I when only the second read current Ir2 flows and a current value I' of the second read current Ir2 when the first and second read currents Ir1 and Ir2 flow simultaneously is read. When the current value I' of the second read current Ir2 is smaller than the current value I, i.e., when the resistance value Rmtj of the MTJ elements in the whole block increases, it can be determined that "0" data is stored in a selected cell SC1.

When the first read current Ir1 supplied to the write word line WWL1 is turned off, the magnetization of the free layer 15 of the MTJ element MTJ1 returns to the initial state (parallel state in FIG. 49) again.

Figure 53:
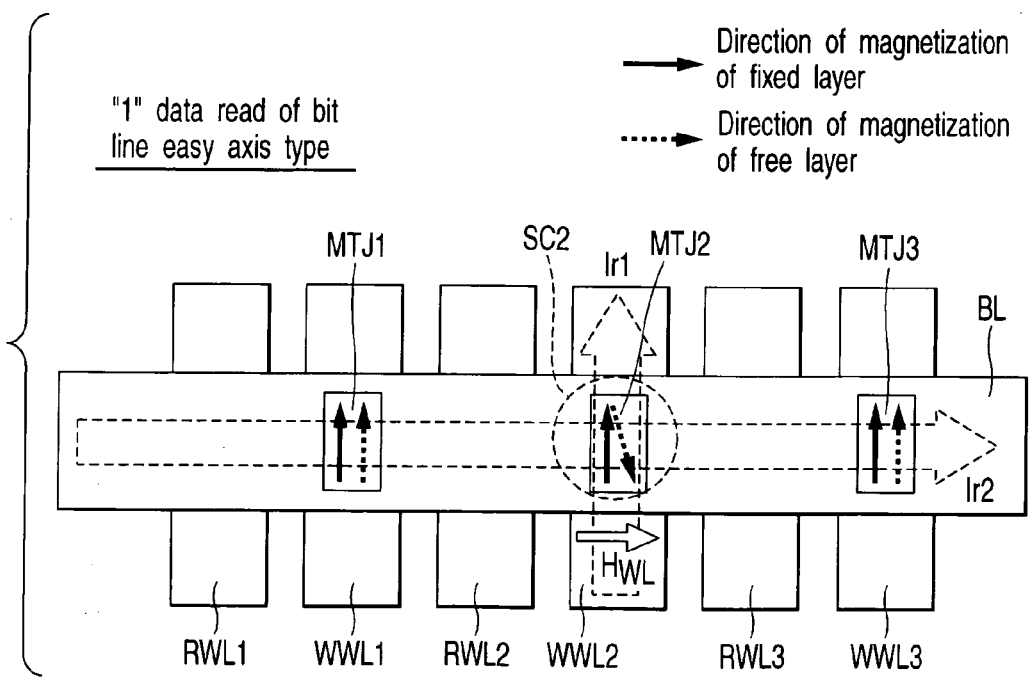
FIG. 53 is a schematic plan view of cells in the "1" data read of the bit line easy axis type according to the fourth embodiment of the present invention.

FIG. 53 is a schematic plan view of cells in the "1" data read of the bit line easy axis type according to the fourth embodiment of the present invention. The "1" data read operation of the bit line easy axis type will be described below with reference to FIG. 53.

The second read current Ir2 is supplied from the bit line BL to the read line RL. After that, when the first read current Ir1 is supplied to the write word line WWL2, the magnetic field $H_{WL}$ generated by the first read current Ir1 is applied to the MTJ element MTJ2. As a result, only the magnetization of the free layer 15 of the MTJ element MTJ2 reacts and rotates halfway. Before the read, the magnetization of the MTJ element MTJ2 is in the anti-parallel state. However, while the first read current Ir1 flows, the magnetization of the MTJ element MTJ2 is not in the anti-parallel state (the magnetizations of the fixed layer 13 and free layer 15 tilt from the anti-parallel state). Since the anti-parallel state with the highest resistance is lost in the MTJ element MTJ2, the resistance value of the MTJ element MTJ2 decreases. For this reason, only while the first read current Ir1 flows, the resistance value Rmtj of the MTJ elements in the whole block decreases.

The difference between the current value I when only the second read current Ir2 flows and the current value I' of the second read current Ir2 when the first and second read currents Ir1 and Ir2 flow simultaneously is read. When the current value I' of the second read current Ir2 is larger than the current value I, i.e., when the resistance value Rmtj of the MTJ elements in the whole block decreases, it can be determined that "1" data is stored in a selected cell SC2.

When the first read current Ir1 supplied to the write word line WWL2 is turned off, the magnetization of the free layer 15 of the MTJ element MTJ2 returns to the initial state (anti-parallel state in FIG. 47) again.

[4-3b] Word Line Easy Axis Type

In the word line easy axis type, the direction of the magnetic field generated by the word line current turns to the direction of axis of easy magnetization of the MTJ element. More specifically, the direction of axis of easy magnetization of the MTJ element is almost parallel to the running direction of the bit line BL. The direction of axis of hard magnetization of the MTJ element is almost parallel to the running direction of the write word line WWL.

A) Write Operation

Figure 54:
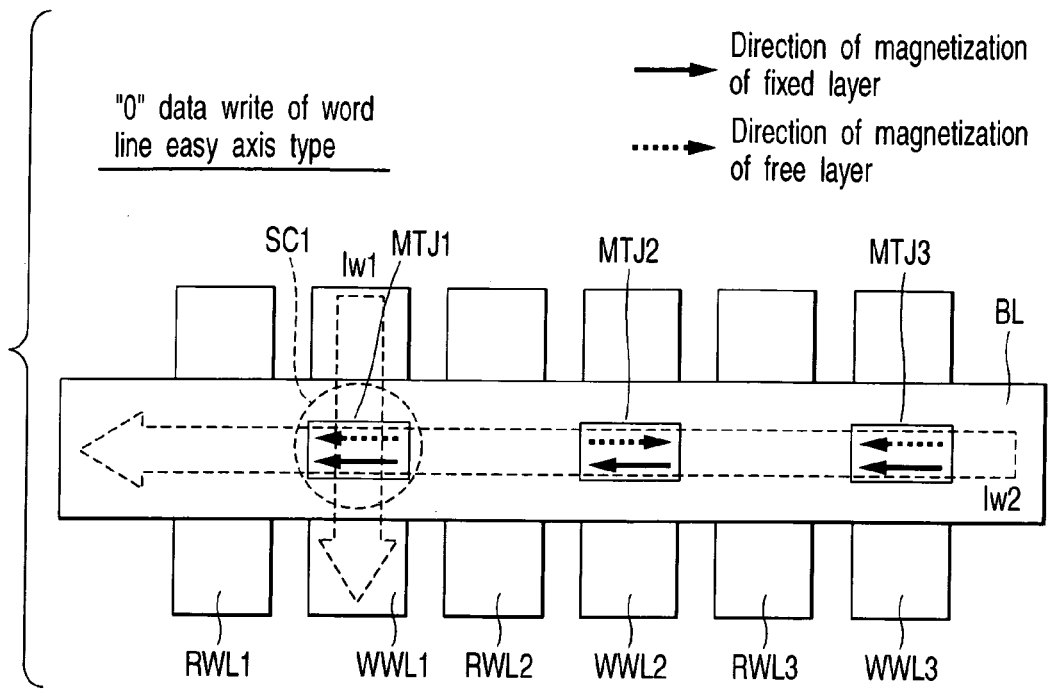
FIG. 54 is a schematic plan view of cells in the "0" data write of a word line easy axis type according to the fourth embodiment of the present invention.

FIG. 54 is a schematic plan view of cells in the "0" data write of the word line easy axis type according to the fourth embodiment of the present invention. The "0" data write operation of the word line easy axis type will be described below.

The write word line WWL1 and bit line BL are selected. The first and second write currents Iw1 and Iw2 are supplied to the write word line WWL1 and bit line BL, respectively. A synthetic field generated by the first and second write currents Iw1 and Iw2 is applied to the MTJ element MTJ1 located at the cross point between the write word line WWL1 and the bit line BL. As a result, the magnetization directions of the fixed layer 13 and free layer 15 of the MTJ element MTJ1 become parallel to each other, and data is written in the MTJ element MTJ1. The state in which the magnetization directions are parallel is defined as a state in which "0" data is written.

Figure 55:
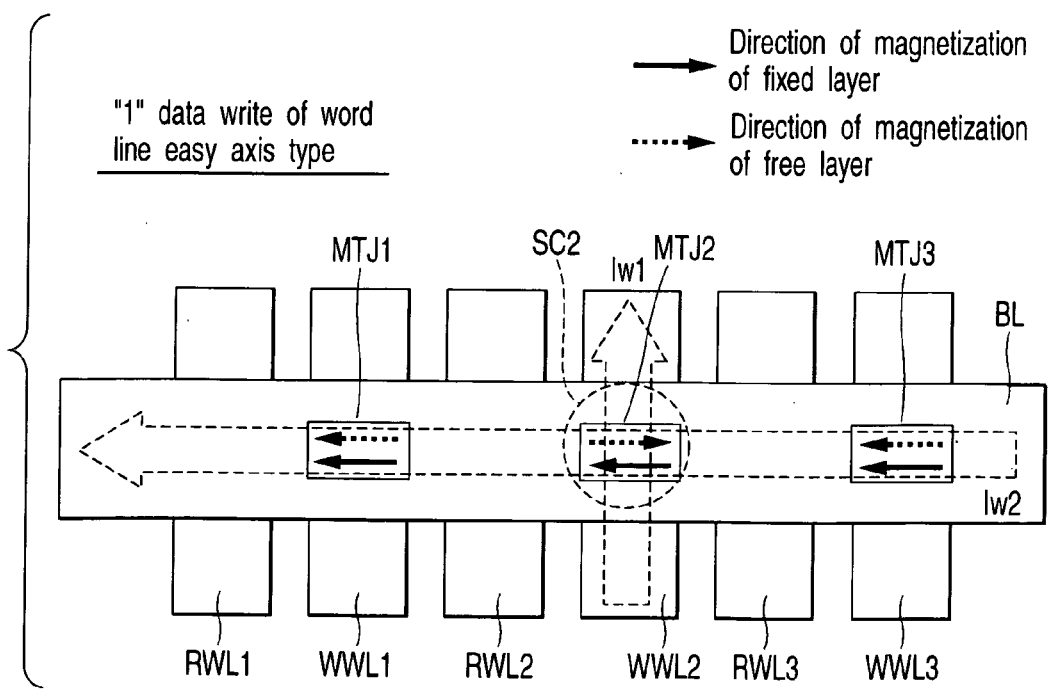
FIG. 55 is a schematic plan view of cells in the "1" data write of the word line easy axis type according to the fourth embodiment of the present invention.

FIG. 55 is a schematic plan view of cells in the "1" data write of the word line easy axis type according to the fourth embodiment of the present invention. The "1" data write operation of the word line easy axis type will be described below.

The write word line WWL2 and bit line BL are selected. The first and second write currents Iw1 and Iw2 are supplied to the write word line WWL2 and bit line BL, respectively. A synthetic field generated by the first and second write currents Iw1 and Iw2 is applied to the MTJ element MTJ2 located at the cross point between the write word line WWL2 and the bit line BL. As a result, the magnetization directions of the fixed layer 13 and free layer 15 of the MTJ element MTJ2 become anti-parallel to each other, and data is written in the MTJ element MTJ2. The state in which the magnetization directions are anti-parallel is defined as a state in which "1" data is written.

In the bit line easy axis type, the direction of the second write current Iw2 to be supplied to the bit line BL is changed in accordance with write data. In the word line easy axis type, the direction of the first write current Iw1 to be supplied to the write word line WWL is changed in accordance with write data. More specifically, in the example of this embodiment in which the magnetization of the fixed layer 13 is fixed leftward on the drawing surface, to write "0" data, the first write current Iw1 is supplied to the write word line WWL from the upper side to the lower side on the drawing surface (FIG. 54). To write "1" data, the first write current Iw1 is supplied to the write word line WWL from the lower side to the upper side on the drawing surface (FIG. 55). When the first write current Iw1 is supplied in reverse directions in the above-described way, binary data can selectively be written. The second write current Iw2 can be supplied to the bit line BL either from the right to the left or from the left to the right on the drawing surface.

B) Read Operation

Figure 56:
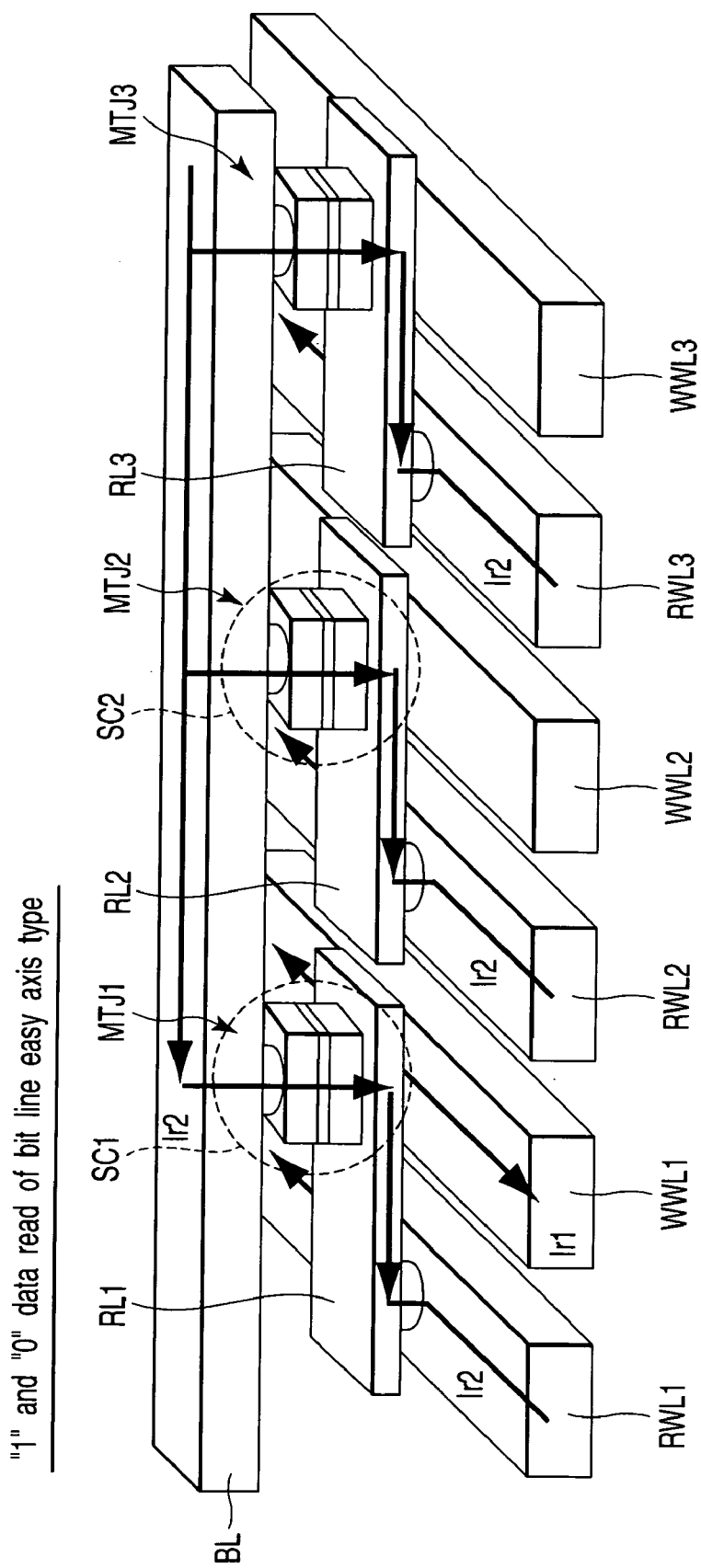
FIG. 56 is a schematic perspective view of the magnetic random access memory in the "1" and "0" data read of the word line easy axis type according to the fourth embodiment of the present invention.

FIG. 56 is a schematic perspective view of the magnetic random access memory in the "1" and "0" data read of the word line easy axis type according to the fourth embodiment of the present invention. No sneak current is illustrated in FIG. 56.

As shown in FIG. 56, in the read operation of the word line easy axis type according to the fourth embodiment, the first read current Ir1 is supplied to the write word line WWLn corresponding to the selected cell SCn while supplying the second read current Ir2 to read the resistance value of the selected cell SCn from the bit line BL to the read line RL. A change in resistance value in the MTJ element MTJn is read from a change in second read current Ir2 in the first read current Ir1 supplying state, thereby discriminating between "1" and "0" data.

In the read operation of this embodiment, discrimination between "1" and "0" data is done on the basis of a change in element resistance R like a type A, B, C, or D shown in FIG. 16, as in the first embodiment. The read operation will be described below in detail.

(Type A)

Figure 57:
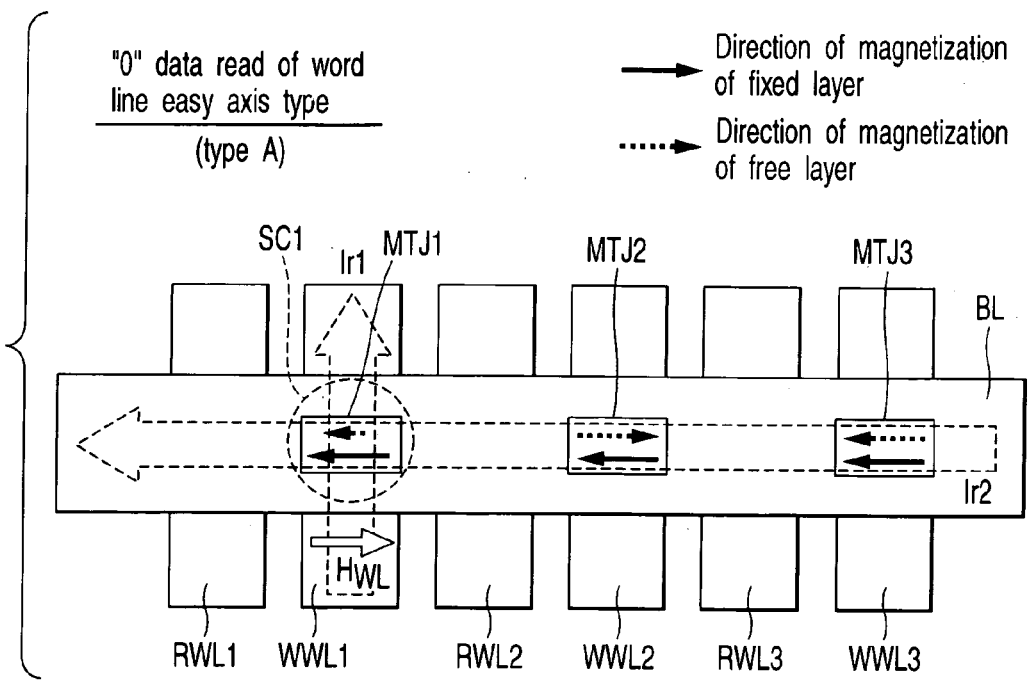
FIG. 57 is a schematic plan view of cells in the "0" data read of type A of the word line easy axis type according to the fourth embodiment of the present invention.

FIG. 57 is a schematic plan view of cells in the "0" data read of type A of the word line easy axis type according to the fourth embodiment of the present invention. The read operation of type A will be described below with reference to FIG. 57.

The second read current Ir2 is supplied from the bit line BL to the read line RL. After that, the first read current Ir1 is supplied to the write word line WWL1 in the "1" data write direction (from the lower side to the upper side on the drawing surface). The magnetic field $H_{WL}$ generated by the first read current Ir1 is applied to the MTJ element MTJ1. As a result, the magnetization of the free layer 15 of the MTJ element MTJ1 becomes small. Since the parallel state with the lowest resistance weakens in the MTJ element MTJ1, the resistance value of the MTJ element MTJ1 increases. For this reason, only while the first read current Ir1 flows, the resistance value Rmtj of the MTJ elements in the whole block increases.

The difference between the current value I when only the second read current Ir2 flows and the current value I' of the second read current Ir2 when the first and second read currents Ir1 and Ir2 flow simultaneously is read. When the current value I' of the second read current Ir2 is smaller than the current value I, i.e., when the resistance value Rmtj of the MTJ elements in the whole block increases, it can be determined that "0" data is stored in the selected cell SC1.

When the first read current Ir1 supplied to the write word line WWL1 is turned off, the magnetization of the free layer 15 of the MTJ element MTJ1 returns to the initial state (parallel state in FIG. 54) again.

(Type B)

Figure 58:
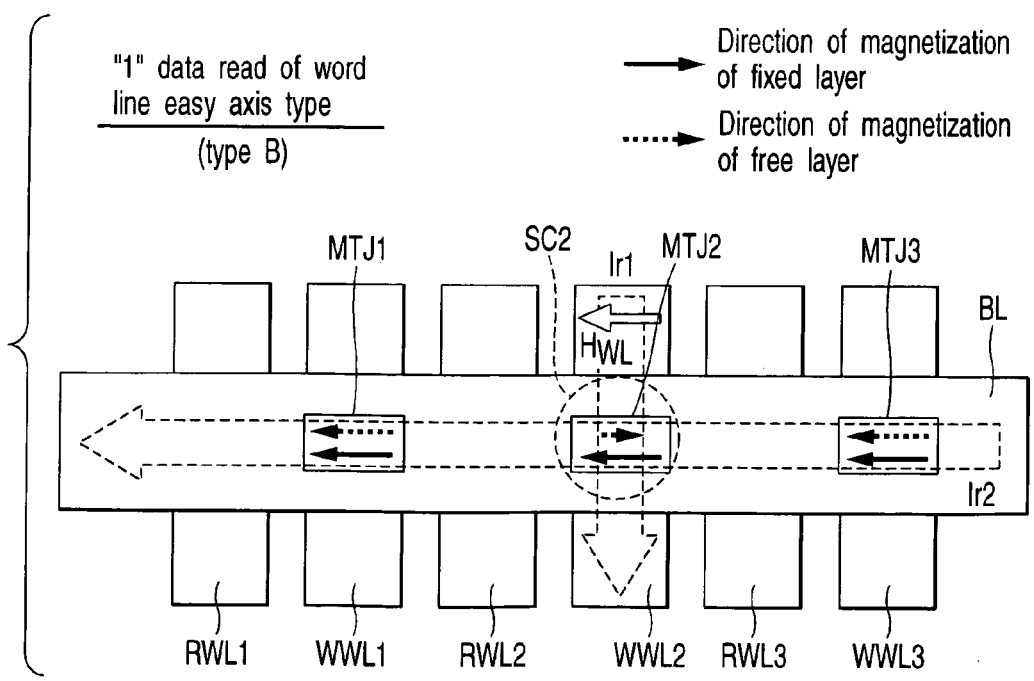
FIG. 58 is a schematic plan view of cells in the "1" data read of type B of the word line easy axis type according to the fourth embodiment of the present invention.

FIG. 58 is a schematic plan view of cells in the "1" data read of type B of the word line easy axis type according to the fourth embodiment of the present invention. The read operation of type B will be described below with reference to FIG. 58.

The second read current Ir2 is supplied from the bit line BL to the read line RL. After that, the first read current Ir1 is supplied to the write word line WWL2 in the "0" data write direction (from the upper side to the lower side on the drawing surface). The magnetic field $H_{WL}$ generated by the first read current Ir1 is applied to the MTJ element MTJ2. As a result, the magnetization of the free layer 15 of the MTJ element MTJ2 becomes small. Since the anti-parallel state with the highest resistance weakens in the MTJ element MTJ2, the resistance value of the MTJ element MTJ2 decreases. For this reason, only while the first read current Ir1 flows, the resistance value Rmtj of the MTJ elements in the whole block decreases.

The difference between the current value I when only the second read current Ir2 flows and the current value I' of the second read current Ir2 when the first and second read currents Ir1 and Ir2 flow simultaneously is read. When the current value I' of the second read current Ir2 is larger than the current value I, i.e., when the resistance value Rmtj of the MTJ elements in the whole block decreases, it can be determined that "1" data is stored in the selected cell SC2.

When the first read current Ir1 supplied to the write word line WWL2 is turned off, the magnetization of the free layer 15 of the MTJ element MTJ2 returns to the initial state (anti-parallel state in FIG. 55) again.

(Type C)

Figure 59:
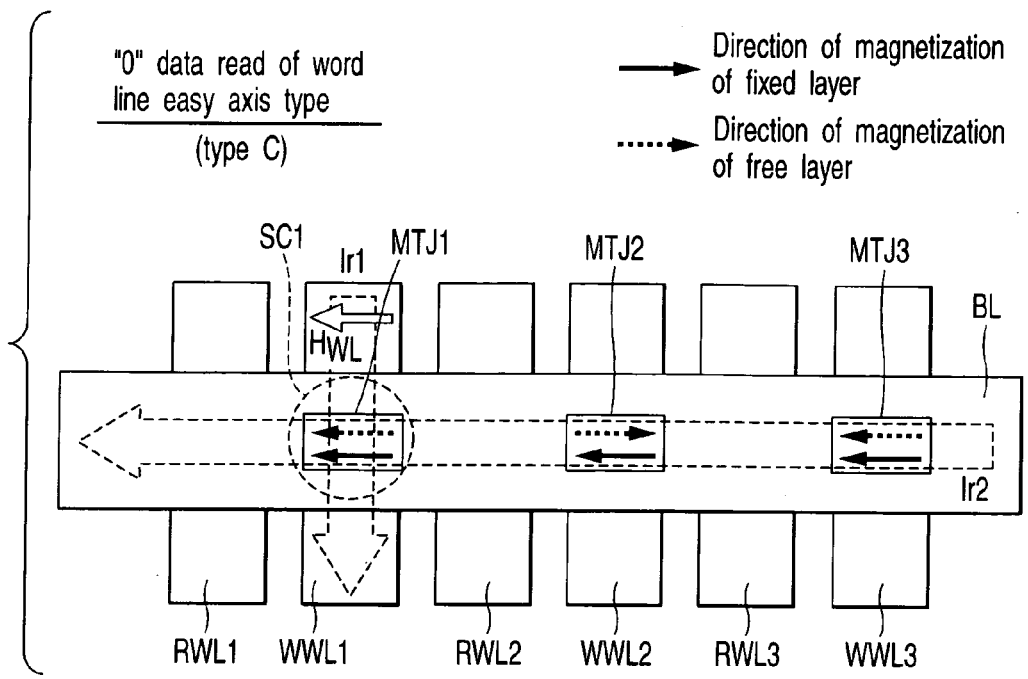
FIG. 59 is a schematic plan view of cells in the "0" data read of type C of the word line easy axis type according to the fourth embodiment of the present invention.

FIG. 59 is a schematic plan view of cells in the "0" data read of type C of the word line easy axis type according to the fourth embodiment of the present invention. The read operation of type C will be described below with reference to FIG. 59.

The second read current Ir2 is supplied from the bit line BL to the read line RL. After that, the first read current Ir1 is supplied to the write word line WWL1 in the "0" data write direction (from the upper side to the lower side on the drawing surface). The magnetic field $H_{WL}$ generated by the first read current Ir1 is applied to the MTJ element MTJ1. As a result, the magnetization of the free layer 15 of the MTJ element MTJ1 becomes large, though the parallel state of magnetizations is maintained. Hence, even when the first read current Ir1 flows, the resistance value of the MTJ element MTJ1 does not change. For this reason, the resistance value Rmtj of the MTJ elements in the whole block does not change, either.

The difference between the current value I when only the second read current Ir2 flows and the current value I' of the second read current Ir2 when the first and second read currents Ir1 and Ir2 flow simultaneously is read. When the current value I' of the second read current Ir2 almost equals the current value I, i.e., when the resistance value Rmtj of the MTJ elements in the whole block rarely changes, it can be determined that "0" data is stored in the selected cell SC1.

When the first read current Ir1 supplied to the write word line WWL1 is turned off, the magnetization of the free layer 15 of the MTJ element MTJ1 returns to the initial state (parallel state in FIG. 54) again.

(Type D)

Figure 60:
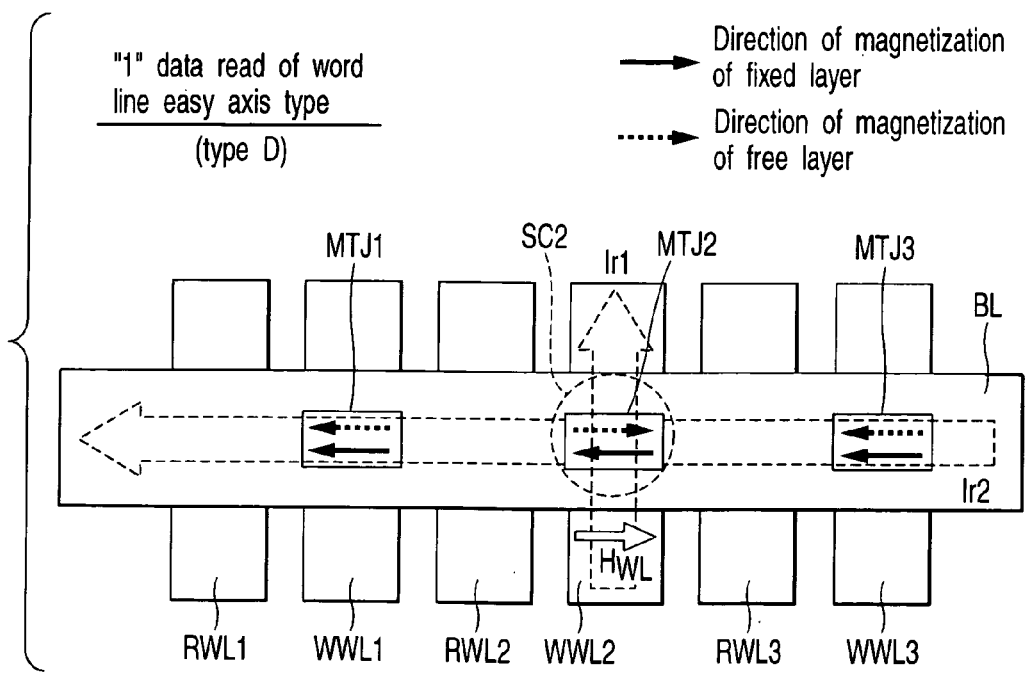
FIG. 60 is a schematic plan view of cells in the "1" data read of type D of the word line easy axis type according to the fourth embodiment of the present invention.

FIG. 60 is a schematic plan view of cells in the "1" data read of type D of the word line easy axis type according to the fourth embodiment of the present invention. The read operation of type D will be described below with reference to FIG. 60.

The second read current Ir2 is supplied from the bit line BL to the read line RL. After that, the first read current Ir1 is supplied to the write word line WWL2 in the "1" data write direction (from the lower side to the upper side on the drawing surface). The magnetic field $H_{WL}$ generated by the first read current Ir1 is applied to the MTJ element MTJ2. As a result, the magnetization of the free layer 15 of the MTJ element MTJ2 becomes large, though the parallel state of magnetizations is maintained. Hence, even when the first read current Ir1 flows, the resistance value of the MTJ element MTJ2 does not change. For this reason, the resistance value Rmtj of the MTJ elements in the whole block does not change, either.

The difference between the current value I when only the second read current Ir2 flows and the current value I' of the second read current Ir2 when the first and second read currents Ir1 and Ir2 flow simultaneously is read. When the current value I' of the second read current Ir2 almost equals the current value I, i.e., when the resistance value Rmtj of the MTJ elements in the whole block rarely changes, it can be determined that "1" data is stored in the selected cell SC2.

When the first read current Ir1 supplied to the write word line WWL2 is turned off, the magnetization of the free layer 15 of the MTJ element MTJ2 returns to the initial state (anti-parallel state in FIG. 55) again.

[4-3c] Summary of Write and Read Operations

Figure 61:
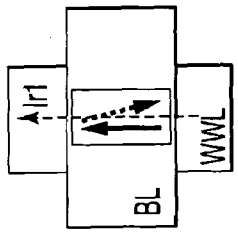
FIG. 61 is a schematic list of the write and read operations according to the fourth embodiment of the present invention.

FIG. 61 is a schematic list of the write and read operations according to the fourth embodiment of the present invention. As shown in FIG. 61, the principle of the write and read operation of the fourth embodiment is the same as in the first embodiment (FIG. 21A), and a description thereof will be omitted. The write and read current pulses according to the fourth embodiment are also the same as in the first embodiment (FIG. 21B), and a description thereof will be omitted.

[4-4] Effect

According to the above-described fourth embodiment, in the cross-point structure in which no read switching element is used for each cell, in the data read, the first read current Ir1 is supplied to the write word line WWLn corresponding to a selected cell SC while the second read current Ir2 is supplied from the bit line BL to the read line RL, thereby applying a magnetic field to the MTJ element of the selected cell SC. The difference between the current Ir2 when the first read current Ir1 is supplied to the write word line WWLn and that when the first read current Ir1 is not supplied is read. Discrimination between "1" and "0" data can be done by determining whether the resistance value of the MTJ element decreases or increases.

As described above, in the fourth embodiment, the memory cells have the cross-point structure. Hence, the density of the cells can be increased. Simultaneously, the read operation speed can be increased by executing the data read in one cycle.

In the cross-point cell array as in this embodiment, the cells are two-dimensionally connected to each other in a net shape. Since the cell signal cannot be read out statistically in the read operation, the change in current value must be detected in a transient manner. Conventionally, to obtain such a cell signal, an expected value must be written, and the signal values before and after the write must be compared. To do this, at least three cycles of expected value write→read→rewrite are necessary for one read, and the operation speed inevitably decreases. In the fourth embodiment, however, the read operation can be completed substantially in one cycle. Hence, the practicality of the cross-point MRAM can greatly be increased.

[5] Fifth Embodiment

In the fifth embodiment, a cross-point magnetic random access memory using GMR elements will be described.

[5-1] Structure

Figure 62:
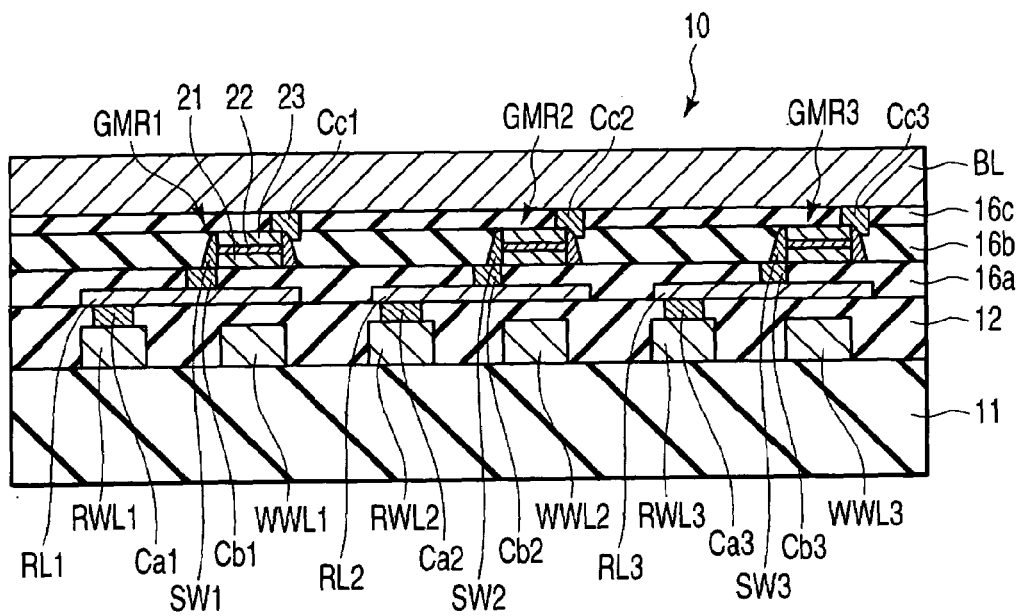
FIG. 62 is a sectional view showing a magnetic random access memory according to the fifth embodiment of the present invention.

FIG. 62 is a sectional view of a magnetic random access memory according to the fifth embodiment. As shown in FIG. 62, in the fifth embodiment, GMR elements are used in place of the MTJ elements of the fourth embodiment. The structure of the magnetic random access memory according to the fifth embodiment, which is different from the fourth embodiment, will mainly be described below.

A GMR element includes free layers 21 and 23 serving as soft magnetic layers and a low-resistance conductive layer 22 serving as a nonmagnetic layer. Since the conductive layer 22 is sandwiched between the free layers 21 and 23, an antiferromagnetic coupling structure is formed so that antiferromagnetic coupling by exchange interaction occurs. The GMR element will be described in the eighth embodiment.

In the fourth embodiment which uses MTJ elements, the read current is supplied in the direction perpendicular to the film surface of the MTJ elements (vertical direction). In the fifth embodiment which uses GMR elements, the read current is supplied in the direction parallel to the film surface of the MTJ elements (horizontal direction). For this reason, in the fifth embodiment, the connection structure of the GMR elements to a bit line BL and read line RL is different from the fourth embodiment.

More specifically, sidewalls SWn (n=1, 2, 3, . . . ) are provided on both side surfaces of each GMR element GMRn. A contact Cbn to electrically connect one of the sidewalls SWn to the read line RL is provided. A contact Ccn to electrically connect the other of the sidewalls SWn to the bit line BL is provided.

The method of connecting the GMR element GMRn and a read word line RWLn is not limited to the above-described method. For example, when an interconnect which contacts a contact Can and one of the sidewalls SWn is formed on the contact Can, the read line RLn and contact Cbn can be omitted.

[5-2] Manufacturing Method

FIGS. 63 to 69 are schematic sectional views showing steps in manufacturing the magnetic random access memory according to the fifth embodiment of the present invention. The method of manufacturing the magnetic random access memory according to the fifth embodiment will be described below.

Figure 63:
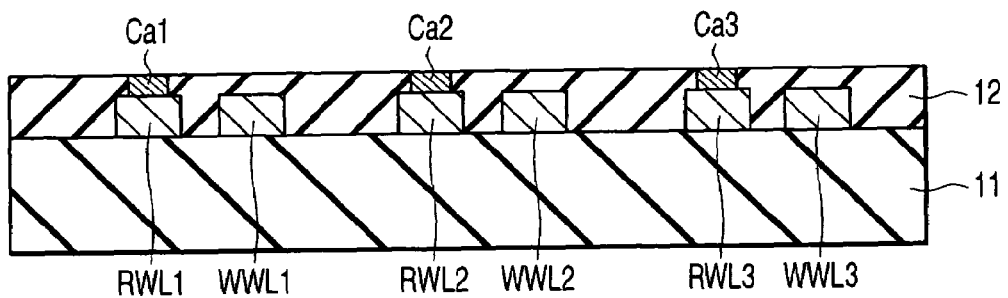
FIGS. 63 to 69 are sectional views showing steps in manufacturing the magnetic random access memory according to the fifth embodiment of the present invention.

As shown in FIG. 63, a first insulating film 11 is formed on a silicon substrate (not shown). Write and read word lines WWLn and RWLn are formed on the first insulating film 11 by using a normal metal wiring process. The write and read word lines WWLn and RWLn are covered with a second insulating film 12. The upper surface of the second insulating film 12 is planarized by CMP. The contacts Can connected to the read word lines RWLn are formed in the second insulating film 12.

Figure 64:
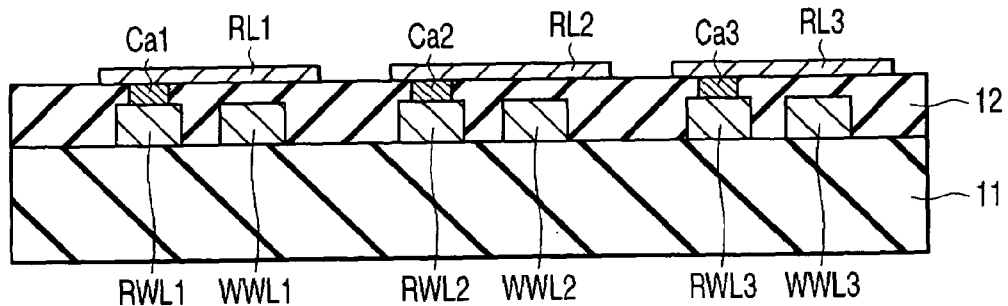

As shown in FIG. 64, the read line RLn is formed for each cell on the second insulating film 12 and contacts Can.

Figure 65:
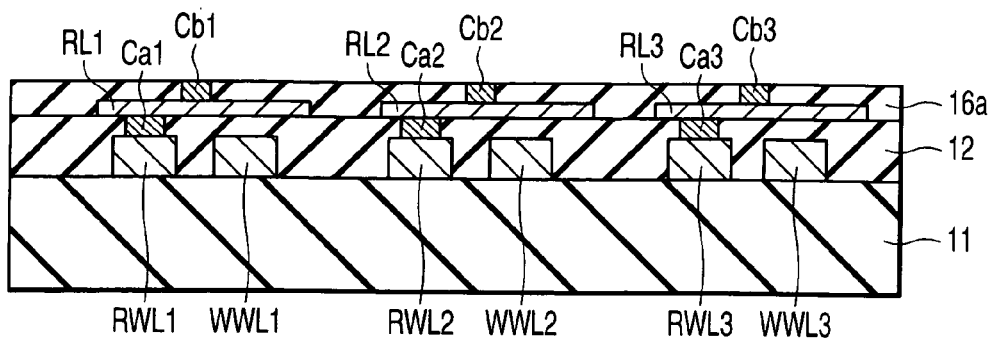

As shown in FIG. 65, a third insulating film 16a is formed on the read line RLn. The contacts Cbn are formed in the third insulating film 16a.

Figure 66:
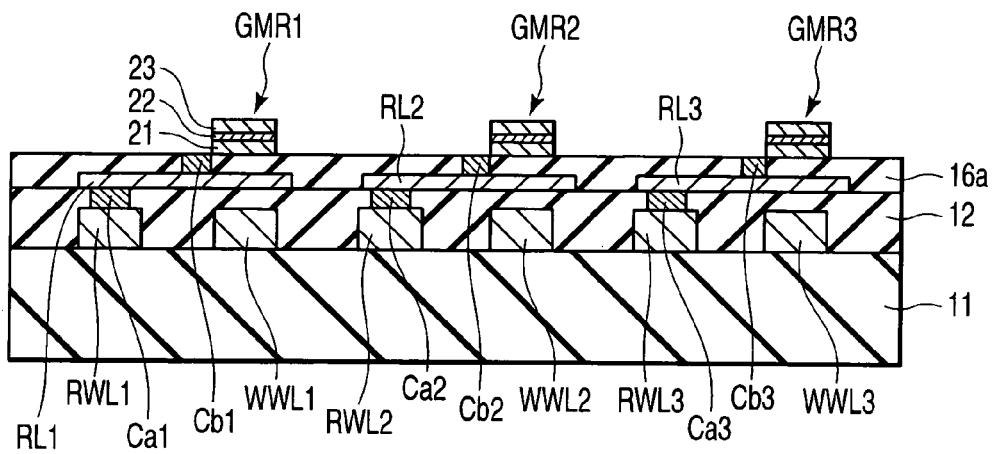

As shown in FIG. 66, the GMR elements GMRn each including the free layer 21, conductive layer 22, and free layer 23 are formed for the respective cells on the third insulating film 16a and contacts Cbn. Etching to pattern the GMR elements GMRn may be stopped on the upper surface of the free layer 21 or the lower surface of the free layer 21.

Figure 67:
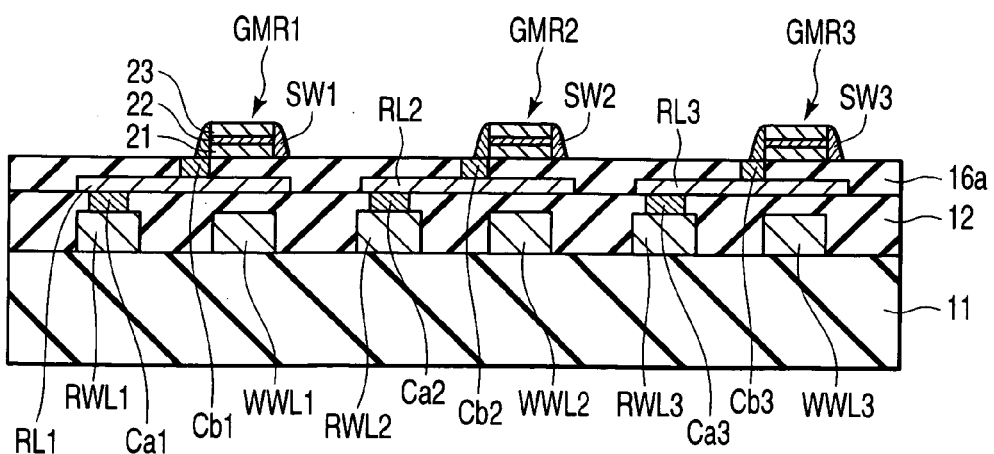

As shown in FIG. 67, the sidewalls SWn made of a conductive material are formed on both side surfaces of each GMR element GMRn. One of the sidewalls SWn provided on both side surfaces of each GMR element GMRn contacts the contact Cbn.

Figure 68:
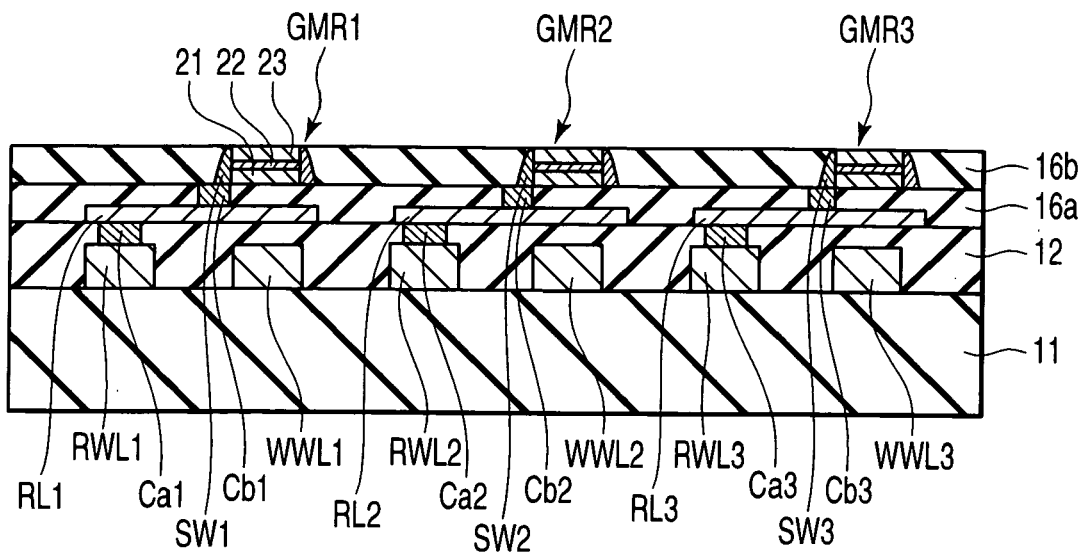

As shown in FIG. 68, a fourth insulating film 16b is formed on the GMR elements GMRn. The upper surface of the fourth insulating film 16b is planarized by CMP until the upper surfaces of the GMR elements GMRn are exposed.

Figure 69:
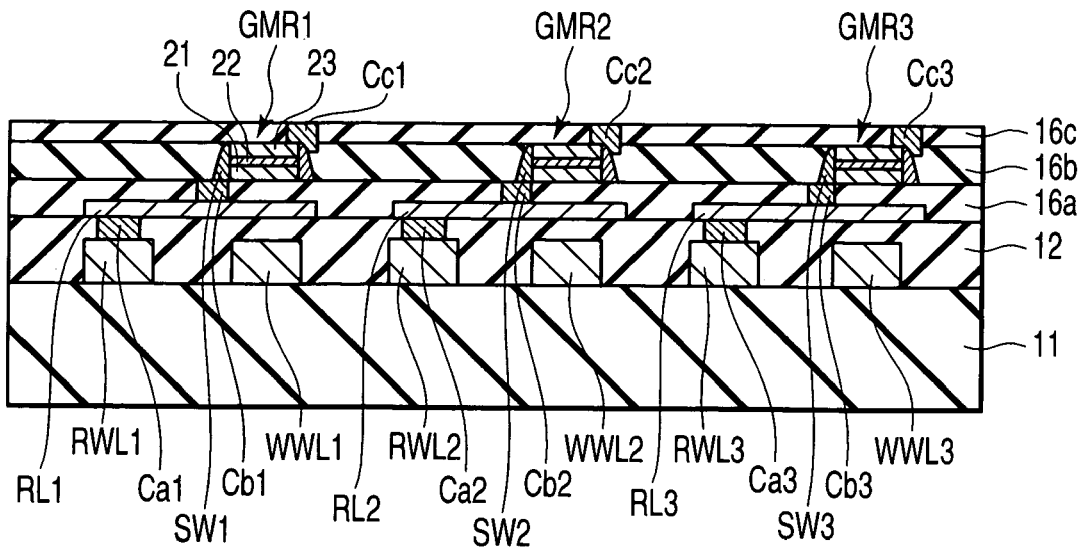

As shown in FIG. 69, a fifth insulating film 16c is formed on the fourth insulating film 16b and GMR elements GMRn. Via holes are formed in the fifth insulating film 16c to expose the sidewalls SWn. The via holes are filled with a metal material to form the contacts Ccn connected to the sidewalls SWn. To electrically connect the contacts Ccn to the sidewalls SWn, the via holes are preferably formed by overetching to some extent.

Next, as shown in FIG. 62, the bit line BL is formed on the fifth insulating film 16c and contacts Cbn by using a normal metal wiring process. In this way, the cross-point magnetic random access memory is completed.

[5-3] Write and Read Operations

The write and read operations of the magnetic random access memory according to the fifth embodiment will be described below.

Each GMR element is arranged such that the direction of axis of easy magnetization of the GMR element is almost parallel to the running direction of the write word line WWL, and the direction of axis of hard magnetization of the GMR element is almost parallel to the running direction of the bit line BL.

A) Write Operation

Figure 70:
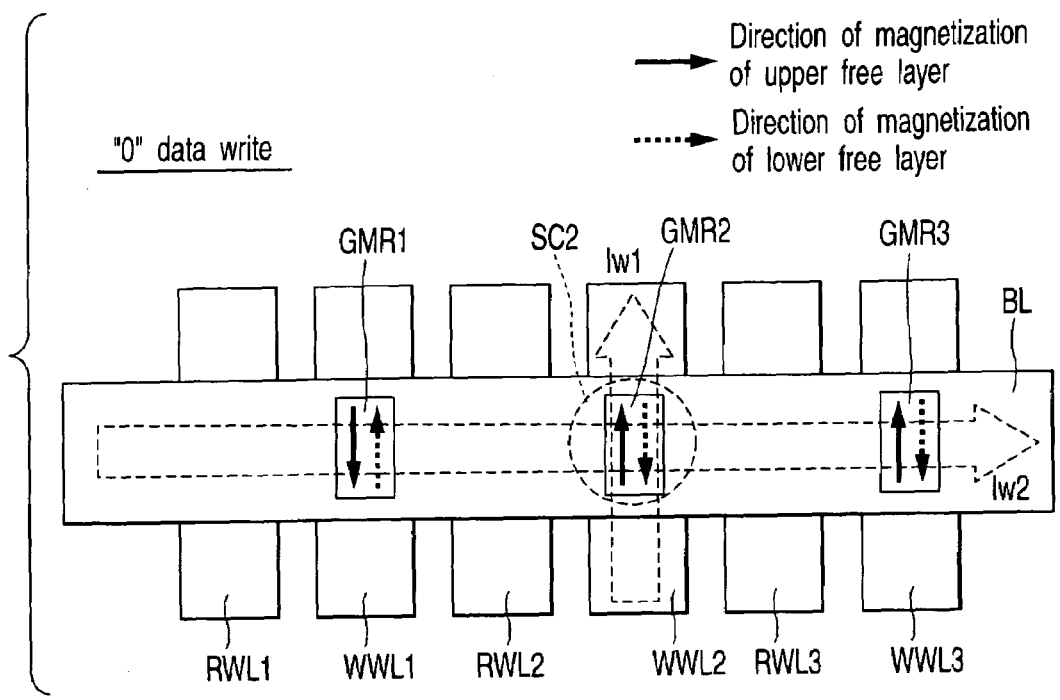
FIG. 70 is a schematic plan view of cells in the "0" data write according to the fifth embodiment of the present invention.

FIG. 70 is a schematic plan view of cells in the "0" data write according to the fifth embodiment of the present invention. The "0" data write operation will be described below.

A write word line WWL2 and bit line BL are selected. First and second write currents Iw1 and Iw2 are supplied to the write word line WWL2 and bit line BL, respectively. A synthetic field generated by the first and second write currents Iw1 and Iw2 is applied to a GMR element GMR2 located at the cross point between the write word line WWL2 and the bit line BL. As a result, the magnetizations of the free layers 21 and 23 of the GMR element GMR2 are reversed while maintaining antiferromagnetic coupling, and data is written in the GMR element GMR2. The magnetization state shown in FIG. 70 is defined as a state in which "0" data is written.

Figure 71:
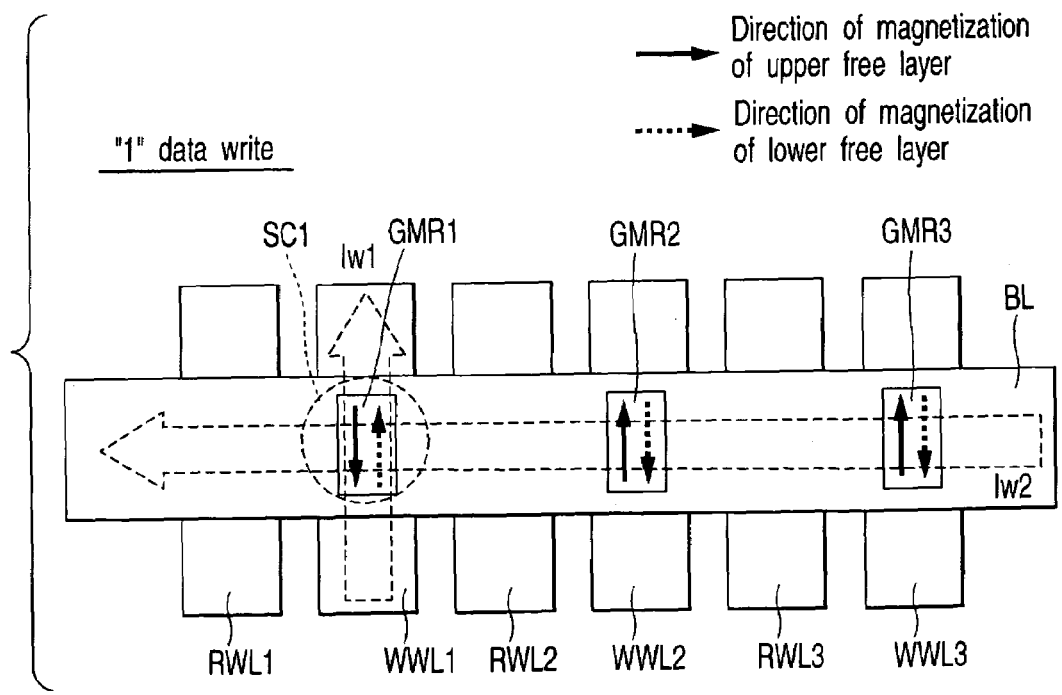
FIG. 71 is a schematic plan view of cells in the "1" data write according to the fifth embodiment of the present invention.

FIG. 71 is a schematic plan view of cells in the "1" data write according to the fifth embodiment of the present invention. The "1" data write operation will be described below.

A write word line WWL1 and bit line BL are selected. The first and second write currents Iw1 and Iw2 are supplied to the write word line WWL1 and bit line BL, respectively. A synthetic field generated by the first and second write currents Iw1 and Iw2 is applied to a GMR element GMR1 located at the cross point between the write word line WWL1 and the bit line BL. As a result, the magnetizations of the free layers 21 and 23 of the GMR element GMR1 are reversed while maintaining antiferromagnetic coupling, and data is written in the GMR element GMR1. The magnetization state shown in FIG. 71 is defined as a state in which "1" data is written.

To write "0" data, the second write current Iw2 is supplied to the bit line BL from the left to the right on the drawing surface (FIG. 70). To write "1" data, the second write current Iw2 is supplied to the bit line BL from the right to the left on the drawing surface (FIG. 71). When the second write current Iw2 is supplied in reverse directions in the above-described way, binary data can selectively be written. The first write current Iw1 can be supplied to the write word lines WWL1 and WWL2 either from the lower side to the upper side or from the upper side to the lower side on the drawing surface.

In this embodiment, the resistance value of the GMR element when "0" data is written (anti-parallel state) equals the resistance value of the GMR element when "1" data is written (anti-parallel state).

B) Read Operation

Figure 72:
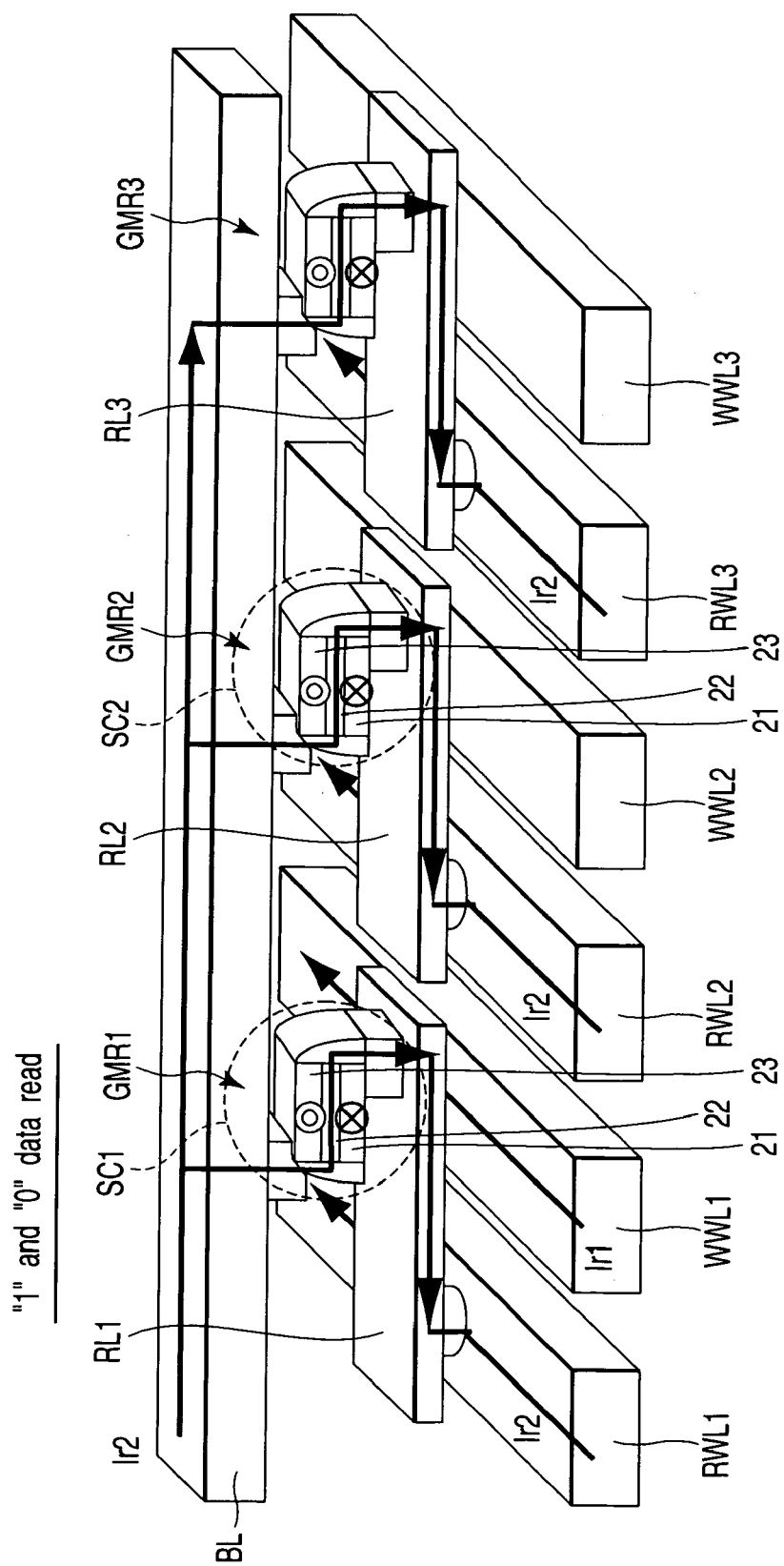
FIG. 72 is a schematic perspective view of the magnetic random access memory in the "1" and "0" data read according to the fifth embodiment of the present invention.

FIG. 72 is a schematic perspective view of the magnetic random access memory in the "1" and "o" data read according to the fifth embodiment of the present invention.

As shown in FIG. 72, in the read operation according to the fifth embodiment, a first read current Ir1 is supplied to the write word line WWLn corresponding to a selected cell SCn. In addition, a second read current Ir2 to read the resistance value of the selected cell SCn is supplied from the bit line BL to the read line RL. In the fifth embodiment, the magnetic field generated by the second read current Ir2 is also applied to the selected cell SCn, unlike the fourth embodiment. A change in resistance value in the GMR element GMRn is read from a change in second read current Ir2 in the first read current Ir1 supplying state, thereby discriminating between "1" and "o" data.

In this example, all the magnetizations of the free layers 21 and 23 of the GMR elements GMRn are in the anti-parallel state (FIGS. 70 and 71).

Figure 73A:
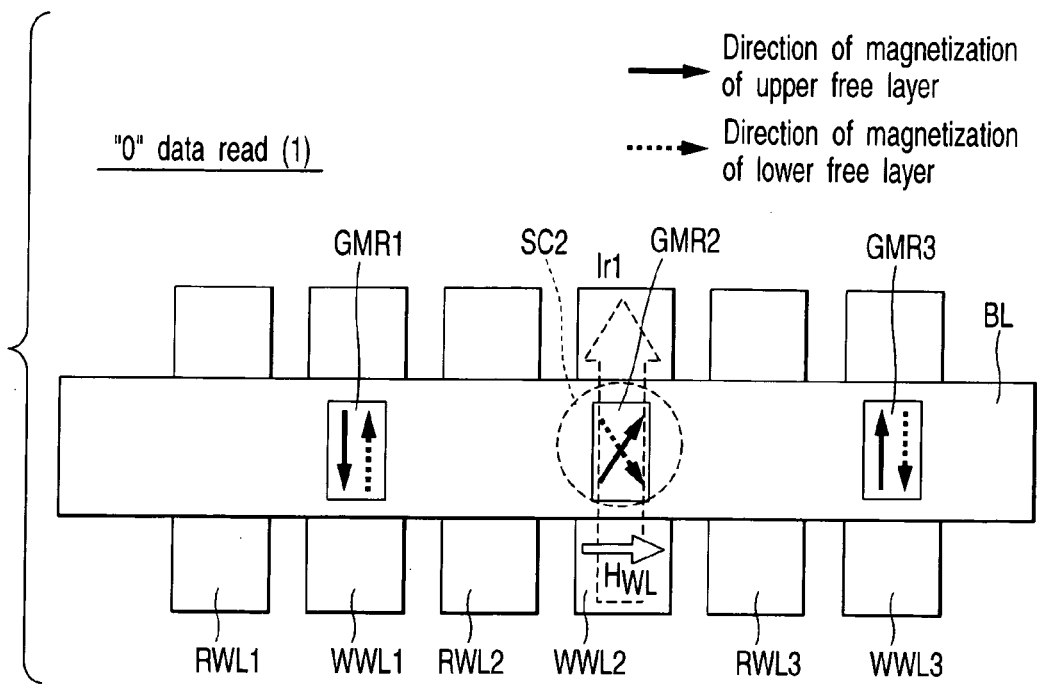
FIGS. 73A and 73B are schematic plan views of cells in the "0" data read according to the fifth embodiment of the present invention.
Figure 73B:
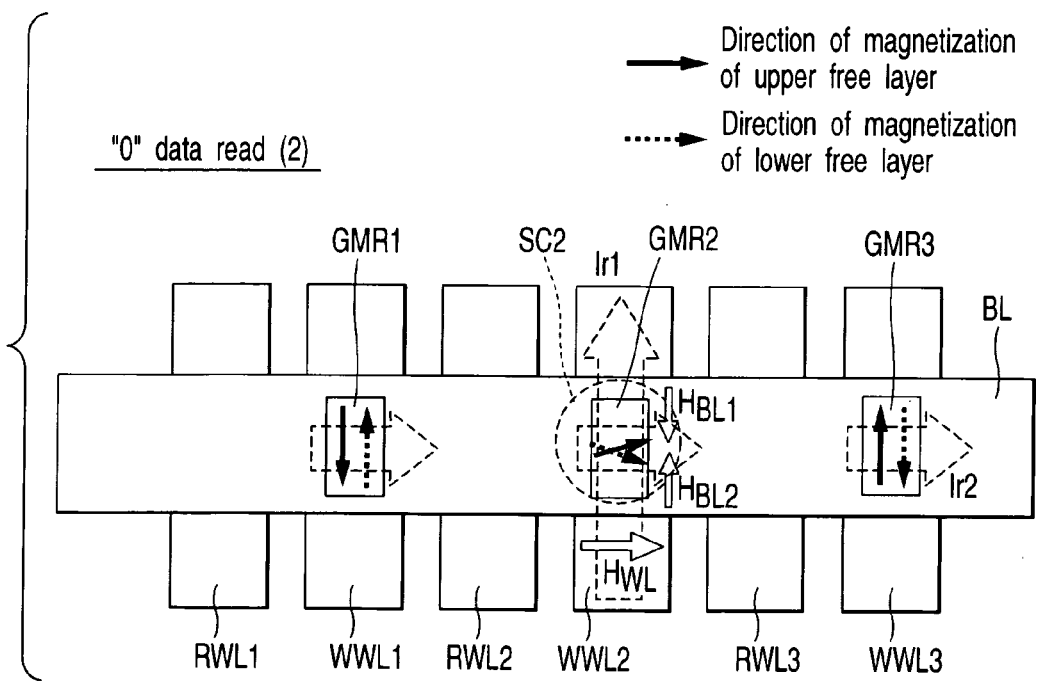

FIGS. 73A and 73B are schematic plan views of cells in the "o" data read according to the fifth embodiment of the present invention. The "0" data read operation will be described below with reference to FIGS. 73A and 73B.

As shown in FIG. 73A, the write word line WWL2 is selected. The first read current Ir1 is supplied to the write word line WWL2. A magnetic field $H_{WL}$ generated by the first read current Ir1 is applied to the GMR element GMR2. As a result, the magnetizations of the free layers 21 and 23 of the GMR element GMR2 rotate halfway so that the magnetizations of the free layers 21 and 23 start turning to the direction of the applied field $H_{WL}$.

As shown in FIG. 73B, the second read current Ir2 is supplied from the bit line BL to the read line RL. A magnetic field $H_{BL}$ generated by the second read current Ir2 when it passes through the conductive layer 22 of the GMR element is applied to the GMR element GMR2. The magnetic field $H_{BL}$ ($H_{BL1}$) acts on the upper free layer 23 downward on the drawing surface (to the near side on the drawing surface of FIG. 72). The magnetic field $H_{BL}$ ($H_{BL2}$) acts on the lower free layer 21 upward on the drawing surface (to the far side on the drawing surface of FIG. 72). As a result, the magnetization of the upper free layer 23 starts turning to the direction of the applied field $H_{BL}$ ($H_{BL1}$) (downward on the drawing surface). The magnetization of the lower free layer 21 starts turning to the direction of the applied field $H_{BL}$ ($H_{BL2}$) (upward on the drawing surface). Hence, the magnetizations start turning to the direction of the applied field $H_{WL}$.

Before the read, the magnetization of the GMR element GMR2 is in the anti-parallel state. However, in the read, the magnetization of the GMR element GMR2 is not in the anti-parallel state. Since the anti-parallel state with the highest resistance is lost in the GMR element GMR2, the resistance value of the GMR element GMR2 decreases. For this reason, only while the first read current Ir1 flows, a resistance value Rgmr of the GMR elements in the whole block decreases.

In this way, the change in state of the resistance value Rgmr of the GMR elements in the whole block is read by the second read current Ir2. When the resistance value Rgmr of the GMR elements in the whole block decreases, it can be determined that "0" data is stored in a selected cell SC2.

When the first read current Ir1 supplied to the write word line WWL2 is turned off, the magnetizations of the free layers 21 and 23 of the GMR element GMR2 return to the initial state (anti-parallel state in FIG. 70) again.

Figure 74:
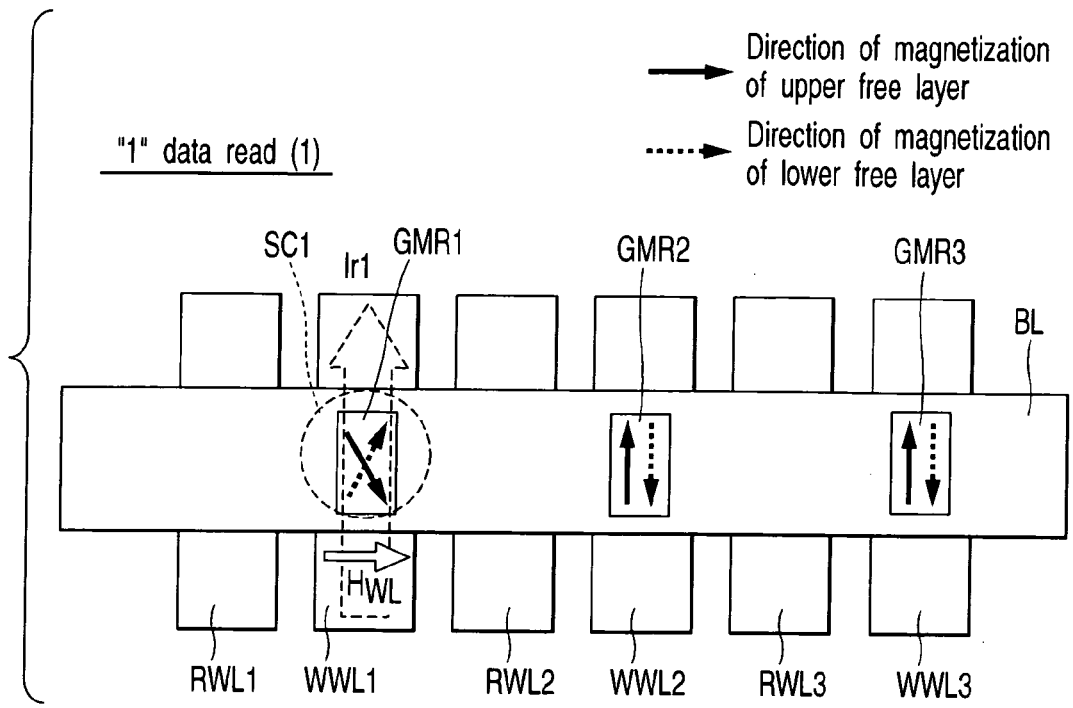
FIGS. 74A and 74B are schematic plan views of cells in the "1" data read according to the fifth embodiment of the present invention.
Figure 74:
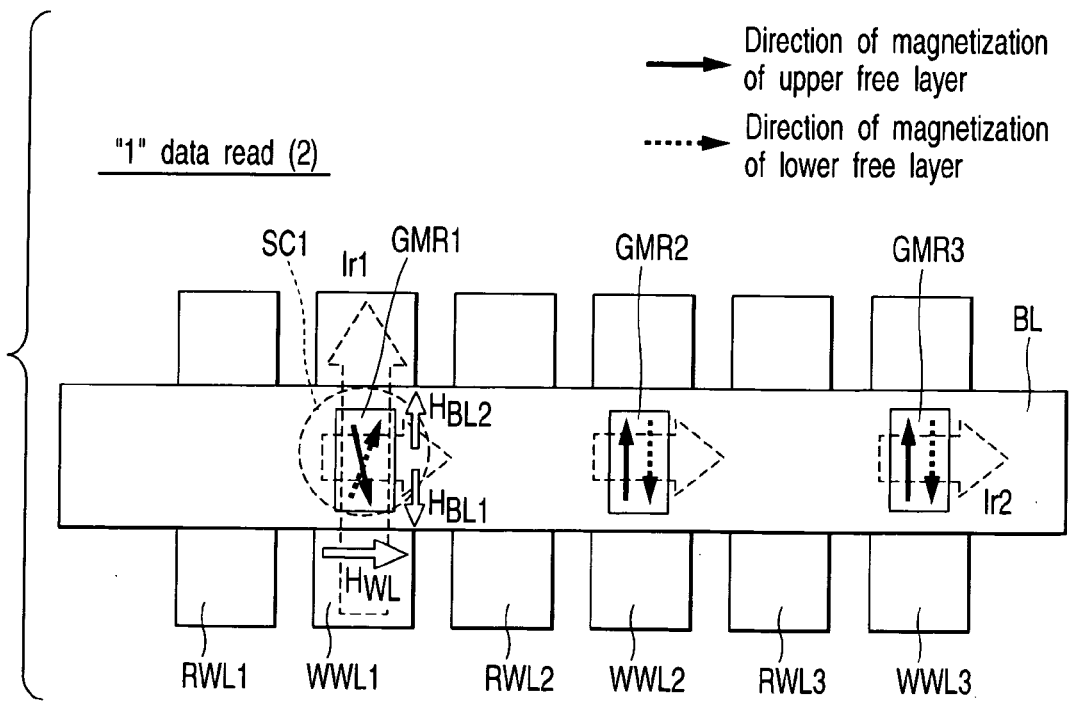

FIGS. 74A and 74B are schematic plan views of cells in the "1" data read according to the fifth embodiment of the present invention. The "1" data read operation will be described below with reference to FIGS. 74A and 74B.

As shown in FIG. 74A, the write word line WWL1 is selected. The first read current Ir1 is supplied to the write word line WWL1. The magnetic field $H_{WL}$ generated by the first read current Ir1 is applied to the GMR element GMR1. As a result, the magnetizations of the free layers 21 and 23 of the GMR element GMR1 rotate halfway so that the magnetizations of the free layers 21 and 23 start turning to the direction of the applied field $H_{WL}$.

As shown in FIG. 74B, the second read current Ir2 is supplied from the bit line BL to the read line RL. The magnetic field $H_{BL}$ generated by the second read current Ir2 when it passes through the conductive layer 22 of the GMR element is applied to the GMR element GMR1. The magnetic field $H_{BL}$ ($H_{BL1}$) acts on the upper free layer 23 downward on the drawing surface (to the near side on the drawing surface of FIG. 72). The magnetic field $H_{BL}$ ($H_{BL2}$) acts on the lower free layer 21 upward on the drawing surface (to the far side on the drawing surface of FIG. 72). As a result, the magnetization of the upper free layer 23 starts turning to the direction of the applied field $H_{BL}$ ($H_{BL1}$) (downward on the drawing surface). The magnetization of the lower free layer 21 starts turning to the direction of the applied field $H_{BL}$ ($H_{BL2}$) (upward on the drawing surface). Hence, the magnetizations start returning to the initial state (anti-parallel state in FIG. 71).

In the read, the magnetization state of a selected cell SC1 rarely changes from the magnetization state of an unselected cell. Hence, the resistance value of the GMR element GMR1 almost equals that of the GMR element of an unselected cell. For this reason, even while the first read current Ir1 flows, the resistance value Rgmr of the GMR elements in the whole block rarely changes.

In this way, the change in state of the resistance value Rgmr of the GMR elements in the whole block is read by the second read current Ir2. When the resistance value Rgmr of the GMR elements in the whole block does not change, it can be determined that "1" data is stored in the selected cell SC1.

When the first read current Ir1 supplied to the write word line WWL1 is turned off, the magnetizations of the free layers 21 and 23 of the GMR element GMR1 return to the initial state (anti-parallel state in FIG. 71) again.

C) Summary of Write and Read Operations

Figure 75:
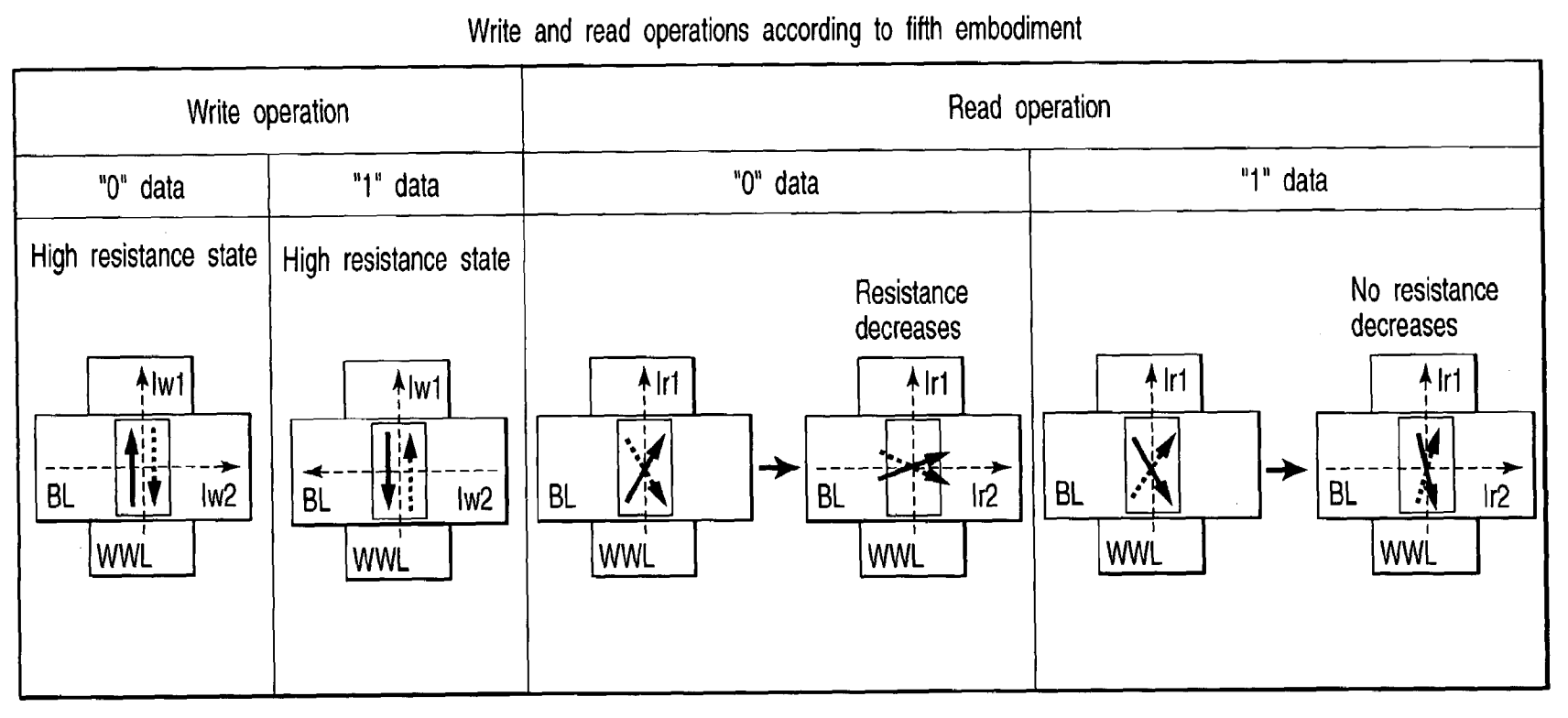

FIG. 75 is a schematic list of the write and read operations according to the fifth embodiment of the present invention. As shown in FIG. 75, the principle of the write and read operation of the fifth embodiment is the same as in the second embodiment (FIG. 36A), and a description thereof will be omitted. The write and read current pulses according to the fifth embodiment are also the same as in the second embodiment (FIG. 36B), and a description thereof will be omitted.

[5-4] Effect

According to the above-described fifth embodiment, in the cross-point structure in which no read switching element is used for each cell, in the data read, the first read current Ir1 is supplied to the write word line WWLn corresponding to a selected cell SC to apply a magnetic field to the GMR element of the selected cell SC. In this state, the second read current Ir2 is supplied from the bit line BL to read word line RWLn through the read line RLn. The current value of the second read current Ir2 is compared with the current value of the reference cell to which the first read current Ir1 is not supplied. Depending on whether the resistance value of the GMR element does not change or decreases, discrimination between "1" and "0" data can be done.

As described above, in the fifth embodiment, the memory cells have the cross-point structure. Hence, the density of the cells can be increased. Simultaneously, the read operation speed can be increased by executing the data read in one cycle.

[6] Sixth Embodiment

In the sixth embodiment, a cross-point magnetic random access memory using GMR elements will be described, as in the fifth embodiment. In the GMR element of the fifth embodiment, the conductive layer is sandwiched between two free layers. In the GMR element of the sixth embodiment, however, the conductive layer is sandwiched between a free layer and a fixed layer.

[6-1] Structure

Figure 76:
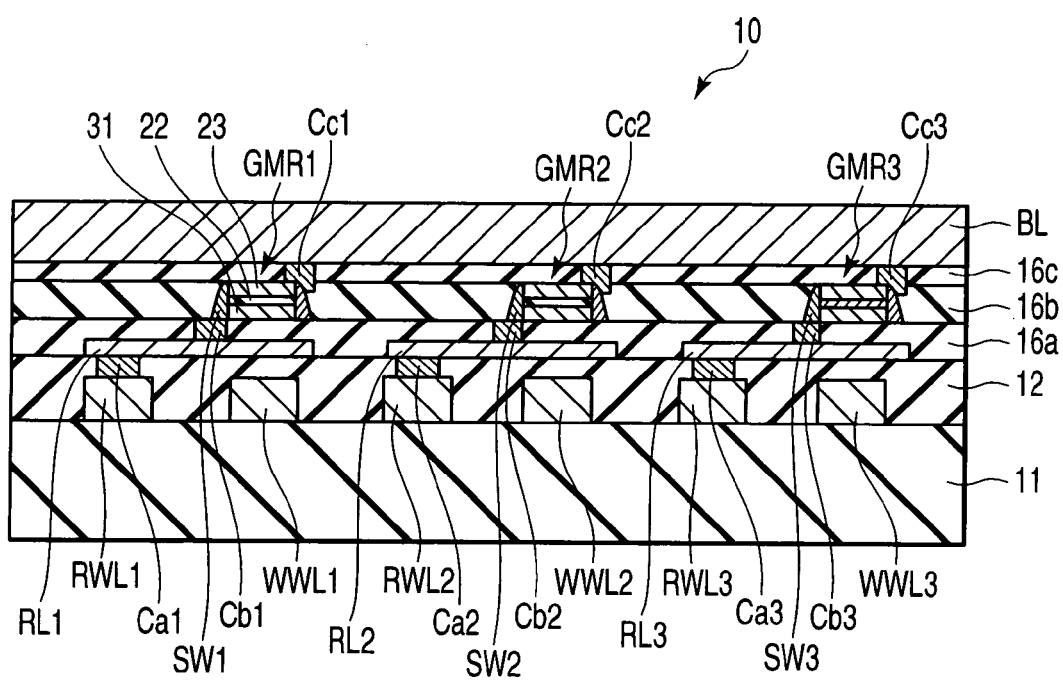
FIG. 76 is a sectional view showing a magnetic random access memory according to the sixth embodiment of the present invention.

FIG. 76 is a sectional view of a magnetic random access memory according to the sixth embodiment. As shown in FIG. 76, in the sixth embodiment, the lower free layer of the GMR element of the fifth embodiment is replaced with a fixed layer 31. Hence, the GMR element includes the fixed layer 31, a free layer 23, and a conductive layer 22 sandwiched between the fixed layer 31 and the free layer 23. The remaining structure is the same as in the fifth embodiment, and a description thereof will be omitted.

[6-2] Manufacturing Method

The manufacturing method according to the sixth embodiment is the same as that of the above-described fifth embodiment except that the free layer 21 is changed to the fixed layer 31, and a description thereof will be omitted.

[6-3] Write and Read Operations

The write and read operations of the magnetic random access memory according to the sixth embodiment will be described below.

Each GMR element is arranged such that the direction of axis of easy magnetization of the GMR element is almost parallel to the running direction of a write word line WWL, and the direction of axis of hard magnetization of the GMR element is almost parallel to the running direction of a bit line BL. The free layer 23 of the GMR element is arranged on the conductive layer 22.

A) Write Operation

Figure 77:
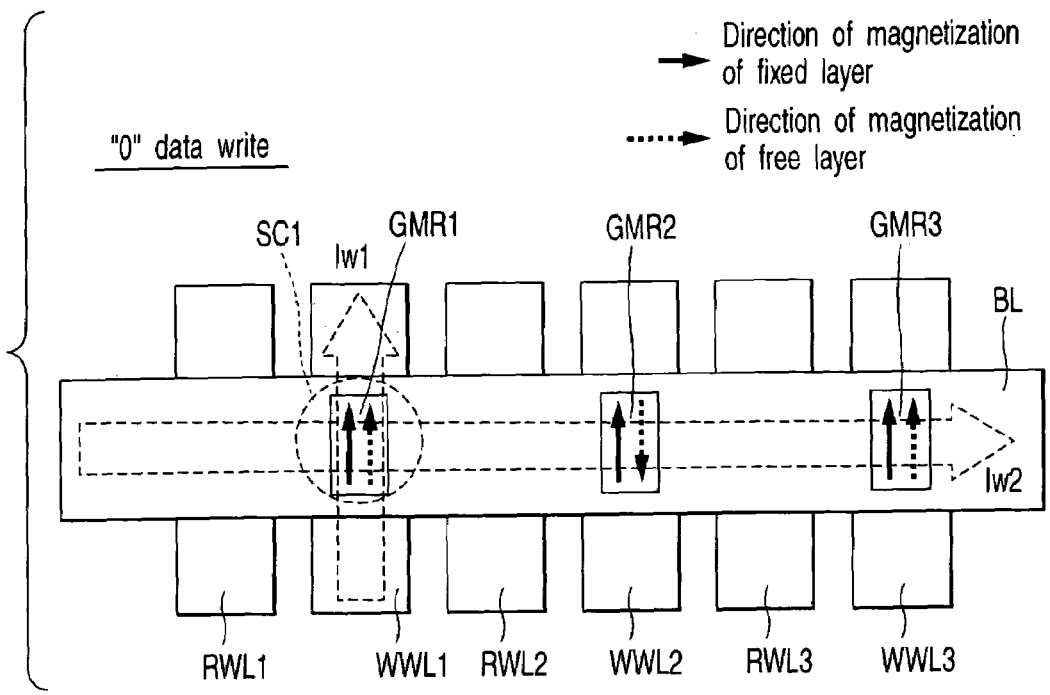
FIG. 77 is a schematic plan view of cells in the "0" data write according to the sixth embodiment of the present invention.

FIG. 77 is a schematic plan view of cells in the "0" data write according to the sixth embodiment of the present invention. The "0" data write operation will be described below.

A write word line WWL1 and bit line BL are selected. First and second write currents Iw1 and Iw2 are supplied to the write word line WWL1 and bit line BL, respectively. A synthetic field generated by the first and second write currents Iw1 and Iw2 is applied to a GMR element GMR1 located at the cross point between the write word line WWL1 and the bit line BL. As a result, the magnetization directions of the fixed layer 31 and free layer 23 of the GMR element GMR1 become parallel to, each other, and data is written in the GMR element GMR1. The state in which the magnetization directions are parallel is defined as a state in which "0" data is written.

Figure 78:
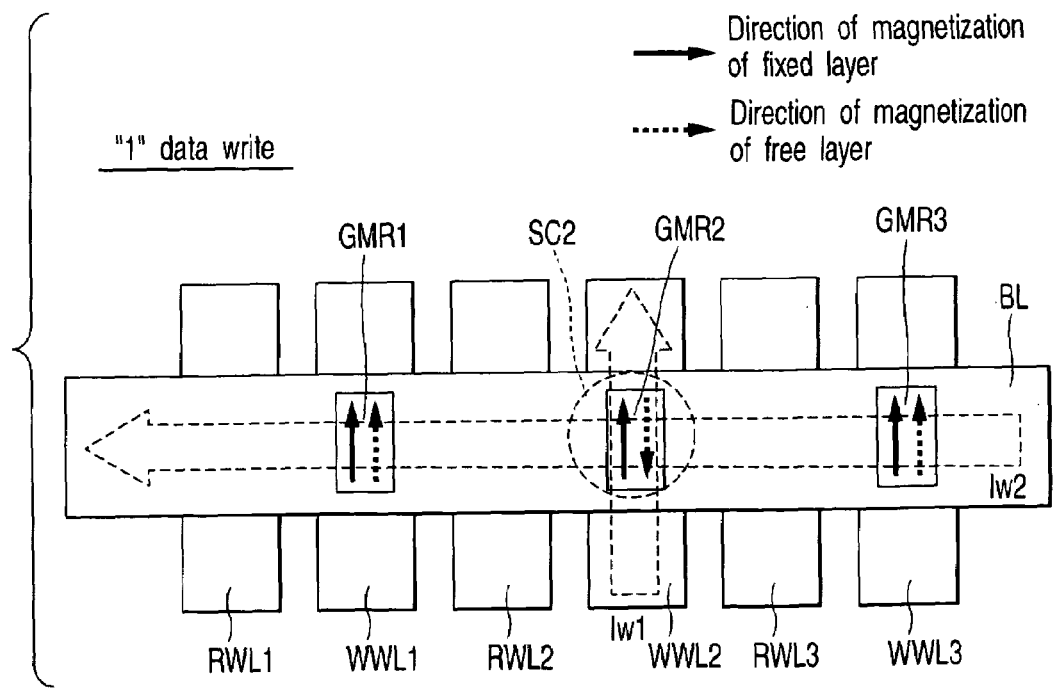
FIG. 78 is a schematic plan view of cells in the "1" data write according to the sixth embodiment of the present invention.

FIG. 78 is a schematic plan view of cells in the "1" data write according to the sixth embodiment of the present invention. The "1" data write operation will be described below.

A write word line WWL2 and bit line BL are selected. The first and second write currents Iw1 and Iw2 are supplied to the write word line WWL2 and bit line BL, respectively. A synthetic field generated by the first and second write currents Iw1 and Iw2 is applied to a GMR element GMR2 located at the cross point between the write word line WWL2 and the bit line BL. As a result, the magnetization directions of the fixed layer 31 and free layer 23 of the GMR element GMR2 become anti-parallel to each other, and data is written in the GMR element GMR2. The state in which the magnetization directions are anti-parallel is defined as a state in which "1" data is written.

In the example of this embodiment in which the magnetization of the fixed layer 31 is fixed upward on the drawing surface, to write "0" data, the second write current Iw2 is supplied to the bit line BL from the left to the right on the drawing surface (FIG. 77). To write "1" data, the second write current Iw2 is supplied to the bit line BL from the right to the left on the drawing surface (FIG. 78). When the second write current Iw2 is supplied in reverse directions in the above-described way, binary data can selectively be written. The first write current Iw1 can be supplied to the write word lines WWL1 and WWL2 either from the lower side to the upper side or from the upper side to the lower side on the drawing surface.

B) Read Operation

Figure 79:
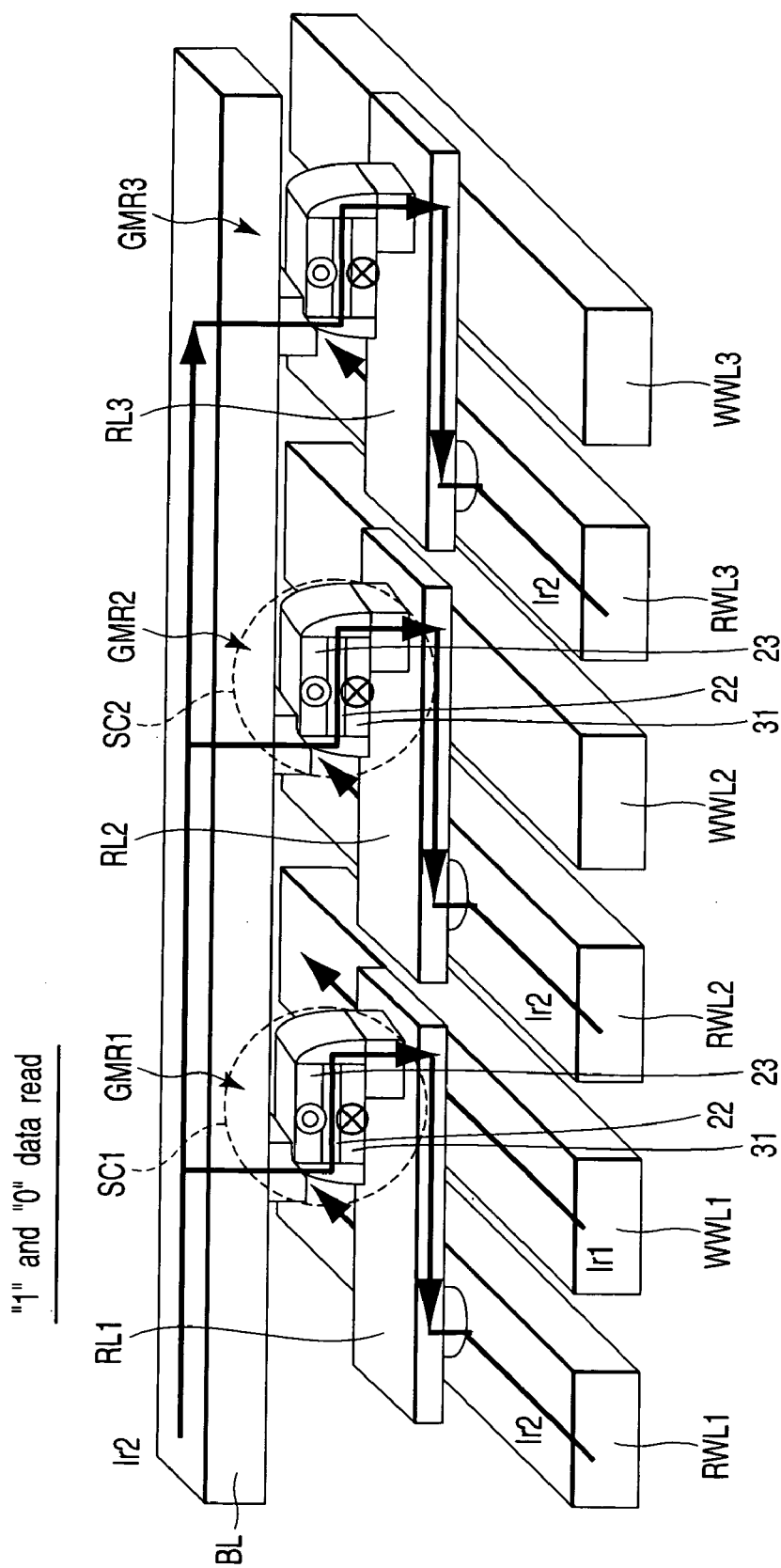
FIG. 79 is a schematic perspective view of the magnetic random access memory in the "1" and "0" data read according to the sixth embodiment of the present invention.

FIG. 79 is a schematic perspective view of the magnetic random access memory in the "1" and "0" data read according to the sixth embodiment of the present invention.

As shown in FIG. 79, in the read operation according to the sixth embodiment, a first read current Ir1 is supplied to a write word line WWLn corresponding to a selected cell SCn. In addition, a second read current Ir2 to read the resistance value of the selected cell SCn is supplied from the bit line BL to a read line RL. In the sixth embodiment, the magnetic field generated by the second read current Ir2 is also applied to the selected cell SCn, as in the fifth embodiment. In the fifth embodiment, both the magnetizations of the magnetic layers sandwiching the conductive layer react to the magnetic field. In the sixth embodiment, however, only the magnetization of one (free layer) of the magnetic layers sandwiching the conductive layer reacts. A change in resistance value in a GMR element GMRn is read from a change in second read current Ir2 in the first read current Ir1 supplying state, thereby discriminating between "1" and "0" data.

Figure 80A:
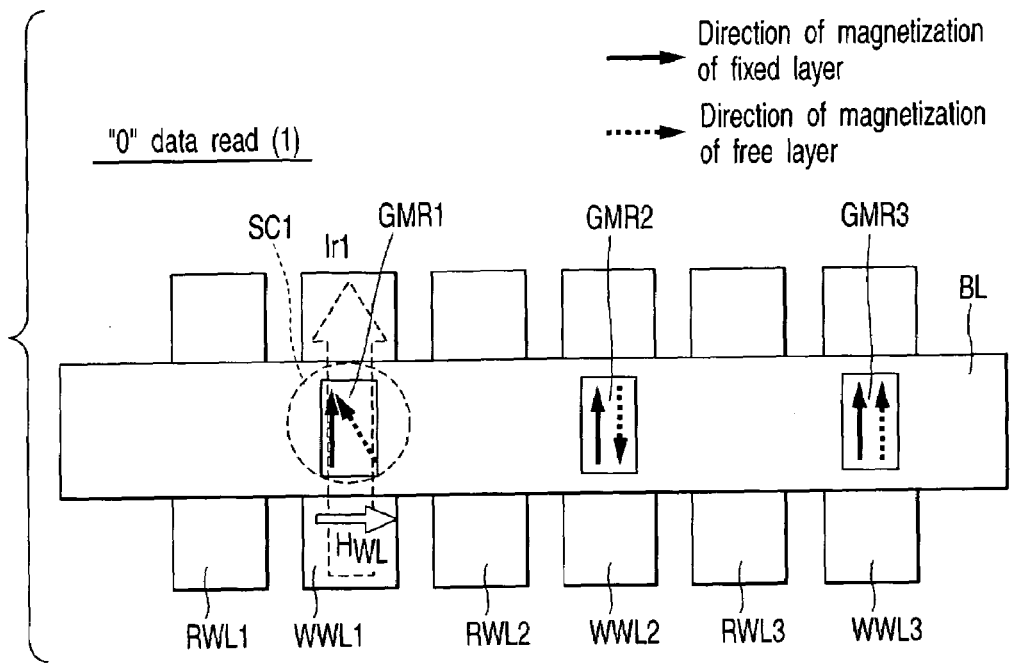
FIGS. 80A and 80B are schematic plan views of cells in the "0" data read according to the sixth embodiment of the present invention.
Figure 80B:
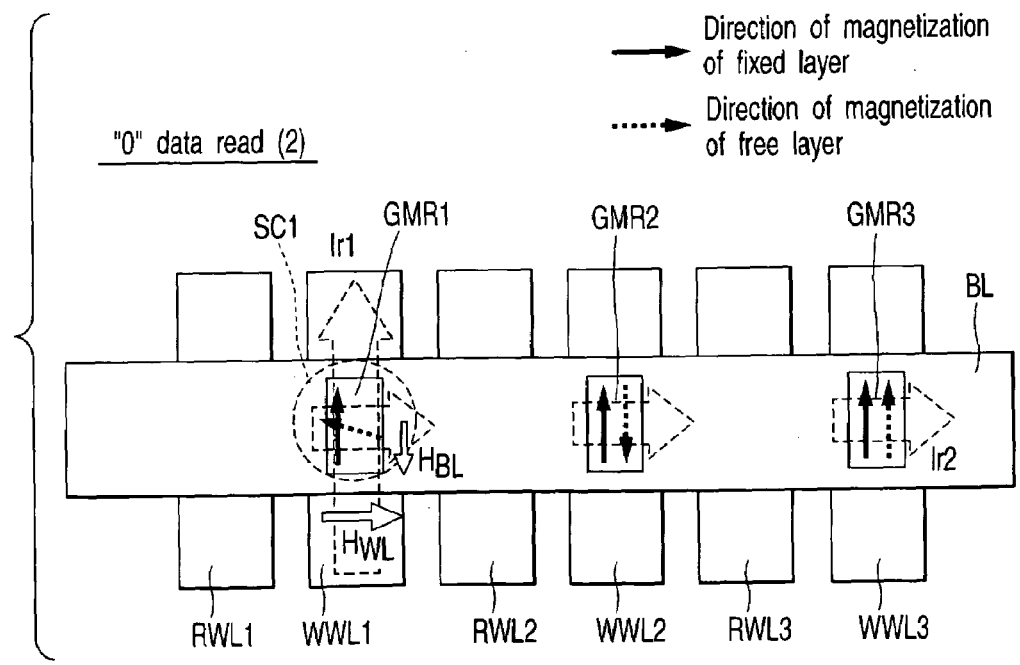

FIGS. 80A and 80B are schematic plan views of cells in the "0" data read according to the sixth embodiment of the present invention. The "0" data read operation will be described below with reference to FIGS. 80A and 80B.

As shown in FIG. 80A, the write word line WWL1 is selected. The first read current Ir1 is supplied to the write word line WWL1. A magnetic field $H_{WL}$ generated by the first read current Ir1 is applied to the GMR element GMR1. As a result, only the magnetization of the free layer 23 of the GMR element GMR1 reacts by the magnetic field $H_{WL}$ and rotates halfway.

As shown in FIG. 80B, the second read current Ir2 is supplied from the bit line BL to the read line RL. A magnetic field $H_{BL}$ generated by the second read current Ir2 when it passes through the conductive layer 22 of the GMR element is applied to the GMR element GMR1. The magnetic field $H_{BL}$ acts on the free layer 23 downward on the drawing surface (to the near side on the drawing surface of FIG. 79). As a result, the magnetization of the free layer 23 further rotates.

Before the read, the magnetization of the GMR element GMR1 is in the parallel state. However, while the first read current Ir1 flows, the magnetization of the GMR element GMR1 is not in the parallel state (the magnetizations of the fixed layer 31 and free layer 23 tilt from the parallel state). Since the parallel state with the lowest resistance is lost in the GMR element GMR1, the resistance value of the GMR element GMR1 increases. For this reason, only while the first read current Ir1 flows, a resistance value Rgmr of the GMR elements in the whole block increases.

In this way, the change in state of the resistance value Rgmr of the GMR elements in the whole block is read by the second read current Ir2. When the resistance value Rgmr of the GMR elements in the whole block increases, it can be determined that "0" data is stored in a selected cell SC1.

When the first read current Ir1 supplied to the write word line WWL1 is turned off, the magnetization of the free layer 23 of the GMR element GMR1 returns to the initial state (parallel state in FIG. 77) again.

Figure 81A:
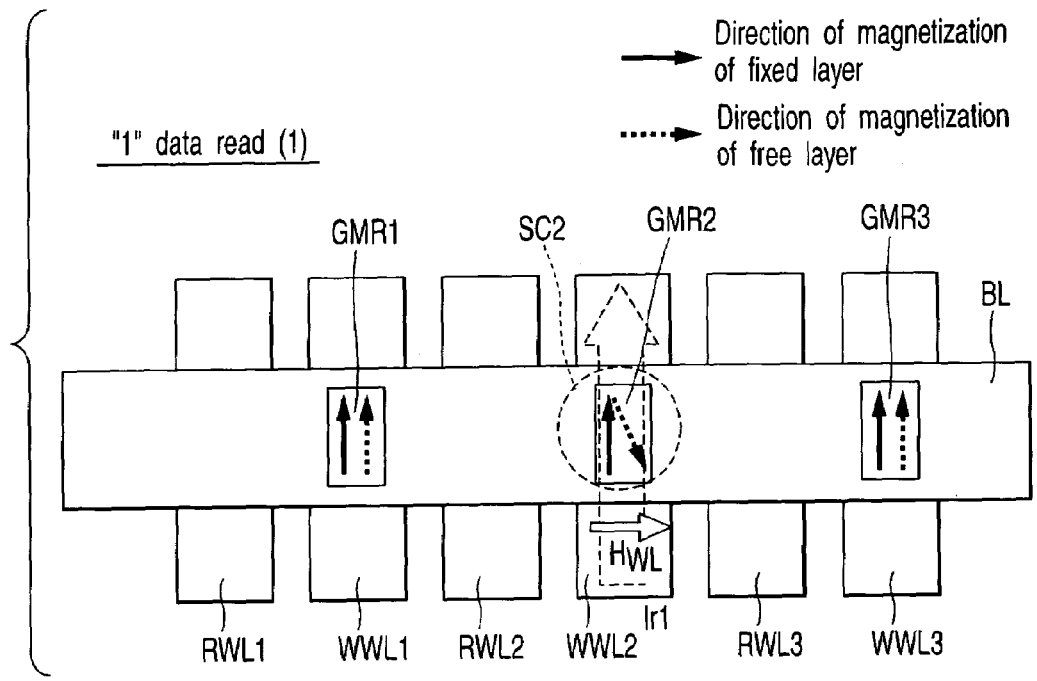
FIGS. 81A and 81B are schematic plan views of cells in the "1" data read according to the sixth embodiment of the present invention.
Figure 81B:
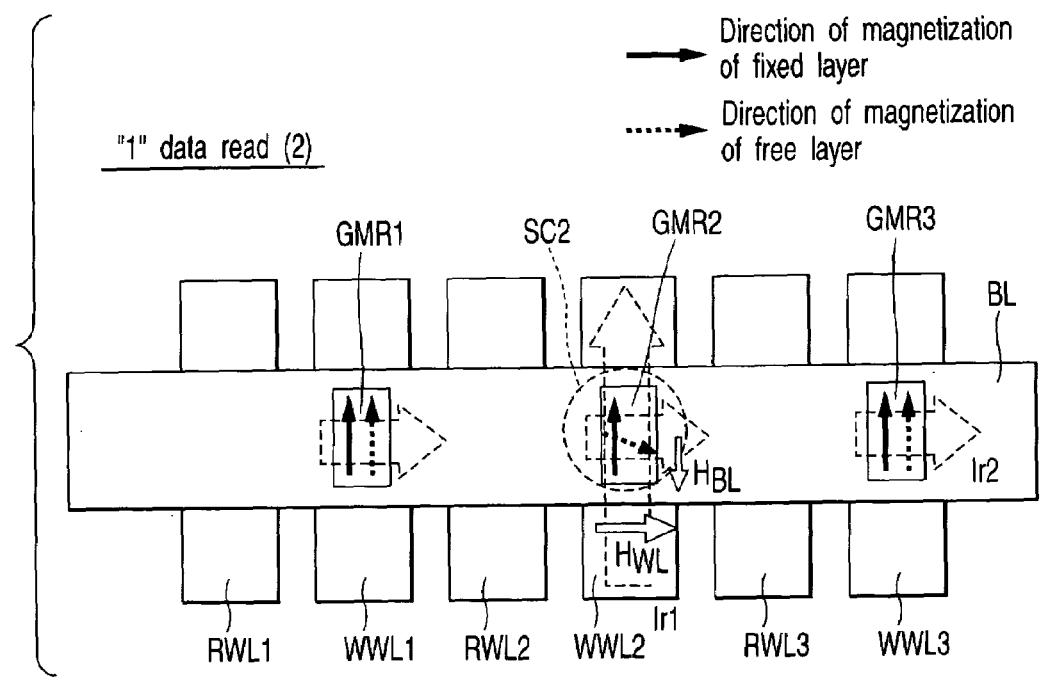

FIGS. 81A and 81B are schematic plan views of cells in the "1" data read according to the sixth embodiment of the present invention. The "1" data read operation will be described below with reference to FIGS. 81A and 81B.

As shown in FIG. 81A, the write word line WWL2 is selected. The first read current Ir1 is supplied to the write word line WWL2. The magnetic field $H_{WL}$ generated by the first read current Ir1 is applied to the GMR element GMR2. As a result, only the magnetization of the free layer 23 of the GMR element GMR2 reacts by the magnetic field $H_{WL}$ and rotates halfway.

As shown in FIG. 81B, the second read current Ir2 is supplied from the bit line BL to the read line RL. The magnetic field $H_{BL}$ generated by the second read current Ir2 when it passes through the conductive layer 22 of the GMR element is applied to the GMR element GMR2. The magnetic field $H_{BL}$ acts on the free layer 23 downward on the drawing surface (to the near side on the drawing surface of FIG. 79). As a result, the magnetization of the free layer 23 rotates.

Before the read, the magnetization of the GMR element GMR2 is in the anti-parallel state. In the read, however, the magnetization of the GMR element GMR2 is not in the anti-parallel state. Since the anti-parallel state with the highest resistance is lost in the GMR element GMR2, the resistance value of the GMR element GMR2 decreases. For this reason, only while the first read current Ir1 flows, the resistance value Rgmr of the GMR elements in the whole block decreases.

In this way, the change in state of the resistance value Rgmr of the GMR elements in the whole block is read by the second read current Ir2. When the resistance value Rgmr of the GMR elements in the whole block decreases, it can be determined that "1" data is stored in a selected cell SC2.

When the first read current Ir1 supplied to the write word line WWL2 is turned off, the magnetization of the free layer 23 of the GMR element GMR2 returns to the initial state (anti-parallel state in FIG. 78) again.

C) Summary of Write and Read Operations

Figure 82:
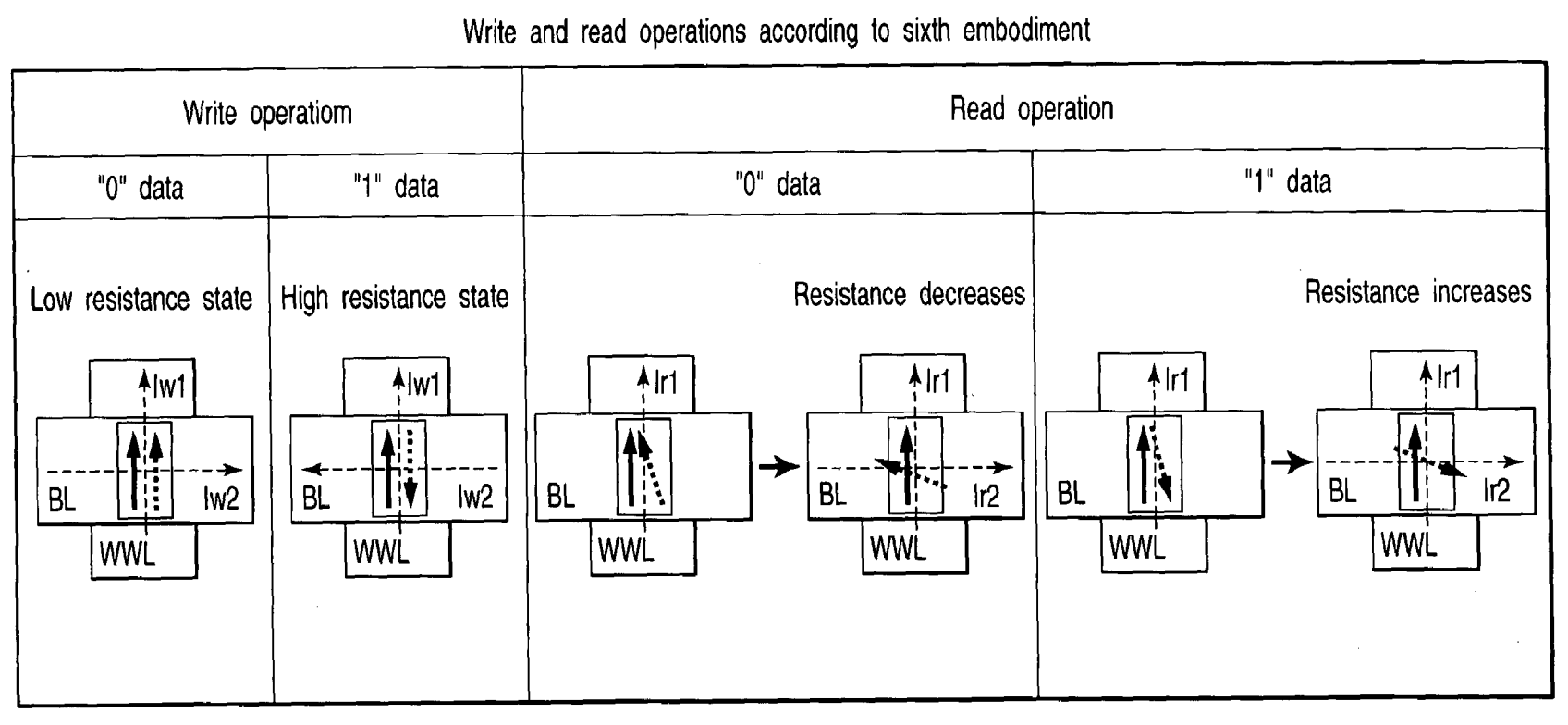

FIG. 82 is a schematic list of the write and read operations according to the sixth embodiment of the present invention. As shown in FIG. 82, the principle of the write and read operation of the sixth embodiment is the same as in the third embodiment (FIG. 43), and a description thereof will be omitted. The write and read current pulses according to the sixth embodiment are also the same as in the third embodiment, and a description thereof will be omitted.

[6-4] Effect

According to the above-described sixth embodiment, in the cross-point structure in which no read switching element is used for each cell, in the data read, the first read current Ir1 is supplied to the write word line WWLn corresponding to a selected cell SC to apply a magnetic field to the GMR element of the selected cell SC. In this state, the second read current Ir2 is supplied from the bit line BL to a read word line RWLn through the read line RLn to further apply a magnetic field to the GMR element of the selected cell SC. The difference between the current Ir2 when the first read current Ir1 is supplied to the write word line WWLn and that when the first read current Ir1 is not supplied is read. Depending on whether the resistance value of the GMR element decreases or increases, discrimination between "1" and "0" data can be done.

As described above, in the sixth embodiment, the memory cells have the cross-point structure. Hence, the density of the cells can be increased. Simultaneously, the read operation speed can be increased by executing the data read in one cycle.

[7] Seventh Embodiment

The seventh embodiment will exemplify a so-called 1 Tr+1 MTJ magnetic random access memory having one transistor and one MTJ element in each cell. A transistor is used as a read switching element, but a diode may be used instead.

[7-1] Structure

Figure 83:
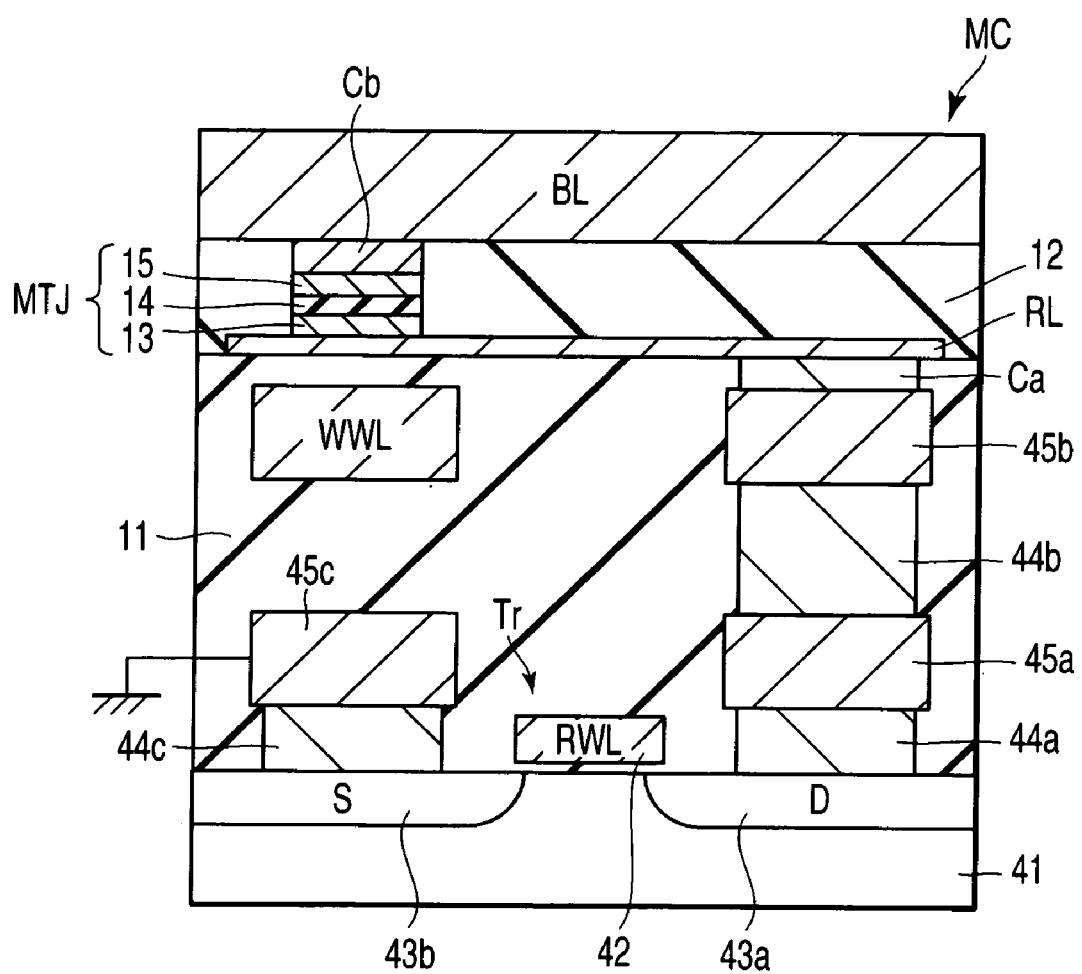
FIG. 83 is a sectional view showing a magnetic random access memory according to the seventh embodiment of the present invention.

FIG. 83 is a sectional view showing a magnetic random access memory according to the seventh embodiment of the present invention. The structure of the magnetic random access memory according to the seventh embodiment will be described below.

As shown in FIG. 83, one cell of the magnetic random access memory according to the seventh embodiment has one MTJ element MTJ and one read transistor Tr.

The MTJ element MTJ is arranged at the intersection of a bit line BL and a write word line WWL between them. A fixed layer 13 of the MTJ element MTJ is connected to a read line RL. A free layer 15 of the MTJ element MTJ is connected to the bit line BL through a contact Cb. The write word line WWL is arranged under the MTJ element MTJn and electrically disconnected from the MTJ element MTJn.

The read line RL is connected to a drain diffusion layer 43a of the read transistor Tr through contacts Ca, 44a, and 44b and wirings 45a and 45b. A source diffusion layer 43b of the read transistor Tr is connected to, e.g., a ground terminal through a contact 44c and wiring 45c. A gate electrode 42 of the read transistor Tr functions as a read word line RWL.

[7-2] Write and Read Operations

The write and read operations of the magnetic random access memory according to the seventh embodiment will be described below for each of a bit line easy axis type and word line easy axis type.

[7-2a] Bit Line Easy Axis Type

In the bit line easy axis type, the direction of the magnetic field generated by the bit line current turns to the direction of axis of easy magnetization of the MTJ element. More specifically, the direction of axis of easy magnetization of the MTJ element is almost parallel to the running direction of the write word line WWL. The direction of axis of hard magnetization of the MTJ element is almost parallel to the running direction of the bit line BL.

A) Write Operation

Figure 84:
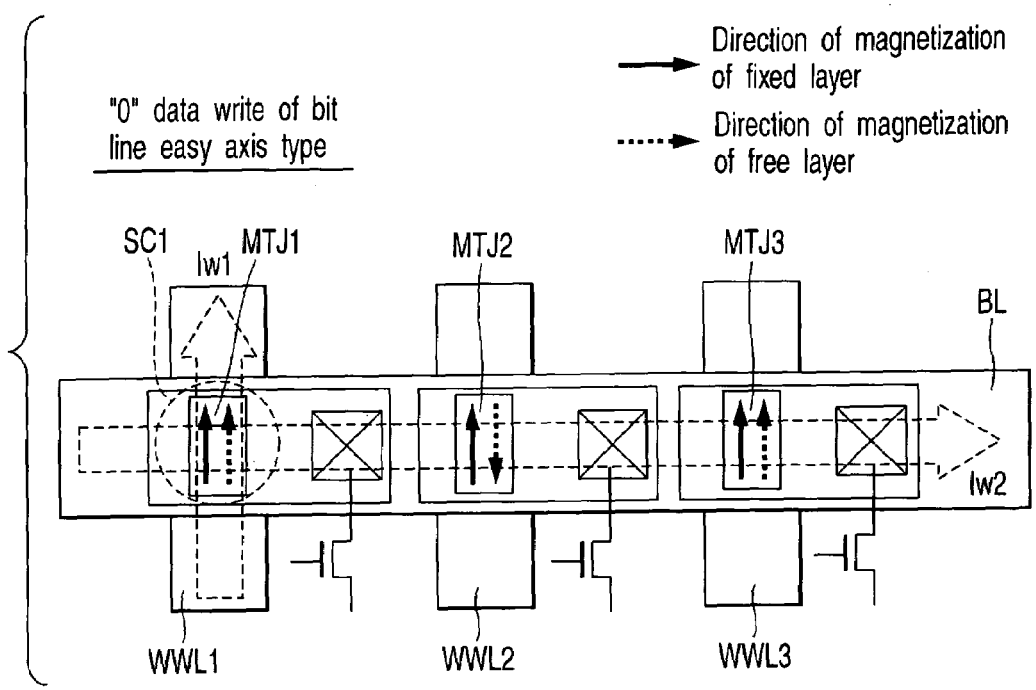
FIG. 84 is a schematic plan view of cells in the "0" data write of a bit line easy axis type according to the seventh embodiment of the present invention.

FIG. 84 is a schematic plan view of cells in the "0" data write of the bit line easy axis type according to the seventh embodiment of the present invention. The "0" data write operation of the bit line easy axis type will be described below.

A write word line WWL1 and bit line BL are selected. First and second write currents Iw1 and Iw2 are supplied to the write word line WWL1 and bit line BL, respectively. A synthetic field generated by the first and second write currents Iw1 and Iw2 is applied to an MTJ element MTJ1 located at the cross point between the write word line WWL1 and the bit line BL. As a result, the magnetization directions of the fixed layer 13 and free layer 15 of the MTJ element MTJ1 become parallel to each other, and data is written in the MTJ element MTJ1. The state in which the magnetization directions are parallel is defined as a state in which "0" data is written.

Figure 85:
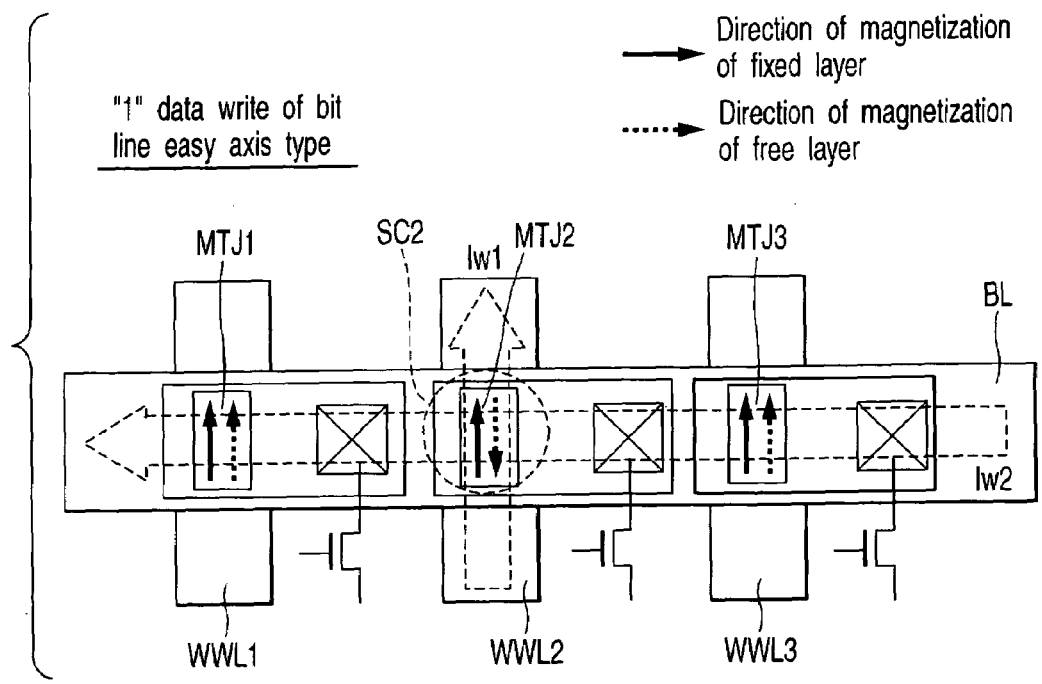
FIG. 85 is a schematic plan view of cells in the "1" data write of the bit line easy axis type according to the seventh embodiment of the present invention.

FIG. 85 is a schematic plan view of cells in the "1" data write of the bit line easy axis type according to the seventh embodiment of the present invention. The "1" data write operation of the bit line easy axis type will be described below.

A write word line WWL2 and bit line BL are selected. The first and second write currents Iw1 and Iw2 are supplied to the write word line WWL2 and bit line BL, respectively. A synthetic field generated by the first and second write currents Iw1 and Iw2 is applied to an MTJ element MTJ2 located at the cross point between the write word line WWL2 and the bit line BL. As a result, the magnetization directions of the fixed layer 13 and free layer 15 of the MTJ element MTJ2 become anti-parallel to each other, and data is written in the MTJ element MTJ2. The state in which the magnetization directions are anti-parallel is defined as a state in which "1" data is written.

In the example of this embodiment in which the magnetization of the fixed layer 13 is fixed upward on the drawing surface, to write "0" data, the second write current Iw2 is supplied to the bit line BL from the left to the right on the drawing surface (FIG. 84). To write "1" data, the second write current Iw2 is supplied to the bit line BL from the right to the left on the drawing surface (FIG. 85). When the second write current Iw2 is supplied in reverse directions in the above-described way, binary data can selectively be written. The first write current Iw1 can be supplied to the write word lines WWL1 and WWL2 either from the lower side to the upper side or from the upper side to the lower side on the drawing surface.

B) Read Operation

Figure 86:
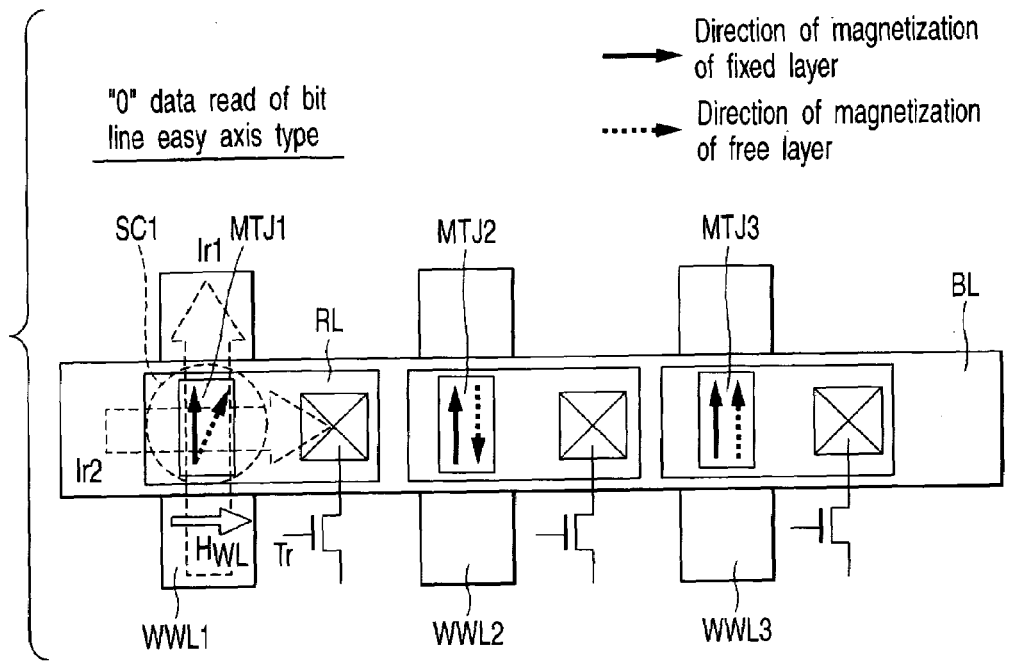
FIG. 86 is a schematic plan view of cells in the "0" data read of the bit line easy axis type according to the seventh embodiment of the present invention.

FIG. 86 is a schematic plan view of cells in the "0" data read of the bit line easy axis type according to the seventh embodiment of the present invention. The "0" data read operation of the bit line easy axis type will be described below with reference to FIG. 86.

The read transistor Tr is turned on to supply a second read current Ir2 from the bit line BL to the current path of the transistor Tr through the read line RL. After that, when a first read current Ir1 is supplied to the write word line WWL1, a magnetic field $H_{WL}$ generated by the first read current Ir1 is applied to the MTJ element MTJ1. As a result, only the magnetization of the free layer 15 of the MTJ element MTJ1 reacts and rotates halfway. Before the read, the magnetization of the MTJ element MTJ1 is in the parallel state. However, while the first read current Ir1 flows, the magnetization of the MTJ element MTJ1 is not in the parallel state (the magnetizations of the fixed layer 13 and free layer 15 tilt from the parallel state). Since the parallel state with the lowest resistance is lost in the MTJ element MTJ1, the resistance value of the MTJ element MTJ1 increases only while the first read current Ir1 flows.

The difference between a current value I when only the second read current Ir2 flows and a current value I' of the second read current Ir2 when the first and second read currents Ir1 and Ir2 flow simultaneously is read. When the current value I' of the second read current Ir2 is smaller than the current value I, i.e., when the resistance value of the MTJ element MTJ1 increases, it can be determined that "0" data is stored in a selected cell SC1.

When the first read current Ir1 supplied to the write word line WWL1 is turned off, the magnetization of the free layer 15 of the MTJ element MTJ1 returns to the initial state (parallel state in FIG. 84) again.

Figure 87:
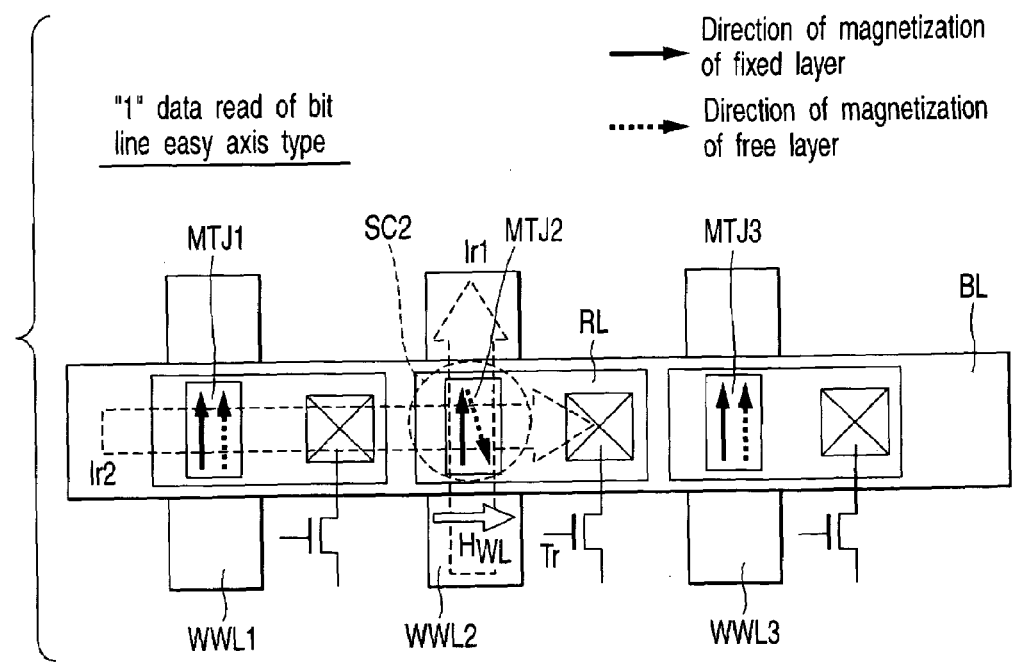
FIG. 87 is a schematic plan view of cells in the "1" data read of the bit line easy axis type according to the seventh embodiment of the present invention.

FIG. 87 is a schematic plan view of cells in the "1" data read of the bit line easy axis type according to the seventh embodiment of the present invention. The "1" data read operation of the bit line easy axis type will be described below with reference to FIG. 87.

The read transistor Tr is turned on to supply the second read current Ir2 from the bit line BL to the current path of the transistor Tr through the read line RL. After that, when the first read current Ir1 is supplied to the write word line WWL2, the magnetic field $H_{WL}$ generated by the first read current Ir1 is applied to the MTJ element MTJ2. As a result, only the magnetization of the free layer 15 of the MTJ element MTJ2 reacts and rotates halfway. Before the read, the magnetization of the MTJ element MTJ2 is in the anti-parallel state. However, while the first read current Ir1 flows, the magnetization of the MTJ element MTJ2 is not in the anti-parallel state (the magnetizations of the fixed layer 13 and free layer 15 tilt from the anti-parallel state). Since the anti-parallel state with the highest resistance is lost in the MTJ element MTJ2, the resistance value of the MTJ element MTJ2 decreases only while the first read current Ir1 flows.

The difference between the current value I when only the second read current Ir2 flows and the current value I' of the second read current Ir2 when the first and second read currents Ir1 and Ir2 flow simultaneously is read. When the current value I' of the second read current Ir2 is larger than the current value I, i.e., when the resistance value of the MTJ element MTJ1 decreases, it can be determined that "1" data is stored in a selected cell SC2.

When the first read current Ir1 supplied to the write word line WWL2 is turned off, the magnetization of the free layer 15 of the MTJ element MTJ2 returns to the initial state (anti-parallel state in FIG. 85) again.

[7-2b] Word Line Easy Axis Type

In the word line easy axis type, the direction of the magnetic field generated by the word line current turns to the direction of axis of easy magnetization of the MTJ element. More specifically, the direction of axis of easy magnetization of the MTJ element is almost parallel to the running direction of the bit line BL. The direction of axis of hard magnetization of the MTJ element is almost parallel to the running direction of the write word line WWL.

A) Write Operation

Figure 88:
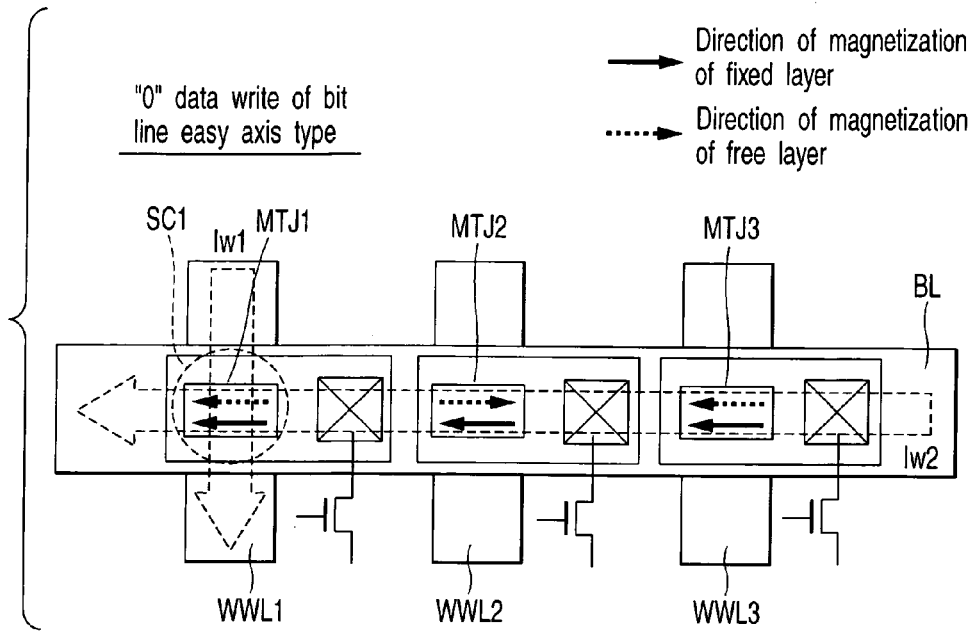
FIG. 88 is a schematic plan view of cells in the "0" data write of a word line easy axis type according to the seventh embodiment of the present invention.

FIG. 88 is a schematic plan view of cells in the "0" data write of the word line easy axis type according to the seventh embodiment of the present invention. The "0" data write operation of the word line easy axis type will be described below.

The write word line WWL1 and bit line BL are selected. The first and second write currents Iw1 and Iw2 are supplied to the write word line WWL1 and bit line BL, respectively. A synthetic field generated by the first and second write currents Iw1 and Iw2 is applied to the MTJ element MTJ1 located at the cross point between the write word line WWL1 and the bit line BL. As a result, the magnetization directions of the fixed layer 13 and free layer 15 of the MTJ element MTJ1 become parallel to each other, and data is written in the MTJ element MTJ1. The state in which the magnetization directions are parallel is defined as a state in which "0" data is written.

Figure 89:
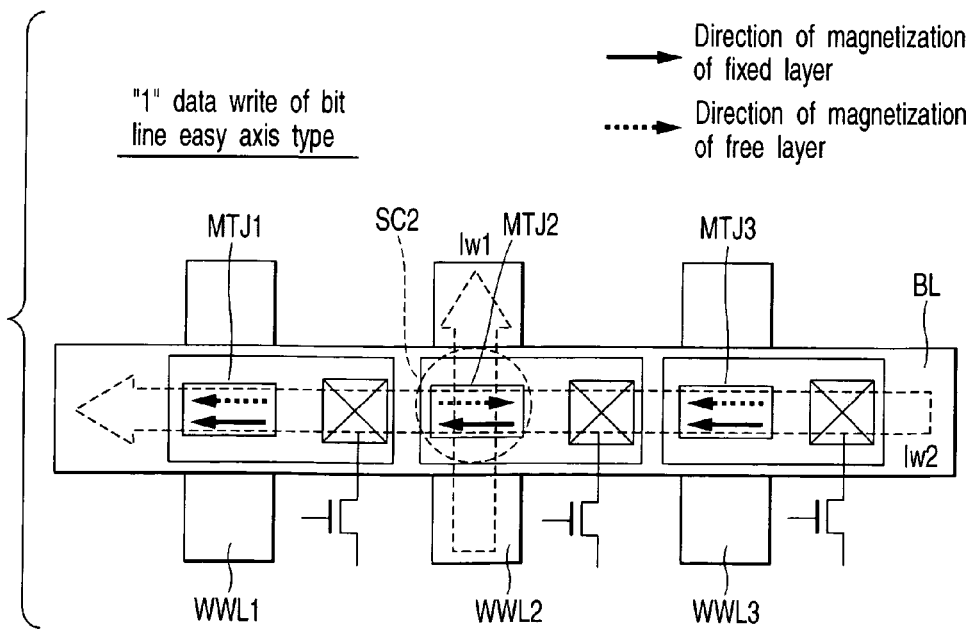
FIG. 89 is a schematic plan view of cells in the "1" data write of the word line easy axis type according to the seventh embodiment of the present invention.

FIG. 89 is a schematic plan view of cells in the "1" data write of the word line easy axis type according to the seventh embodiment of the present invention. The "1" data write operation of the word line easy axis type will be described below.

The write word line WWL2 and bit line BL are selected. The first and second write currents Iw1 and Iw2 are supplied to the write word line WWL2 and bit line BL, respectively. A synthetic field generated by the first and second write currents Iw1 and Iw2 is applied to the MTJ element MTJ2 located at the cross point between the write word line WWL2 and the bit line BL. As a result, the magnetization directions of the fixed layer 13 and free layer 15 of the MTJ element MTJ2 become anti-parallel to each other, and data is written in the MTJ element MTJ2. The state in which the magnetization directions are anti-parallel is defined as a state in which "1" data is written.

In the bit line easy axis type, the direction of the second write current Iw2 to be supplied to the bit line BL is changed in accordance with write data. In the word line easy axis type, the direction of the first write current Iw1 to be supplied to the write word line WWL is changed in accordance with write data. More specifically, in the example of this embodiment in which the magnetization of the fixed layer 13 is fixed leftward on the drawing surface, to write "0" data, the first write current Iw1 is supplied to the write word line WWL from the upper side to the lower side on the drawing surface (FIG. 88). To write "1" data, the first write current Iw1 is supplied to the write word line WWL from the lower side to the upper side on the drawing surface (FIG. 89). When the first write current Iw1 is supplied in reverse directions in the above-described way, binary data can selectively be written. The second write current Iw2 can be supplied to the bit line BL either from the right to the left or from the left to the right on the drawing surface.

B) Read Operation

In the read operation of this embodiment, discrimination between "1" and "0" data is done on the basis of a change in element resistance R like a type A, B, C, or D shown in FIG. 16, as in the first embodiment. The read operation will be described below in detail.

(Type A)

Figure 90:
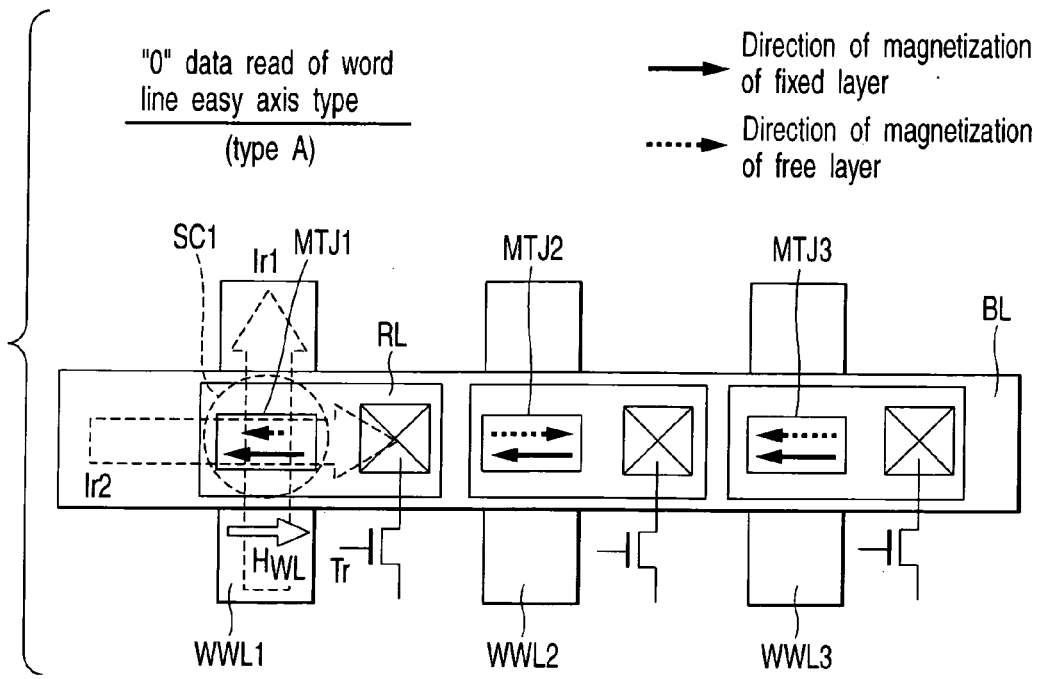
FIG. 90 is a schematic plan view of cells in the "0" data read of type A of the word line easy axis type according to the seventh embodiment of the present invention.

FIG. 90 is a schematic plan view of cells in the "0" data read of type A of the word line easy axis type according to the seventh embodiment of the present invention. The read operation of type A will be described below with reference to FIG. 90.

The read transistor Tr is turned on to supply the second read current Ir2 from the bit line BL to the current path of the transistor Tr through the read line RL. After that, the first read current Ir1 is supplied to the write word line WWL1 in the "1" data write direction (from the lower side to the upper side on the drawing surface). The magnetic field $H_{WL}$ generated by the first read current Ir1 is applied to the MTJ element MTJ1. As a result, the magnetization of the free layer 15 of the MTJ element MTJ1 becomes small. Since the parallel state with the lowest resistance weakens in the MTJ element MTJ1, the resistance value of the MTJ element MTJ1 increases only while the first read current Ir1 flows.

The difference between the current value I when only the second read current Ir2 flows and the current value I' of the second read current Ir2 when the first and second read currents Ir1 and Ir2 flow simultaneously is read. When the current value I' of the second read current Ir2 is smaller than the current value I, i.e., when the resistance value of the MTJ element MTJ1 increases, it can be determined that "0" data is stored in the selected cell SC1.

When the first read current Ir1 supplied to the write word line WWL1 is turned off, the magnetization of the free layer 15 of the MTJ element MTJ1 returns to the initial state (parallel state in FIG. 88) again.

(Type B)

Figure 91:
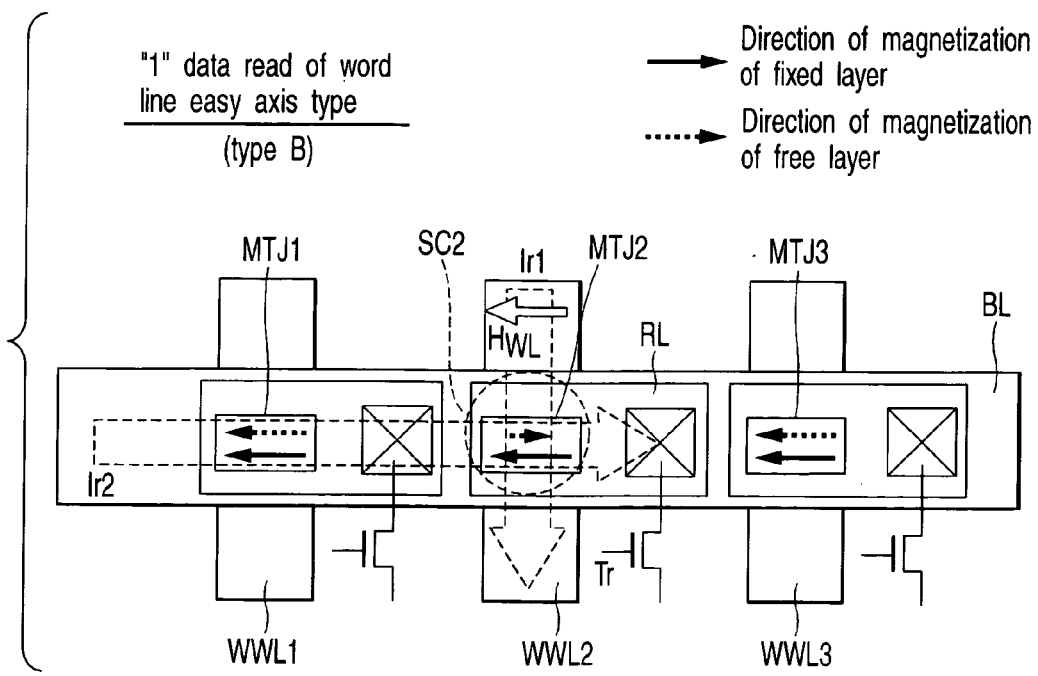
FIG. 91 is a schematic plan view of cells in the "1" data read of type B of the word line easy axis type according to the seventh embodiment of the present invention.

FIG. 91 is a schematic plan view of cells in the "1" data read of type B of the word line easy axis type according to the seventh embodiment of the present invention. The read operation of type B will be described below with reference to FIG. 91.

The read transistor Tr is turned on to supply the second read current Ir2 from the bit line BL to the current path of the transistor Tr through the read line RL. After that, the first read current Ir1 is supplied to the write word line WWL2 in the "0" data write direction (from the upper side to the lower side on the drawing surface). The magnetic field $H_{WL}$ generated by the first read current Ir1 is applied to the MTJ element MTJ2. As a result, the magnetization of the free layer 15 of the MTJ element MTJ2 becomes small. Since the anti-parallel state with the highest resistance weakens in the MTJ element MTJ2, the resistance value of the MTJ element MTJ2 decreases only while the first read current Ir1 flows.

The difference between the current value I when only the second read current Ir2 flows and the current value I' of the second read current Ir2 when the first and second read currents Ir1 and Ir2 flow simultaneously is read. When the current value I' of the second read current Ir2 is larger than the current value I, i.e., when the resistance value of the MTJ element MTJ2 decreases, it can be determined that "1" data is stored in the selected cell SC2.

When the first read current Ir1 supplied to the write word line WWL2 is turned off, the magnetization of the free layer 15 of the MTJ element MTJ2 returns to the initial state (anti-parallel state in FIG. 89) again.

(Type C)

Figure 92:
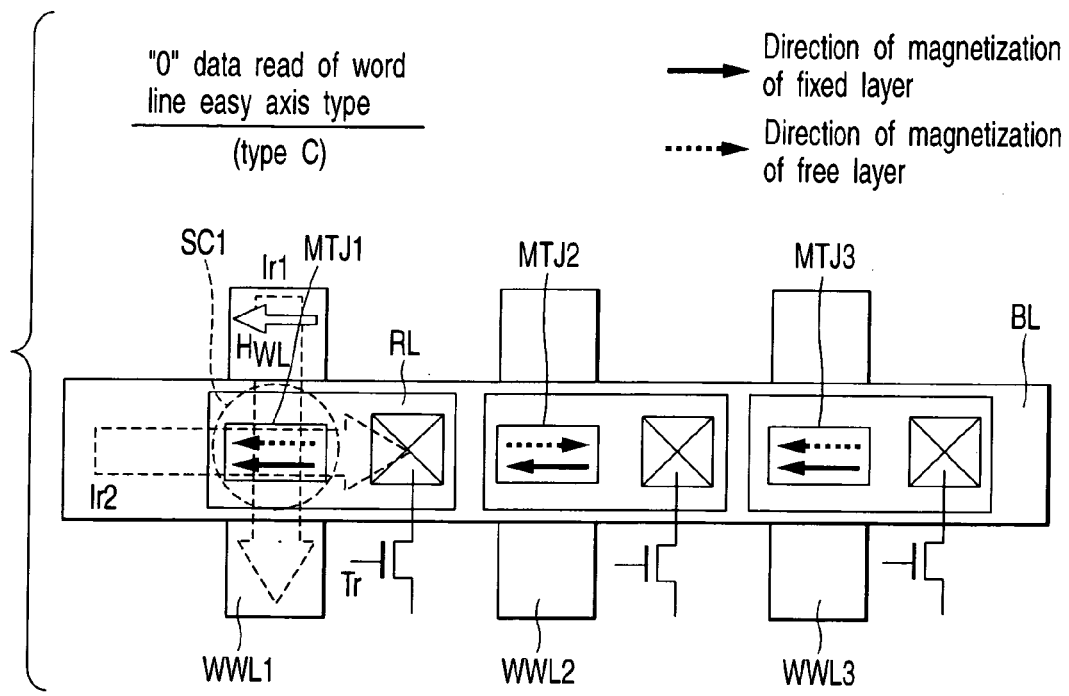
FIG. 92 is a schematic plan view of cells in the "0" data read of type C of the word line easy axis type according to the seventh embodiment of the present invention.

FIG. 92 is a schematic plan view of cells in the "0" data read of type C of the word line easy axis type according to the seventh embodiment of the present invention. The read operation of type C will be described below with reference to FIG. 92.

The read transistor Tr is turned on to supply the second read current Ir2 from the bit line BL to the current path of the transistor Tr through the read line RL. After that, the first read current Ir1 is supplied to the write word line WWL1 in the "0" data write direction (from the upper side to the lower side on the drawing surface). The magnetic field $H_{WL}$ generated by the first read current Ir1 is applied to the MTJ element MTJ1. As a result, the magnetization of the free layer 15 of the MTJ element MTJ1 becomes large, though the parallel state of magnetizations is maintained. Hence, even when the first read current Ir1 flows, the resistance value of the MTJ element MTJ1 does not change.

The difference between the current value I when only the second read current Ir2 flows and the current value I' of the second read current Ir2 when the first and second read currents Ir1 and Ir2 flow simultaneously is read. When the current value I' of the second read current Ir2 almost equals the current value I, i.e., when the resistance value of the MTJ element MTJ2 rarely changes, it can be determined that "0" data is stored in the selected cell SC1.

When the first read current Ir1 supplied to the write word line WWL1 is turned off, the magnetization of the free layer 15 of the MTJ element MTJ1 returns to the initial state (parallel state in FIG. 88) again.

(Type D)

Figure 93:
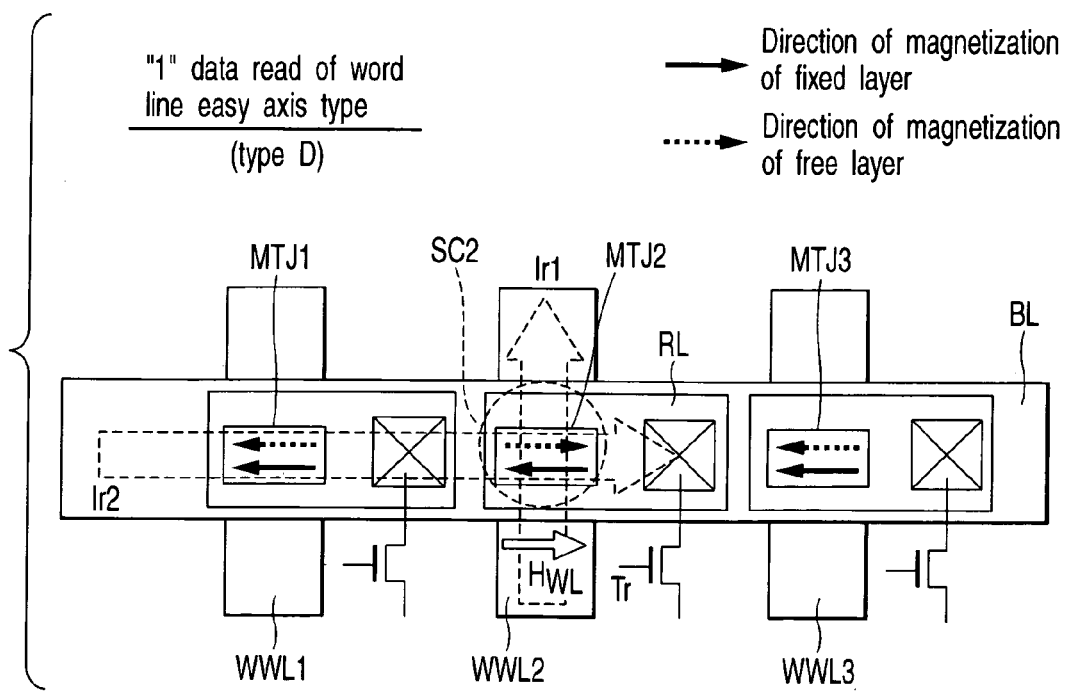
FIG. 93 is a schematic plan view of cells in the "1" data read of type D of the word line easy axis type according to the seventh embodiment of the present invention.

FIG. 93 is a schematic plan view of cells in the "1" data read of type D of the word line easy axis type according to the seventh embodiment of the present invention. The read operation of type D will be described below with reference to FIG. 93.

The read transistor Tr is turned on to supply the second read current Ir2 from the bit line BL to the current path of the transistor Tr through the read line RL. After that, the first read current Ir1 is supplied to the write word line WWL2 in the "1" data write direction (from the lower side to the upper side on the drawing surface). The magnetic field $H_{WL}$ generated by the first read current Ir1 is applied to the MTJ element MTJ2. As a result, the magnetization of the free layer 15 of the MTJ element MTJ2 becomes large, though the parallel state of magnetizations is maintained. Hence, even when the first read current Ir1 flows, the resistance value of the MTJ element MTJ2 does not change.

The difference between the current value I when only the second read current Ir2 flows and the current value I' of the second read current Ir2 when the first and second read currents Ir1 and Ir2 flow simultaneously is read. When the current value I' of the second read current Ir2 almost equals the current value I, i.e., when the resistance value of the MTJ element MTJ2 rarely changes, it can be determined that "1" data is stored in the selected cell SC2.

When the first read current Ir1 supplied to the write word line WWL2 is turned off, the magnetization of the free layer 15 of the MTJ element MTJ2 returns to the initial state (anti-parallel state in FIG. 89) again.

[7-2c] Summary of Write and Read Operations

Figure 94:
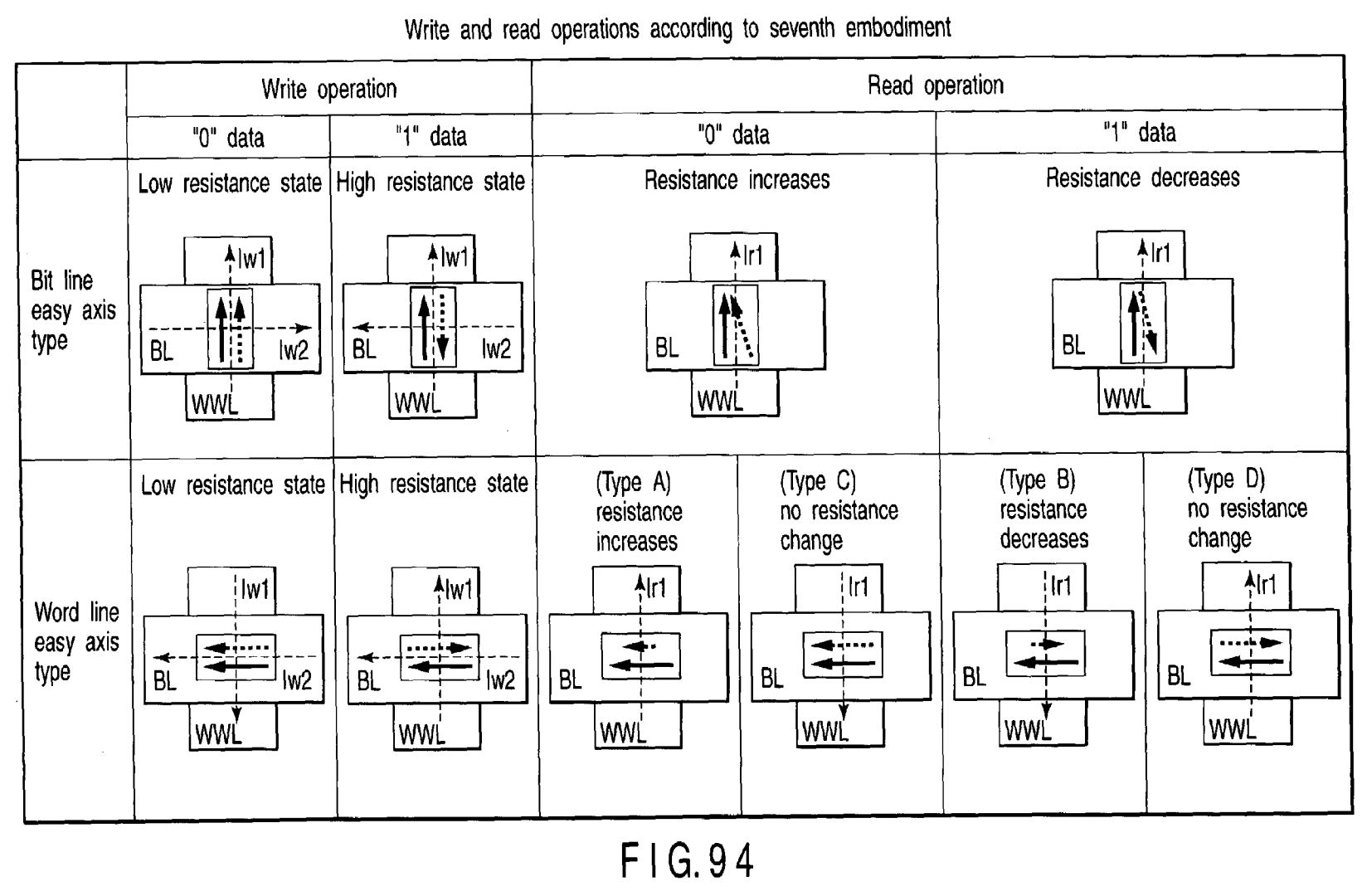

FIG. 94 is a schematic list of the write and read operations according to the seventh embodiment of the present invention. As shown in FIG. 94, the principle of the write and read operation of the seventh embodiment is the same as in the first embodiment (FIG. 21A), and a description thereof will be omitted. The write and read current pulses according to the seventh embodiment are also the same as in the first embodiment (FIG. 21B), and a description thereof will be omitted.

[7-3] Effect

According to the above-described seventh embodiment, in the 1 Tr+1 MTJ cell, in the data read, the first read current Ir1 is supplied to the write word line WWLn corresponding to a selected cell SC while the second read current Ir2 is supplied from the bit line BL to the current path of the transistor Tr through the read line RL, thereby applying a magnetic field to the MTJ element of the selected cell SC. The difference between the current Ir2 when the first read current Ir1 is supplied to the write word line WWLn and that when the first read current Ir1 is not supplied is read. Discrimination between "1" and "0" data can be done by determining whether the resistance value of the MTJ element decreases or increases. Hence, the same read method as in the above-described embodiments can be applied to even the 1 Tr+1 MTJ cell of the seventh embodiment.

In this embodiment, a signal change in one cycle is read. The signal variation with respect to the reference cell need not be taken into consideration. A high-speed read operation can be executed even in a cell with a smaller signal. Hence, the degree of freedom in material selection or device size in designing the cell increases. Since a comparative read of a self change is executed, the reference cell can be omitted. With these effects, the cell efficiency can be increased, and the scale of cells can be increased.

[8] Eighth Embodiment

In the eighth embodiment, the MTJ element and GMR element used in the first to seventh embodiments will be described.

An MTJ element and GMR element have similar basic structures because a nonmagnetic layer is sandwiched between two ferromagnetic layers. A large difference between them is that the material of the nonmagnetic layer is a dielectric material (insulating material) or metal material. More specifically, the MTJ element and GMR element have the following structures.

[8-1] MTJ Element

An MTJ element includes a fixed layer (antiferromagnetic layer) 13 whose magnetization direction is fixed, a tunnel barrier layer (nonmagnetic layer) 14, and a free layer (soft magnetic layer) 15 whose magnetization direction reverses because the magnetization reversal threshold value is relatively small.

A) Single Tunnel Junction Structure

Figure 95A:
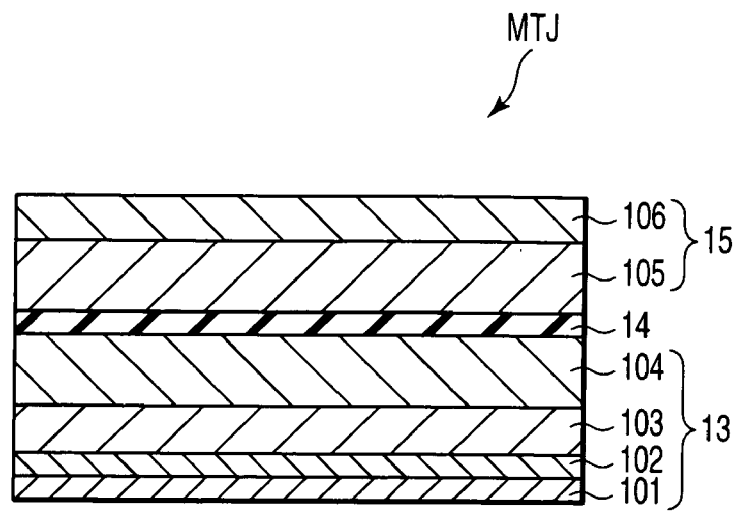
FIGS. 95A and 95B are sectional views of MTJ elements having single tunnel junction structures according to the eighth embodiment of the present invention.
Figure 95B:
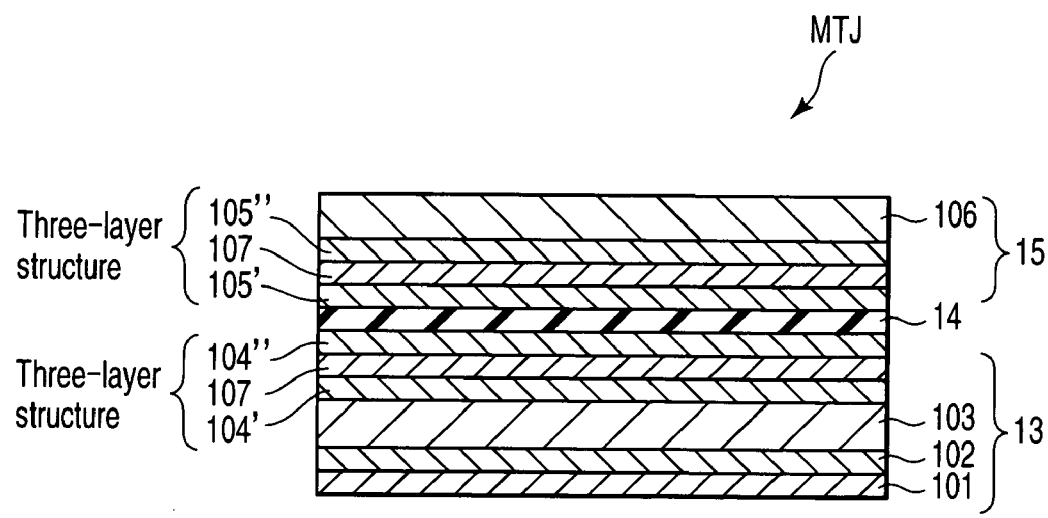

FIGS. 95A and 95B are sectional views of MTJ elements having single tunnel junction structures according to the eighth embodiment of the present invention. When an MTJ element has a single tunnel junction structure including one tunnel barrier layer, the following structures are available.

The MTJ element having the single tunnel junction structure shown in FIG. 95A includes the fixed layer 13, tunnel barrier layer 14, and free layer 15. The fixed layer 13 is formed by sequentially stacking a lower contact layer (lower electrode layer) 101, buffer layer (e.g., ferromagnetic layer) 102, antiferromagnetic layer 103, and ferromagnetic layer 104. The tunnel barrier layer 14 is formed on the fixed layer 13. The free layer 15 is formed by sequentially stacking a free ferromagnetic layer 105 and contact layer 106 on the tunnel barrier layer 14.

The MTJ element having the single tunnel junction structure shown in FIG. 95B includes the fixed layer 13, tunnel barrier layer 14, and free layer 15. The fixed layer 13 is formed by sequentially stacking the lower contact layer 101, buffer layer 102, antiferromagnetic layer 103, ferromagnetic layer 104', nonmagnetic layer 107, and ferromagnetic layer 104". The tunnel barrier layer 14 is formed on the fixed layer 13. The free layer 15 is formed by sequentially stacking a ferromagnetic layer 105', nonmagnetic layer 107, ferromagnetic layer 105", and contact layer 106 on the tunnel barrier layer 14.

In the MTJ element shown in FIG. 95B, a three-layer structure including the ferromagnetic layer 104', nonmagnetic layer 107, and ferromagnetic layer 104" in the fixed layer 13 and a three-layer structure including the ferromagnetic layer 105', nonmagnetic layer 107, and ferromagnetic layer 105" in the free layer 15 are introduced. Hence, a cell structure which suppresses magnetic poles in the ferromagnetic structure and is more suitable for micropatterning than the MTJ element shown in FIG. 95A can be provided.

B) Double Tunnel Junction Structure

FIGS. 96A and 96B are sectional views of MTJ elements having double tunnel junction structures according to the eighth embodiment of the present invention. When an MTJ element has a double tunnel junction structure including two tunnel barrier layers, the following structures are available.

The MTJ element having the double tunnel junction structure shown in FIG. 96A includes a first fixed layer 13a, first tunnel barrier layer 14a, free layer 15, second tunnel barrier layer 14b, and second fixed layer 13b. The first fixed layer 13a is formed by sequentially stacking the lower contact layer 101, buffer layer 102, antiferromagnetic layer 103, and ferromagnetic layer 104. The first tunnel barrier layer 14a is formed on the first fixed layer 13a. The free layer 15 is formed on the first tunnel barrier layer 14a. The second tunnel barrier layer 14b is formed on the free layer 15. The second fixed layer 13b is formed by sequentially stacking the ferromagnetic layer 104, antiferromagnetic layer 103, buffer layer 102, and contact layer 106 on the second tunnel barrier layer 14b.

The MTJ element having the double tunnel junction structure shown in FIG. 96B includes the first fixed layer 13a, first tunnel barrier layer 14a, free layer 15, second tunnel barrier layer 14b, and second fixed layer 13b. The first fixed layer 13a is formed by sequentially stacking the lower contact layer 101, buffer layer 102, antiferromagnetic layer 103, and ferromagnetic layer 104. The first tunnel barrier layer 14a is formed on the first fixed layer 13a. The free layer 15 has a three-layer structure formed by sequentially stacking a ferromagnetic layer 15', nonmagnetic layer 107, and ferromagnetic layer 15" on the first tunnel barrier layer 14a. The second tunnel barrier layer 14b is formed on the free layer 15. The second fixed layer 13b is formed by sequentially stacking a ferromagnetic layer 104', nonmagnetic layer 107, ferromagnetic layer 104", antiferromagnetic layer 103, buffer layer 102, and contact layer 106 on the second tunnel barrier layer 14b.

In the MTJ element shown in FIG. 96B, a three-layer structure including the ferromagnetic layer 15', nonmagnetic layer 107, and ferromagnetic layer 15" in the free layer 15 and a three-layer structure including the ferromagnetic layer 104', nonmagnetic layer 107, and ferromagnetic layer 104" in the second fixed layer 13b are introduced. Hence, a cell structure which suppresses magnetic poles in the ferromagnetic structure and is more suitable for micropatterning than the MTJ element shown in FIG. 96A can be provided.

In the MTJ element having the double tunnel junction structure, the degradation in magneto resistive (MR) ratio (resistance change ratio between "1" and "0" states) in applying the same external bias is smaller than in the MTJ element having the single tunnel junction structure, and an operation with a higher bias is possible. That is, the double tunnel junction structure is advantageous when information in a cell is to be read out.

C) Materials of MTJ Element

The MTJ element having the single tunnel junction structure or double tunnel junction structure is formed by using, e.g., the following materials.

For the fixed layers 13, 13a, and 13b and free layer 15, for example, a transition metal magnetic element (Fe, Co, or Ni), an alloy thereof (e.g., CoFe, CoFeNi, or NiFe), magnetite having a high spin polarizability, an oxide such as $CrO_2$ or $RXMnO_{3-Y}$ (R: rare earth, X: Ca, Ba, or Sr), or a Heusler alloy such as NiMnSb or PtMnSb is preferably used. The magnetic materials may contain a small amount of nonmagnetic element such as Ag, Cu, Au, Al, Mg, Si, Bi, Ta, B, C, O, N, Pd, Pt, Zr, Ir, W, Mo, or Nb as long as the ferromagnetism is not lost.

For the antiferromagnetic layer 103 which forms part of the fixed layers 13, 13a, and 13b, Fe—Mn, Pt—Mn, Pt—Cr—Mn, Ni—Mn, Ir—Mn, NiO, or $Fe_2O_3$ is preferably used.

For the tunnel barrier layers 14, 14a, and 14b, various dielectric materials such as $Al_2O_3$, $SiO_2$, MgO, AlN, $Bi_2O_3$, $MgF_2$, $CaF_2$, $SrTiO_2$, and $AlLaO_3$ can be used. These dielectric materials may contain oxygen, nitrogen, or fluorine defects.

D) Other

The MTJ element has, e.g., a rectangular shape. The longitudinal direction of the rectangle is the direction of axis of easy magnetization. The direction perpendicular to the longitudinal direction is the direction of axis of hard magnetization. The axis of easy magnetization of the MTJ element is directed in a direction perpendicular to the running direction of the write wiring through which a current flows in both directions to change the direction of the current in accordance with data to be written so that the magnetization is reversed in the data write. In the above embodiments, the bit line BL is designed to flow the write current in both directions. For this reason, the axis of easy magnetization of the MTJ element is directed in the direction perpendicular to the running direction (X direction) of the bit line BL, i.e., in the running direction (Y direction) of the word line. In the above embodiments, the axis of easy magnetization of the MTJ element can also be directed in the running direction (X direction) of the bit line BL.

In the MTJ element of the above embodiments, the free layer 15 is formed on the upper side of the fixed layer 13 so that the fixed layer 13 is arranged on the word line side, and the free layer 15 is arranged on the bit line side. However, the present invention is not limited to this. More specifically, the positions of the fixed layer 13 and free layer 15 may be replaced so that the free layer 15 is arranged on the word line side, and the fixed layer 13 is arranged on the bit line side.

[8-2] GMR Element

A) First Structure

In the second and fifth embodiments, a GMR element with a first structure is used. The GMR element with the first structure includes a free layer (soft magnetic layer) 21 whose magnetization direction reverses because the magnetization reversal threshold value is relatively small, a conductive layer (nonmagnetic layer) 22, and a free layer (soft magnetic layer) 23 whose magnetization direction reverses because the magnetization reversal threshold value is relatively small. In the first structure, since the conductive layer 22 is sandwiched between the free layers 21 and 23, an antiferromagnetic coupling structure in which the free layers are antiferromagnetically coupled is formed.

B) Second Structure

In the third and sixth embodiments, a GMR element with a second structure is used. The GMR element with the second structure includes a fixed layer (antiferromagnetic layer) 31 whose magnetization direction is fixed, the conductive layer (nonmagnetic layer) 22, and the free layer (soft magnetic layer) 23 whose magnetization direction reverses because the magnetization reversal threshold value is relatively small. The second structure is the same as the structure of the MTJ element except that the nonmagnetic layer is formed from the conductive layer 22.

C) Materials of GMR Element

The fixed layer 31 and free layers 21 and 23 of the GMR element are made of the same materials as those of the fixed layer and free layer of the above-described MTJ element. The conductive layer 22 of the GMR element is made of a metal material such as Cu having a high magnetic resistance at normal room temperature.

[8-3] Planar Shape and Element Characteristic of Element

The planar shape and element characteristic of the element will be described next. The MTJ element will be described here. This also applies to the GMR element.

Figure 98A:
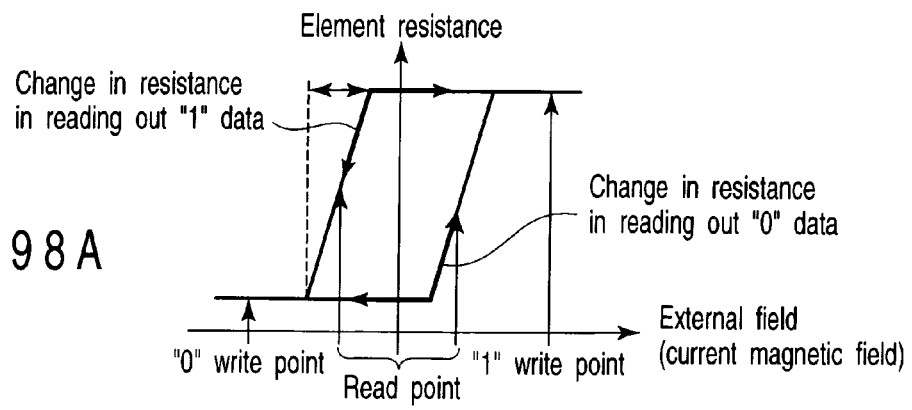
FIG. 98A is a graph showing the hysteresis curve of the MTJ element according to the eighth embodiment of the present invention.
Figure 98B:
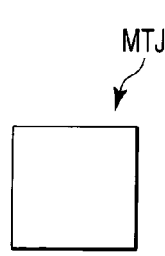
FIGS. 98B and 98C are plan views of MTJ elements which exhibit the characteristic shown in FIG. 98A.
Figure 98C:
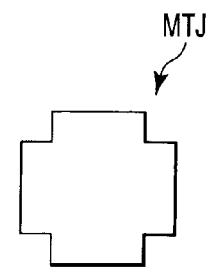
Figure 99A:
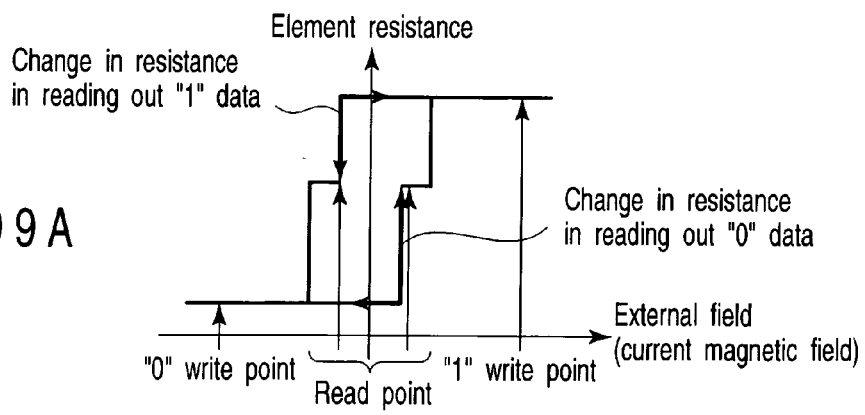
FIG. 99A is a graph showing the hysteresis curve of the MTJ element according to the eighth embodiment of the present invention.
Figure 99B:
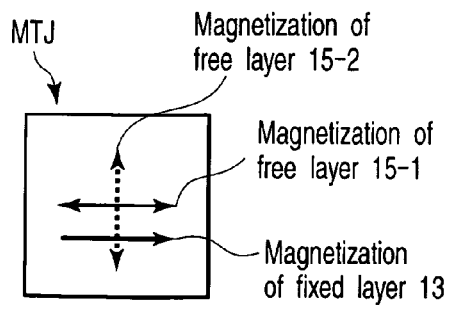
FIGS. 99B and 99C are plan and sectional views of the MTJ element which exhibits the characteristic shown in FIG. 99A.
Figure 99C:
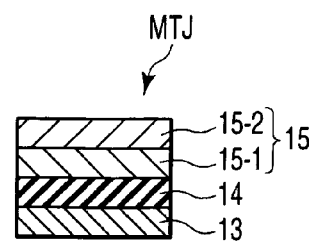

FIG. 97A shows the hysteresis curve of the MTJ element according to the eighth embodiment of the present invention. FIG. 97B is a plan view of the MTJ element which exhibits the characteristic shown in FIG. 97A. FIG. 98A shows the hysteresis curve of the MTJ element according to the eighth embodiment of the present invention. FIGS. 98B and 98C are plan views of MTJ elements which exhibit the characteristic shown in FIG. 98A. FIG. 99A shows the hysteresis curve of the MTJ element according to the eighth embodiment of the present invention. FIGS. 99B and 99C are plan and sectional views of the MTJ element which exhibits the characteristic shown in FIG. 99A.

As shown in FIG. 97B, an MTJ element MTJ has a rectangular shape (elliptical shape) in which one side is longer than the other side. The MTJ element MTJ has a longitudinal direction (direction of axis of hard magnetization) and widthwise direction (direction of axis of easy magnetization). For the MTJ element MTJ, normally, a magnetic field is applied in the longitudinal direction of the MTJ element MTJ during magnetic film formation, thereby giving a shape magnetic anisotropy and strong uniaxial anisotropy to the MTJ element MTJ.

Hence, as shown in FIG. 97A, the change in resistance (to be referred to as an R-H curve hereinafter) with respect to an external field is steep. Hence, it is sometimes difficult to generate an intermediate state between "1" and "0" instead of completely changing the state to "1" or "0" by the external field in the read, as in the embodiments of the present invention.

In this case, the MTJ element MTJ which exhibits a hysteresis curve having the following characteristic is preferably used.

As shown in FIG. 98A, the MTJ element preferably has such a characteristic that the R-H curve is not steep but moderately tilts with respect to the external field. To form the MTJ element MTJ having the characteristic, it is effective to weak the anisotropy of the MTJ element MTJ. More specifically, methods a) to c) are available.

a) The MTJ element MTJ having an aspect ratio of 1 (e.g., square, circle, or regular polygon) is formed to eliminate the shape magnetic anisotropy (FIG. 98B).

b) The external field to be applied to give the uniaxial anisotropy is eliminated in forming the magnetic film.

c) The uniaxial anisotropy is weakened by using the MTJ element MTJ having, e.g., a cross shape (FIG. 98C).

Alternatively, as shown in FIG. 99A, the MTJ element preferably has such a characteristic that the R-H curve has a step. The MTJ element MTJ can have, e.g., the following structures.

As shown in FIGS. 99B and 99C, MTJ element MTJ has the fixed layer 13 whose magnetization direction is fixed, two kinds of free layers 15-1 and 15-2 whose magnetization directions change, and the tunnel barrier layer 14 sandwiched between the fixed layer 13 and the free layer 15-1. The magnetization of one free layer 15-1 is set in the same direction as the fixed layer 13. The magnetization of the other free layer 15-2 is set in a direction changed by 90° from the fixed layer 13. That is, the free layers 15-1 and 15-2 preferably have different uniaxial anisotropies and different magnetization directions. The free layers 15-1 and 15-2 are preferably made of different materials. With this structure, two kinds of stable states can be created, and the read operation of the above-described embodiments can be implemented.

To implement the R-H curve shown in FIG. 99A, for example, the structures shown in FIGS. 100A and 100B, and 101A and 101B may be used.

Figure 100A:
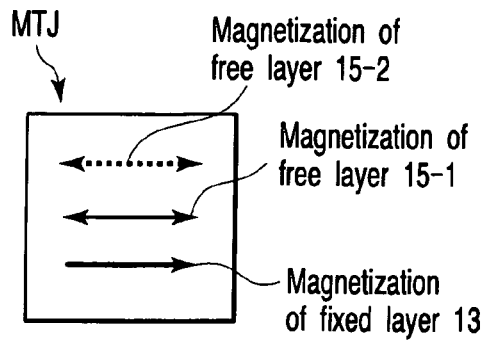
FIGS. 100A and 100B are plan and sectional views of the MTJ element which exhibits the characteristic shown in FIG. 99A.
Figure 100B:
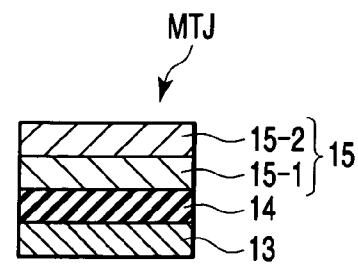

As shown in FIGS. 100A and 100B, the free layers 15-1 and 15-2 may have the same magnetization direction (magnetization direction of the fixed layer 13). In this case, the R-H curve shown in FIG. 99A can be implemented by changing the thickness and material of the free layers 15-1 and 15-2.

Figure 101A:
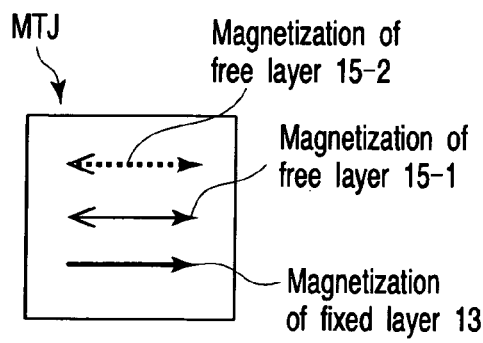
FIGS. 101A and 101B are plan and sectional views of the MTJ element which exhibits the characteristic shown in FIG. 99A.
Figure 101B:
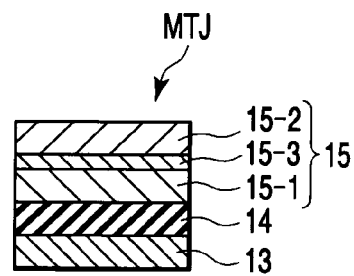

As shown in FIGS. 101A and 101B, a nonmagnetic layer (e.g., Cu) 15-3 may be provided between the free layers 15-1 and 15-2 to ferromagnetically couple them. In this case, the R-H curve shown in FIG. 99A can be implemented by changing the thickness and material of the free layers 15-1 and 15-2.

Figure 102A:
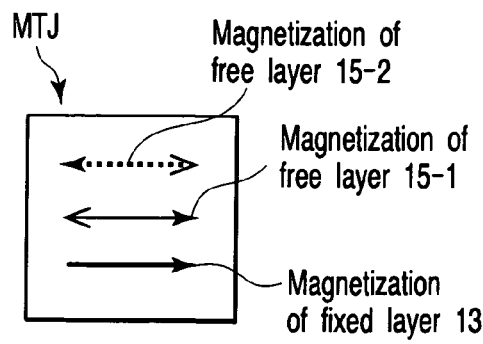
FIGS. 102A and 102B are plan and sectional views of the MTJ element which exhibits the characteristic shown in FIG. 99A.
Figure 102B:
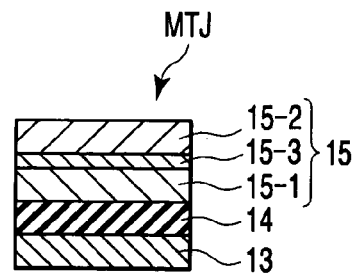
Figure 103:
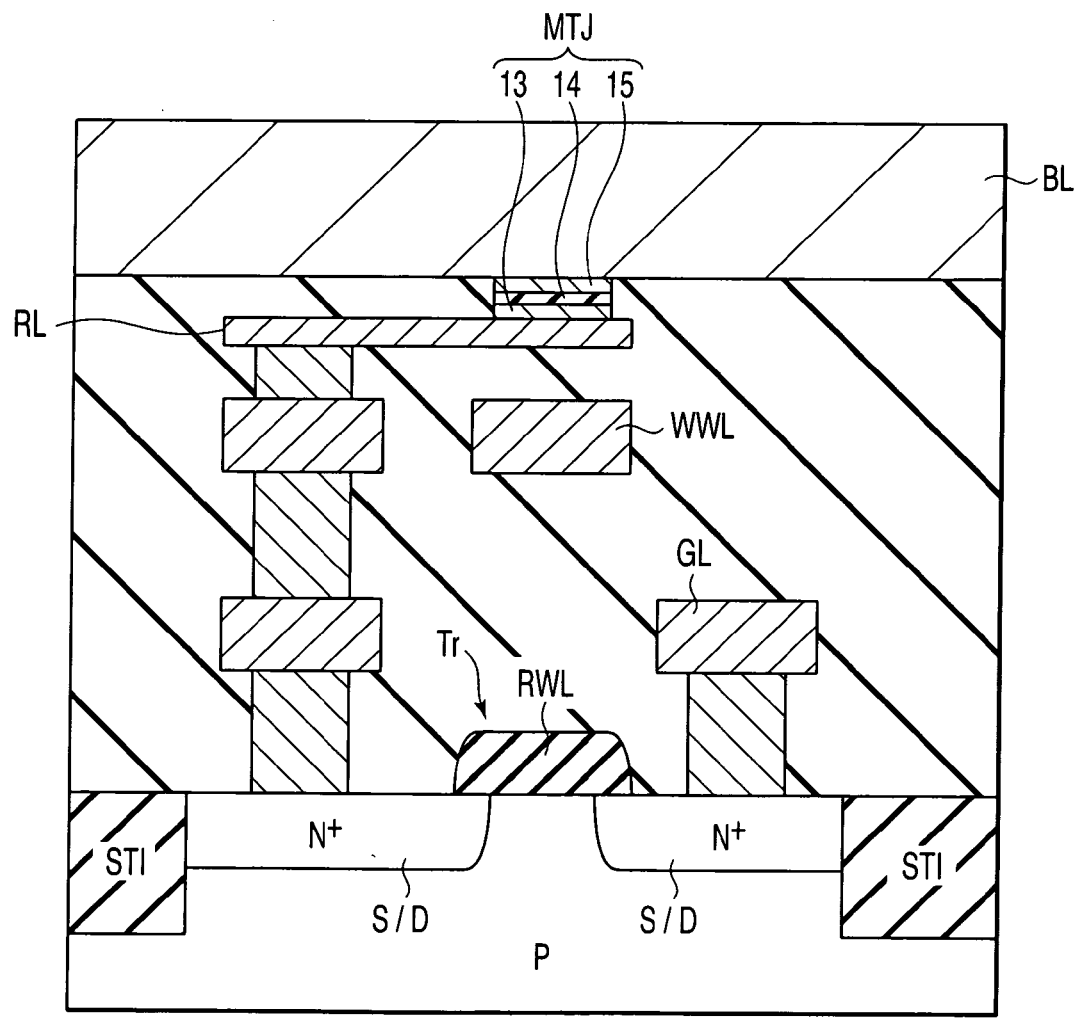
FIG. 103 is a schematic sectional view showing a 1 Tr+1 MTJ memory cell of a conventional magnetic random access memory.

As shown in FIGS. 102A and 102B, the nonmagnetic layer (e.g., Cu) 15-3 may be provided between the free layers 15-1 and 15-2 to antiferromagnetically couple them. In this case, the R-H curve shown in FIG. 99A can be implemented by changing the thickness and material of the free layers 15-1 and 15-2.

In the above-described structures shown in FIGS. 101A and 100B to 102A and 102B, the R-H curve shown in FIG. 98A can also be implemented by changing the thickness and material of the free layers 15-1 and 15-2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data read method of a magnetic random access memory including
   a first wiring which runs in a first direction,
   a plurality of second wirings which run in a second direction different from the first direction, and
   a plurality of magnetoresistive elements which are arranged at intersections of the first wiring and the second wirings between the first wiring and the second wirings and electrically connected to the first wiring, comprising:
   to read out data of a selected element selected from the plurality of magnetoresistive elements, reading a resistance value of the selected element by a second current supplied from the first wiring to the selected element while supplying a first current to a selected wiring selected from the second wirings in correspondence with the selected element.

2. The method according to claim 1, wherein
   the memory further comprises a third wiring which is arranged between the plurality of magnetoresistive elements and the second wirings,
   the plurality of magnetoresistive elements are MTJ elements each of which has a fixed layer, a free layer, and a tunnel barrier layer sandwiched between the fixed layer and the free layer, and
   one of the fixed layer and the free layer is electrically connected to the first wiring, and the other of the fixed layer and the free layer is electrically connected to the third wiring to connect the plurality of magnetoresistive elements in parallel to each other.

3. The method according to claim 2, wherein
   each of the plurality of magnetoresistive elements has an axis of easy magnetization directed in the second direction, and
   the data is discriminated depending on whether the resistance value of the selected element, which is read by using the second current, increases or decreases while a magnetic field generated by the first current is applied to the selected element.

4. The method according to claim 2, wherein
   each of the plurality of magnetoresistive elements has an axis of easy magnetization directed in the first direction,
   when a write current is supplied to the second wiring in a first write direction in writing first data in the selected element, and the write current is supplied to the second wiring in a second write direction in writing second data in the selected element,
   in reading the resistance value of the selected element by using the second current while applying, to the selected element, a magnetic field generated by supplying the first current in the second write direction, the data is determined as the first data when the resistance value increases, and the data is determined as the second data when the resistance value does not change, and
   in reading the resistance value of the selected element by using the second current while applying, to the selected element, a magnetic field generated by supplying the first current in the first write direction, the data is determined as the first data when the resistance value does not change, and the data is determined as the second data when the resistance value decreases.

5. The method according to claim 2, wherein
   each of the plurality of magnetoresistive elements has an axis of easy magnetization directed in the first direction, when a write current is supplied to the second wiring in a first write direction in writing first data in the selected element, and the write current is supplied to the second wiring in a second write direction in writing second data in the selected element, in reading the resistance value of the selected element by using the second current while applying, to the selected element, a magnetic field generated by supplying the first current in both the first write direction and the second write direction, the data is determined as the first data when the resistance value increases, and the data is determined as the second data when the resistance value decreases.

6. The method according to claim 2, wherein the first current is supplied after starting supplying the second current.

7. The method according to claim 6, wherein the data of the selected element is read out by reading a difference between a value of the second current when the first current is not supplied and the value of the second current when the first current is supplied.

8. The method according to claim 1, wherein the plurality of magnetoresistive elements are GMR elements each of which has a first free layer, a second free layer antiferromagnetically coupled to the first free layer, and a conductive layer sandwiched between the first free layer and the second free layer.

9. The method according to claim 8, wherein the data is discriminated depending on whether the resistance value of the selected element, which is read by using the second current, decreases or does not change while a magnetic field generated by the first current and the second current is applied to the selected element.

10. The method according to claim 8, wherein the second current is supplied after starting supplying the first current.

11. The method according to claim 10, wherein the data of the selected element is read out by comparing a value of the second current with a value of a current in a reference cell.

12. The method according to claim 1, wherein the plurality of magnetoresistive elements are GMR elements each of which has a fixed layer, a free layer, and a conductive layer sandwiched between the fixed layer and the free layer.

13. The method according to claim 12, wherein the data is discriminated depending on whether the resistance value of the selected element, which is read by using the second current, decreases or does not change while a magnetic field generated by the first current and the second current is applied to the selected element.

14. The method according to claim 1, wherein
the memory further comprises a plurality of third wirings which are arranged between the magnetoresistive elements and the second wirings and electrically connected to the magnetoresistive elements, and
a plurality of fourth wirings which run in the second direction and are electrically connected to the third wirings, and
the plurality of magnetoresistive elements are MTJ elements each of which has a fixed layer, a free layer, and a tunnel barrier layer sandwiched between the fixed layer and the free layer,
the plurality of magnetoresistive elements are first GMR elements each of which has a first free layer, a second free layer antiferromagnetically coupled to the first free layer, and a conductive layer sandwiched between the first free layer and the second free layer, or
the plurality of magnetoresistive elements are second GMR elements each of which has a fixed layer, a free layer, and a conductive layer sandwiched between the fixed layer and the free layer.

15. The method according to claim 1, wherein a value of the first current is larger than a value of the second current.

16. The method according to claim 1, wherein a planar shape of each of the plurality of magnetoresistive elements is one of a square, circle, regular polygon, and cross.

17. The method according to claim 1, wherein each of the plurality of magnetoresistive elements has
a fixed layer which has first magnetization,
a first free layer which has second magnetization directed in a direction changed by 90° from a direction of the first magnetization,
a second free layer which is provided between the first free layer and the fixed layer and has third magnetization directed in a direction parallel or anti-parallel to the direction of the first magnetization, and
a nonmagnetic layer which is sandwiched between the second free layer and the fixed layer.

18. The method according to claim 1, wherein each of the plurality of magnetoresistive elements has
a fixed layer which has first magnetization,
a first free layer which has second magnetization directed in a direction parallel or anti-parallel to a direction of the first magnetization,
a second free layer which is provided between the first free layer and the fixed layer and has third magnetization directed in the direction parallel or anti-parallel to the direction of the first magnetization, and
a nonmagnetic layer which is sandwiched between the second free layer and the fixed layer.

19. The method according to claim 1, wherein each of the plurality of magnetoresistive elements has
a fixed layer which has first magnetization,
a first free layer which has second magnetization directed in a direction parallel or anti-parallel to a direction of the first magnetization,
a second free layer which is provided between the first free layer and the fixed layer and has third magnetization directed in the direction parallel or anti-parallel to the direction of the first magnetization to ferromagnetically or antiferromagnetically couple the second magnetization to the third magnetization,
a first nonmagnetic layer which is sandwiched between the first free layer and the second free layer, and
a second nonmagnetic layer which is sandwiched between the second free layer and the fixed layer.

20. A data read method of a magnetic random access memory including
a first wiring which runs in a first direction,
a second wiring which runs in a second direction different from the first direction,
a magnetoresistive element which is arranged at an intersection of the first wiring and the second wiring between the first wiring and the second wiring and has one terminal and the other terminal, the one terminal being electrically connected to the first wiring, and
a switching element which is electrically connected to the other terminal of the magnetoresistive element, comprising:
to read out data of the magnetoresistive element, reading a resistance value of the magnetoresistive element by a second current supplied from the first wiring to the magnetoresistive element while supplying a first current to the second wiring.

* * * * *